(12) United States Patent
Lee et al.

(10) Patent No.: US 9,280,062 B2
(45) Date of Patent: Mar. 8, 2016

(54) EXPOSURE DEVICE

(75) Inventors: Duk Lee, Tokyo (JP); Hidetoshi Tabata, Tokyo (JP)

(73) Assignee: Orc Manufacturing Co., LTD., Tokyo (JP)

( * ) Notice: Subject to any disclaimer, the term of this patent is extended or adjusted under 35 U.S.C. 154(b) by 385 days.

(21) Appl. No.: 13/883,001

(22) PCT Filed: Nov. 4, 2011

(86) PCT No.: PCT/JP2011/075435
§ 371 (c)(1),
(2), (4) Date: Jul. 12, 2013

(87) PCT Pub. No.: WO2012/060441
PCT Pub. Date: May 10, 2012

(65) Prior Publication Data
US 2013/0308111 A1 Nov. 21, 2013

(30) Foreign Application Priority Data

Nov. 4, 2010 (JP) ................................. 2010-247129
Dec. 13, 2010 (JP) ................................. 2010-276738
Mar. 15, 2011 (JP) ................................. 2011-056637

(51) Int. Cl.
*G03F 7/20* (2006.01)
*H05K 1/02* (2006.01)

(52) U.S. Cl.
CPC ............ *G03F 7/70208* (2013.01); *G03F 7/203* (2013.01); *G03F 7/7045* (2013.01); *G03F 7/70191* (2013.01); *G03F 7/70291* (2013.01); *G03F 7/70541* (2013.01); *H05K 1/0269* (2013.01); *H05K 2201/09918* (2013.01); *H05K 2201/09936* (2013.01)

(58) Field of Classification Search
CPC . G03F 7/7045; G03F 7/70466; G03F 7/2022; G03F 7/70458; G03F 7/70291; G03F 7/70208; G03F 7/70275; G03F 7/203; G03F 7/70191; G03F 7/70541; H05K 1/0269; H05K 2201/09918; H05K 2201/09936
See application file for complete search history.

(56) References Cited

U.S. PATENT DOCUMENTS 5,272,502 A * 12/1993 Saiki ............................... 355/76
6,396,561 B1 * 5/2002 Vernackt et al. ................ 355/26
2006/0027538 A1 * 2/2006 Ekberg et al. .............. 219/121.8

(Continued)

FOREIGN PATENT DOCUMENTS

| JP | 10-216967 | 8/1998 |
|---|---|---|
| JP | 2006-072100 | 3/2006 |
| JP | 2007-264423 | 10/2007 |

*Primary Examiner* — Steven H Whitesell Gordon
(74) *Attorney, Agent, or Firm* — Berenato & White, LLC

(57) ABSTRACT

An exposure device can exposes a circuit pattern while information data is suitably changed. An exposure device comprises a first light source (20) for irradiating a first light including ultraviolet rays, a projection exposure unit (70) for exposing a circuit pattern drawn on a photomask on a substrate, with the first light, a substrate stage (60) for mounting the substrate, a housing (11) for arranging the substrate stage, a second light source (41) for irradiating a second light including ultraviolet rays, arranged at a position different from the first light source, a spatial light modulation unit (40) for exposing information data formed electrically using the second light on the substrate, and a spatial optical light modulation unit driving means (5) for moving the spatial light modulation unit arranged on the housing (11) in a direction parallel to a moving direction of the substrate stage.

23 Claims, 36 Drawing Sheets

(56) References Cited

U.S. PATENT DOCUMENTS

| | | | |
|---|---|---|---|
| 2006/0269217 A1* | 11/2006 | Shirota et al. | 385/147 |
| 2009/0279057 A1* | 11/2009 | Kim | 355/23 |
| 2010/0321657 A1* | 12/2010 | Van Schoot et al. | 355/55 |
| 2013/0044300 A1* | 2/2013 | Mei et al. | 355/52 |

* cited by examiner

EXPOSURE DEVICE

FIELD OF THE INVENTION

The present invention relates to an exposure device which exposes a circuit pattern on a substrate such as a printed circuit board and a liquid crystal substrate and which also exposes information data, i.e., a mark, at the peripheral region of the circuit pattern.

BACKGROUND OF THE INVENTION

Circuits for specific tests or quality conformance tests may be formed on printed circuit boards other than circuit patterns. Circuits for tests are generally called "test coupon" or "test pattern" (hereinafter called "test coupon information"). Further, other than the circuit pattern or the test coupon information, a mark for controlling a printed circuit board, and character information or graphic information for controlling circuit pattern region after the printed circuit board is cut and divided may be formed on the printed circuit board. Hereinafter, in the present specification, the test coupon information, the character information and graphic information are all called "information data".

The above-described exposure device for exposing the circuit pattern and the information data is disclosed in Japan unexamined patent publication No. 2006-072100. The exposure device in the publication No. 2006-072100 has a photomask on which information data is drawn in advance together with a circuit pattern. The exposure device uses a masking device arranged between a light source and a photomask to mask the unnecessary circuit pattern or information data on the photomask. The exposure device exposes the circuit pattern or the information data which is not masked.

Patent publication 1: Japan unexamined patent publication No. 2006-072100

SUMMARY OF THE INVENTION

Information data drawn on the photomask is often changed in accordance with its usage and a production lot. In a case that the information data is drawn on the photomask, a new photomask needs to be formed although there are not any changes in the circuit pattern drawn on the photomask. This causes the increase of manufacture costs. Further, even though the circuit patterns are the same, plural photomasks have to be prepared, which causes the problem that the control of photomask is complicated. Furthermore, it is required to improve the mass productivity of the printed circuit board.

The present invention is made in consideration of the above-described matters and provides an exposure device which can expose a circuit pattern while information data is suitably changed.

A first aspect of an exposure device comprises a first light source for irradiating first light including ultraviolet rays, a projection exposure unit for exposing a predetermined circuit pattern drawn on a photomask on a substrate using the first light, a substrate stage for mounting the substrate, a housing for mounting and arranging the substrate stage, a stage drive part for moving the substrate stage with respect to the projection exposure unit, a second light source for irradiating second light including ultraviolet rays, arranged at the position different from the first light source, a spatial light modulation unit for exposing information data electrically formed on the substrate using the second light, and a spatial light modulation unit driving means provided at either one of the substrate stage and the housing, for moving the spatial light modulation unit in a direction parallel to a moving direction of the substrate stage.

According to a second aspect of an exposure device, while the projection exposure unit is exposing the predetermined circuit pattern, the spatial light modulation unit driving means moves the spatial light modulation unit and the light modulation unit exposes the information data.

According to a third aspect of an exposure device, while the substrate stage is moving, the spatial light modulation unit driving means moves the spatial light modulation unit and the spatial light modulation unit exposes the information data.

According to a fourth aspect of an exposure device, in asynchronism with the exposure of the projection exposure unit and movement of the substrate stage, the spatial light modulation unit driving means moves the spatial light modulation unit and the spatial optical modulation unit exposes the information data.

According to a fifth aspect of an exposure device, the spatial light modulation unit driving means moves the spatial light modulation unit at the region not adjacent to the exposure region of the projection exposure unit.

According to a sixth aspect of an exposure device, the spatial light modulation unit comprises a reaction suppressing means for suppressing a reaction due to acceleration or deceleration generated by the movement with the spatial light modulation unit driving means.

According to a seventh aspect of an exposure device, the reaction suppressing means comprise a counter mass of a predetermined weight and a memory for pre-storing the moving direction and the acceleration and deceleration speed of the counter mass so as to suppress the reaction with respect to the acceleration and deceleration speed and the moving direction of the spatial light modulation unit.

According to an eighth aspect of an exposure device, the reaction suppressing means is mounted on the spatial light modulation unit.

A ninth aspect of an exposure device for exposing a predetermined circuit pattern drawn on a photomask on a substrate on which phosensitive is applied using light including ultraviolet rays. The exposure device comprises a projection exposure unit for exposing the circuit pattern of the photomask with light including ultraviolet rays from a first light source, a substrate stage mounting the substrate and movable with respect to the projection exposure unit, a stage drive part for moving the substrate stage, a spatial light modulation unit for exposing information data formed electronically on the substrate with light including ultraviolet rays from a second light source, and a spatial light modulation unit drive part for moving the spatial light modulation unit in a direction substantially parallel to a side of the substrate.

With this configuration, the circuit pattern together with the information data formed electrically can be exposed on one substrate mounted on the substrate stage.

According to a tenth aspect of an exposure device, the spatial light modulation unit rewrites the information data every time the circuit pattern is exposed on the substrate.

According to an eleventh aspect of an exposure device, the information data includes at least one of character information, graphic information and test coupon information.

According to a twelfth aspect of an exposure device, a region that the spatial light modulation unit exposes the information data is adjacent to a region that the projection exposure unit exposes the circuit pattern.

According to a thirteenth aspect of an exposure device, when the projection exposure unit exposes the circuit pattern, the spatial light modulation unit drive part stops the spatial light modulation unit, and when the spatial light modulation unit exposes the information data, the spatial light modulation unit drive part moves the spatial light modulation unit and the stage drive part stops the substrate stage.

With this configuration, the vibration of the device is decreased while the projection exposure unit exposes the circuit pattern, and the vibration of the device is decreased while the spatial light modulation unit exposes information data.

According to a fourteenth aspect of an exposure device, the projection exposure unit comprises a magnification means for changing magnification of the circuit pattern, and the spatial light modulation unit corrects the information data electrically in accordance with the magnification means.

With this configuration, when the magnification of the circuit pattern is changed, the magnification of the information data is also changed to the same for exposure.

In the ninth aspect of the exposure device, the first light source is served as the second light source.

A fifteenth aspect of an exposure device comprises an exposure device for exposing a predetermined circuit pattern drawn on a photomask on a substrate on which a photoresist material is applied, with light including ultraviolet rays. The exposure device comprises a projection exposure unit for exposing the circuit pattern of the photomask on a first surface of the substrate, with light including ultraviolet rays, a spatial light modulation unit for exposing information data formed electrically on the first surface and a second surface opposite to the first surface, with light including ultraviolet rays, a substrate stage for mounting the substrate, movable with respect to the projection exposure unit or the spatial light modulation unit, and a stage drive part for moving the substrate stage.

Further, either one of the projection exposure unit and the spatial light modulation unit is arranged above the substrate stage, and the other one is arranged below the substrate stage.

Furthermore, the exposure device comprises a spatial light modulation unit drive device for moving the spatial light modulation unit in a direction substantially parallel to a side of the substrate, and when the projection exposure unit exposes the circuit pattern, the spatial light modulation unit drive device moves the spatial light modulation unit and the stage drive part stops the substrate stage.

According to the sixteenth aspect of the exposure device, the substrate stage includes a transparent plate made of optical glass, synthetic silica, fluoride magnesium, fluoride calcium, polycarbonate, or acryl; and the transparent plate includes an adhesive part for adhering the substrate.

One that is arranged below the substrate stage among the projection exposure unit and the spatial light modulation unit, includes a compensation optical system for compensating an optical path length and a spherical aberration. The exposure device further comprises an optical drive part for moving the compensation optical system in an optical axis depending on the thickness of the transparent plate or a kind of the transparent plate.

One that is arranged below the substrate stage among the projection exposure unit and the spatial light modulation unit, includes an optical system for compensating a spherical aberration with respect to the transparent plate, so that a light passes through the transparent plate and focuses on the substrate.

The information data includes at least one of character information, graphic information and test coupon information.

According to the exposure device of the present invention, the circuit pattern drawn on the photomask can be exposed with information data which can be changed appropriately, so that the photomask on which information data is drawn has not to be used, which reduces the manufacture cost. Further, the exposure device can expose the information data and the circuit pattern on both upper and lower surfaces.

DETAILED DESCRIPTION OF THE INVENTION

Figure 1:
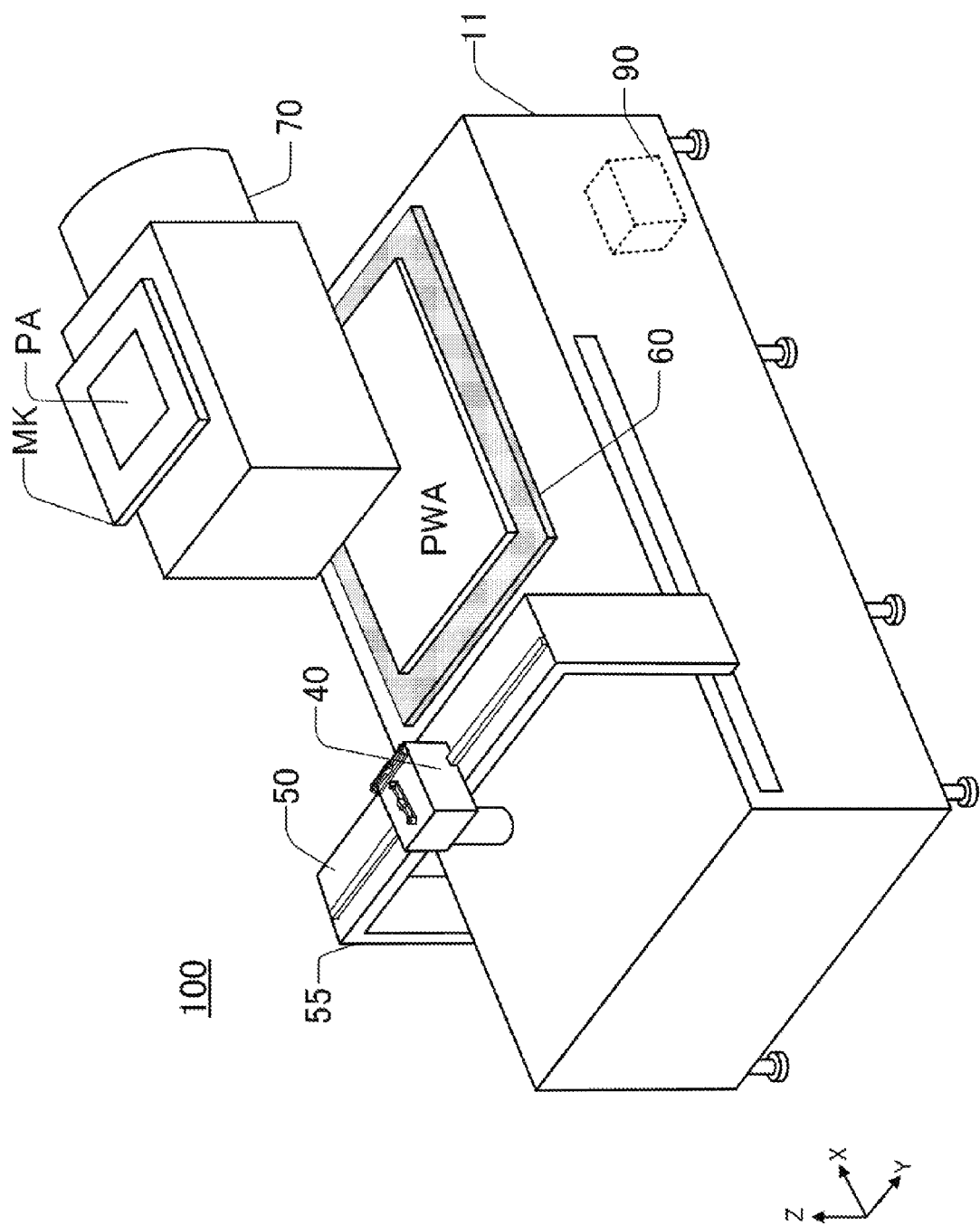
FIG. 1 is a perspective view showing an exposure device 100 according to the first embodiment of the present invention.

An exposure device according to an embodiment of the present invention is explained hereinafter in conjunction with drawings. In the drawing, identical constitutional elements are given the same symbols, and the repeated explanation of these constitutional elements is omitted.

<Constitution of Exposure Device 100 of First Embodiment>

The exposure device according to the first embodiment of the invention is explained hereinafter.

FIG. 1 is a perspective view of the exposure device 100. In FIG. 1, a light source is not shown, and the exposure device 100 is depicted such that the long-axis direction of a housing 11 is taken along the X-axis direction, and the short-axis direction of the housing 11 is taken along the Y-axis direction. Further, for facilitating the understanding of the arrangement of a projection exposure unit 70, support struts and the like for supporting the projection exposure unit 70 are not shown in the drawing.

The exposure device 100 is constituted of the housing 11, a spatial light modulation unit 40, a substrate stage 60 and the projection exposure unit 70. The housing 11 supports the spatial light modulation unit 40, the substrate stage 60 and the projection exposure unit 70, while a control part 90 which controls the spatial light modulation unit 40, the substrate stage 60 and the projection exposure unit 70 is arranged in the inside of the housing 11. The housing 11 is a platform on which the substrate stage is arranged, and is supported on vibration-proof mounts not shown in the drawing.

The spatial light modulation unit 40 is placed on a first spatial light modulation unit drive part 50. The first spatial light modulation unit drive part 50 includes a portal frame 55 which is constituted of a beam which extends in the Y-axis direction, and support struts which extend in the Z-axis direction from ends of the beam. The first spatial light modulation unit drive part 50 moves the spatial light modulation unit 40 in the X-axis direction and in the Y-axis direction.

The spatial light modulation unit 40 can expose character information or graphic information used for substrate control for controlling a printed circuit board PWA on a peripheral region of the printed circuit board PWA. Further, there may be a case where the printed circuit board PWA is cut and divided into plural divided substrates as products. Accordingly, the spatial light modulation unit 40 may also expose character information or graphic information used for substrate control for controlling the respective divided substrates after division. Further, the spatial light modulation unit 40 may also expose test coupon information including a test coupon such as a quality conformance test or a test pattern.

The substrate stage 60 is mounted on an upper portion of the housing 11. The substrate stage 60 includes a stage drive part 65 constituted of, for example, ball screws, slide guides, screw driving motors and the like (see FIG. 2B). The substrate stage 60 can move in the X-axis direction and in the Y-axis direction by the stage drive part 65. Further, the substrate stage 60 has a rectangular surface in conformity with the rectangular printed circuit board PWA. Substrate suction holes are formed on the surface of the substrate stage 60. The substrate stage 60 fixes the printed circuit board PWA by suction. The substrate stage 60 may include a rotary table (not shown in the drawing) which rotates the printed circuit board PWA in the θ direction on an upper surface thereof. Further, the exposure device 100 includes a length measuring device which measures a position in the X-axis direction or in the Y-axis direction to the substrate stage 60 from a reference position.

The projection exposure unit 70 is constituted of a plurality of lenses, a plurality of mirrors or the like. The projection exposure unit 70 is supported and fixed by the support struts not shown in the drawing. A photomask MK on which a circuit pattern PA is drawn is arranged on a side opposite to the printed circuit board PWA with the projection exposure unit 70 sandwiched therebetween. The projection exposure unit 70 performs exposure of a circuit pattern PA on the photomask MK irradiated with light including ultraviolet rays on the printed circuit board PWA. In this embodiment, a catadioptric projection exposure unit referred to as a Dyson-type projection exposure unit is used. However, a refraction-type projection exposure unit which is constituted of only a plurality of lenses may be used or a reflection-type projection exposure unit referred to as an Ophner-type projection exposure unit may also be used.

Figure 2A:
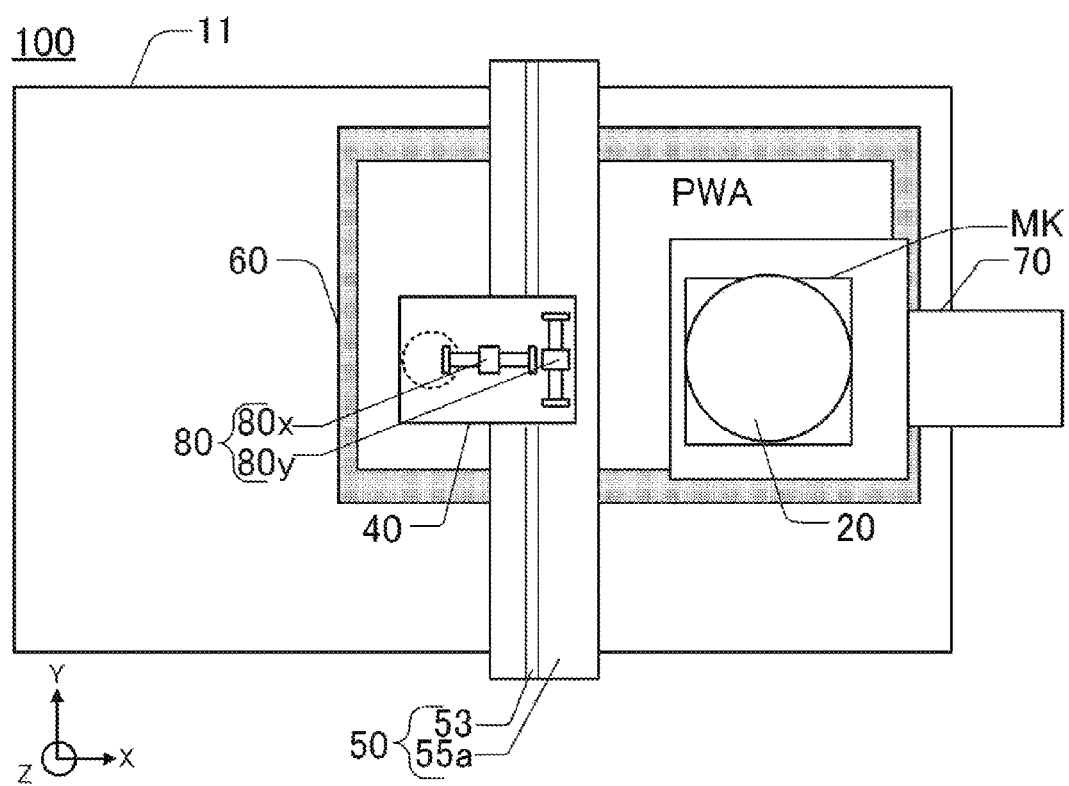
FIG. 2A is a plan view of the exposure device 100 as viewed from above.
Figure 2B:
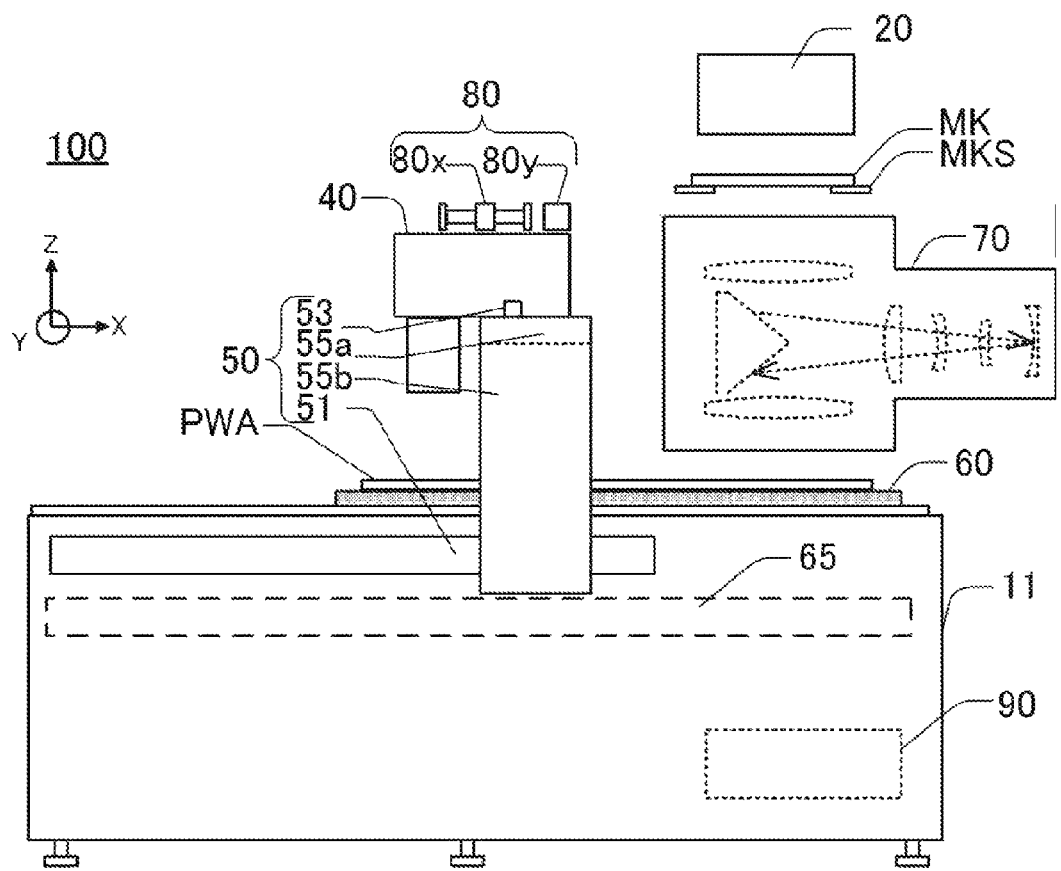
FIG. 2B is a side view of the exposure device 100 as view from a side.

FIG. 2A is a plan view of the exposure device 100 including the light source as viewed from above. FIG. 2B is a side view of the exposure device 100 as viewed from a side.

The printed circuit board PWA is conveyed from a left side in FIG. 2A, for example, by a conveying device not shown in the drawing. The printed circuit board PWA is placed on and sucked to the substrate stage 60 in a state where a reference side of the printed circuit board PWA is aligned with a predetermined position of the substrate stage 60. One side of the rectangular printed circuit board PWA is substantially parallel to the X-axis direction, and another side of the printed circuit board PWA is substantially parallel to the Y-axis direction. The substrate stage 60 on which the printed circuit board PWA is placed is movable on an upper portion of the housing 11 by the stage drive part 65 from an end on a left side (−X-axis side) to an end on a right side (+X-axis side). By allowing the substrate stage 60 to move in the X-axis direction and in the Y-axis direction, an arbitrary exposure region of the printed circuit board PWA is brought into an area below the projection exposure unit 70.

The portal frame 55 of the first spatial light modulation unit drive part 50 includes a beam 55a which extends in the Y-axis direction, and a pair of support struts 55b which extends in the Z-axis direction from ends of the beam. A Y-axis drive device 53 which moves the spatial light modulation unit 40 in the Y-axis direction is mounted on the beam 55a. Further, an X-axis drive device 51 which moves the spatial light modulation unit 40 in the X-axis direction is provided to distal ends of the pair of support struts 55b. The X-axis drive devices 51 are connected to side surfaces of the housing 11. By moving the spatial light modulation unit 40 in the X-axis direction and in the Y-axis direction or by moving the substrate stage 60 in the X-axis direction and in the Y-axis direction, an arbitrary exposure region of the printed circuit board PWA is brought into an area below the spatial light modulation unit 40.

A counter mass drive part 80 is arranged on the spatial light modulation unit 40 which moves in the X-axis direction. The counter mass drive part 80 includes an X-axis counter mass drive part 80x which drives a counter mass in the X-axis direction, and a Y-axis counter mass drive part 80y which drives the counter mass in the Y-axis direction. The counter mass drive part 80 suppresses a reaction generated when the spatial light modulation unit 40 is accelerated or decelerated.

<Constitution of Spatial Light Modulation Unit 40>

Figure 3:
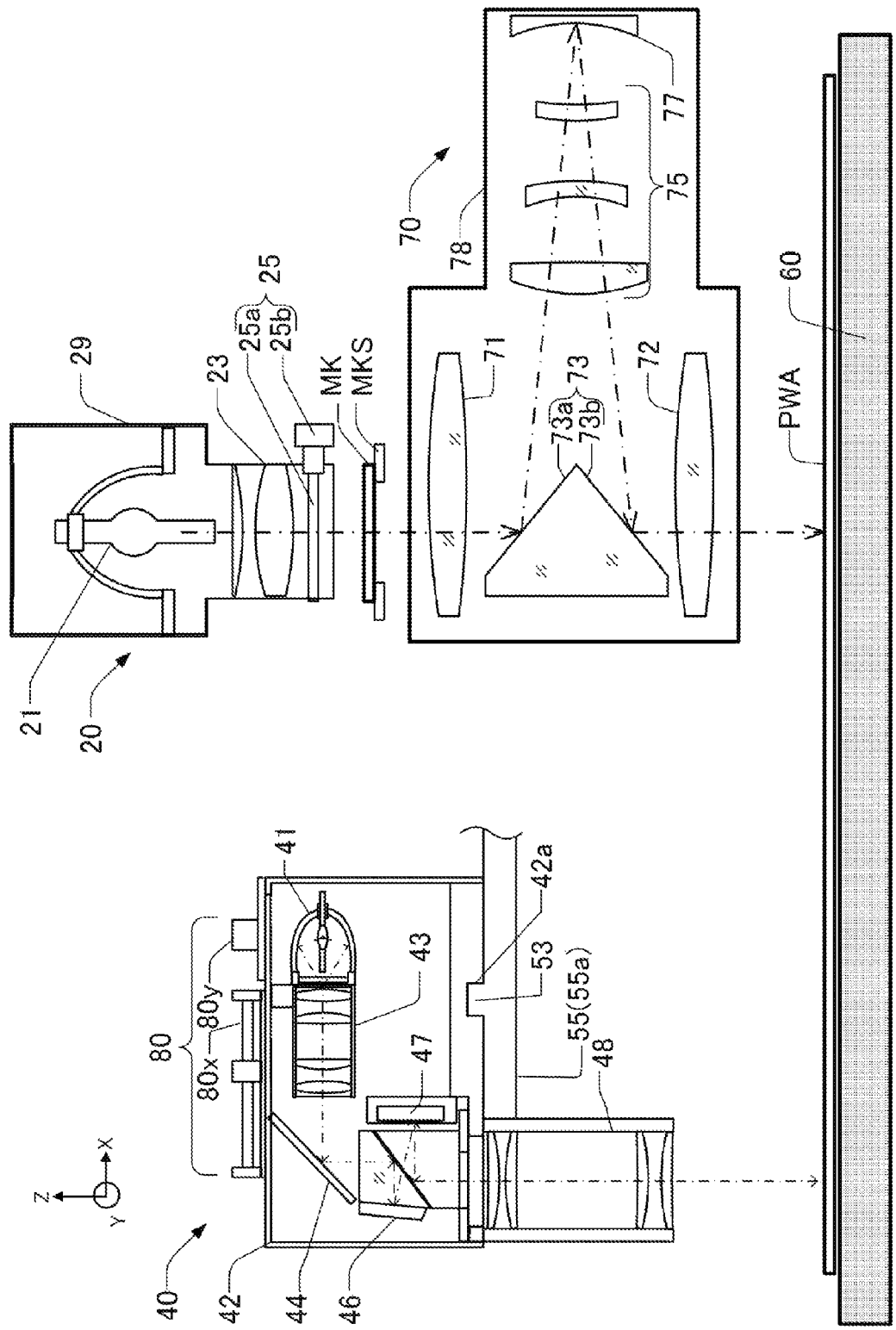
FIG. 3 is an enlarged conceptual view showing a spatial light modulation unit 40 and a projection exposure unit 70.

FIG. 3 is a conceptual view showing the constitution of the spatial light modulation unit 40, the light source 20 and the projection exposure unit 70.

The spatial light modulation unit 40 is constituted of a high-pressure mercury vapor lamp 41, a first optical system 43, a cold mirror 44, a mirror block 46, a DMD (digital micro mirror device) 47 and a second optical system 48. The high-pressure mercury vapor lamp 41 irradiates a light including a g-line ray (365 nm), an h-line ray (405 nm) and an i-line ray (436 nm). The first optical system includes an elliptical mirror and a group of lenses consisting of a plurality of lenses. The cold mirror 44 allows infrared rays to pass therethrough and reflects a light including ultraviolet rays.

The structure is adopted where parts ranging from the high-pressure mercury vapor lamp 41 to the second optical system 48 are surrounded by a cover 42 such that a light does not leak to the outside of the optical system. An engaging portion 42a which engages with the Y-axis drive device 53 mounted on the beam 55a is formed on a portion of the cover 42. Further, the X-axis counter mass drive part 80x and the Y-axis counter mass drive part 80y which moves the counter mass in the Y-axis direction are arranged on the cover 42.

The mirror block 46 which is formed by combining a reflection mirror and a half mirror is arranged below (on a substrate side of) the cold mirror 44. The DMD 47 is arranged adjacent to the mirror block 46, and the second optical system 48 is arranged below (on a substrate side of) the mirror block 46. An optical axis of the second optical system 48 is arranged perpendicular to a surface of the printed circuit board PWA. An optical axis of the DMD 47 is arranged substantially perpendicular to the optical axis of the second optical system 48.

The DMD 47 is constituted of approximately one million pieces of movable micro-mirrors. A mirror surface size of each micro-mirror is approximately ten and several μm square, and the micro-mirrors are arranged in a grid array. Each micro-mirror can incline a mirror surface thereof by ±12 degrees. When the micro-mirror is brought into an "ON" state, a light beam is reflected toward a printed circuit board PWA side. When the micro-mirror is brought into an "OFF" state, the light beam is reflected toward an ultraviolet-ray-absorbing-body side not shown in the drawing. Accordingly, by driving the respective micro-mirrors individually, the DMD 47 can irradiate a light beam which is spatially modulated into test coupon information, character information or graphic information (hereinafter referred to as information data) to the printed circuit board PWA.

The DMD 47 and a photoresist surface formed on the printed circuit board PWA are arranged at conjugate positions. When a thickness of the printed circuit board PWA is changed, a light which passes through the second optical system 48 does not form an image on the photoresist surface of the printed circuit board PWA which is formed of a photosensitive material. When a focal length of a light beam irradiated to the photoresist surface of the printed circuit board PWA is not appropriate, the position of the DMD 47 and the position of the photoresist surface of the printed circuit board PWA can be brought into a conjugate relationship by adjusting a focal position of the second optical system 48.

A light beam irradiated from the high-pressure mercury vapor lamp 41 is incident on the first optical system 43 so that the light beam is collimated. The light beam irradiated from the first optical system 43 is reflected toward a printed circuit board PWA side by the cold mirror 44 and is incident on the mirror block 46. The light beam incident on the mirror block 46 advances toward the DMD 47 and is spatially modulated into information data by the DMD 47. The spatially modulated light beam is incident on the mirror block 46 again, and is irradiated to the photoresist surface of the printed circuit board PWA through the second optical system 48.

Information data to be exposed on the printed circuit board PWA can be obtained by electronically changing the directions of one million pieces of micro-mirrors in the DMD 47. Accordingly, information data to be exposed on the printed circuit board PWA can be suitably changed.

<Constitution of Light Source 20 and Projection Exposure Unit 70>

As shown in FIG. 3, the photomask MK which is placed on a mask stage MKS is arranged above (on a +Z-axis side of) the projection exposure unit 70. The light source 20 is arranged above the photomask MK.

The light source 20 is constituted of a high-pressure mercury vapor lamp 21, an illumination optical system 23 and a shutter part 25. The high-pressure mercury vapor lamp 21 is surrounded by a cover 29, and the cover 29 has the structure which prevents a leakage of lights other than light from the optical system. The high-pressure mercury vapor lamp 21 irradiates a light including a g-line ray, an h-line ray and an i-line ray.

A light beam irradiated from the high-pressure mercury vapor lamp 21 is reflected in the direction toward the substrate by an elliptical mirror and is focused by the illumination optical system 23. The light beam incident on the illumination optical system 23 is rectified to a parallel light beam and is irradiated toward the photomask MK. The illumination optical system 23 is arranged perpendicular to a circuit pattern PA drawn on the photomask MK.

The shutter part 25 is arranged on a path ranging from the high-pressure mercury vapor lamp 21 to the photomask MK. In this embodiment, the shutter part 25 is arranged below the illumination optical system 23. The shutter part 25 is constituted of a shutter blade 25a and a shutter drive part 25b. The shutter drive part 25b is constituted of a rotary motor or the like, and advances the shutter blade 25a to an optical path or retracts the shutter blade 25a from the optical path. In this manner, the shutter part 25 blocks a light beam irradiated from the high-pressure mercury vapor lamp 21 or allows the light beam to pass therethrough. The shutter blade 25a retracts from the optical path when the exposure of the circuit pattern PA on the photomask MK is performed on an exposure region of the printed circuit board PWA, and the shutter blade 25a advances to the optical path when the printed circuit board PWA is moved to a next exposure region.

Next, the projection exposure unit 70 is explained. The projection exposure unit 70 includes: an incident-side convex lens 71 and an irradiation-side convex lens 72; a reflection mirror 73 which is arranged between the incident-side convex lens 71 and the irradiation-side convex lens 72; a correction lens 75; and a concave-surface reflection mirror 77 in the inside of a lens barrel 78.

The incident-side convex lens 71 and the irradiation-side convex lens 72 have the same refractive index, and are arranged at positions which have the common axis. The reflection mirror 73 has: a first reflection surface 73a which guides a projection light from the incident-side convex lens 71 to the correction lens 75 and the concave-surface reflection mirror 77; and a second reflection surface 73b which guides the projection light from the correction lens 75 and the concave-surface reflection mirror 77 to the irradiation-side convex lens 72. The correction lens 75 which is constituted of a plurality of lenses corrects the aberration of the projection light from the reflection mirror 73. The concave-surface reflection mirror 77 reflects the projection light transmitted through the correction lens 75.

The projection exposure unit 70 projects a projection light which passes through the circuit pattern PA on the photomask MK to a photoresist surface of the printed circuit board PWA.

<Constitution of Counter Mass Drive Part 80>

Figure 4:
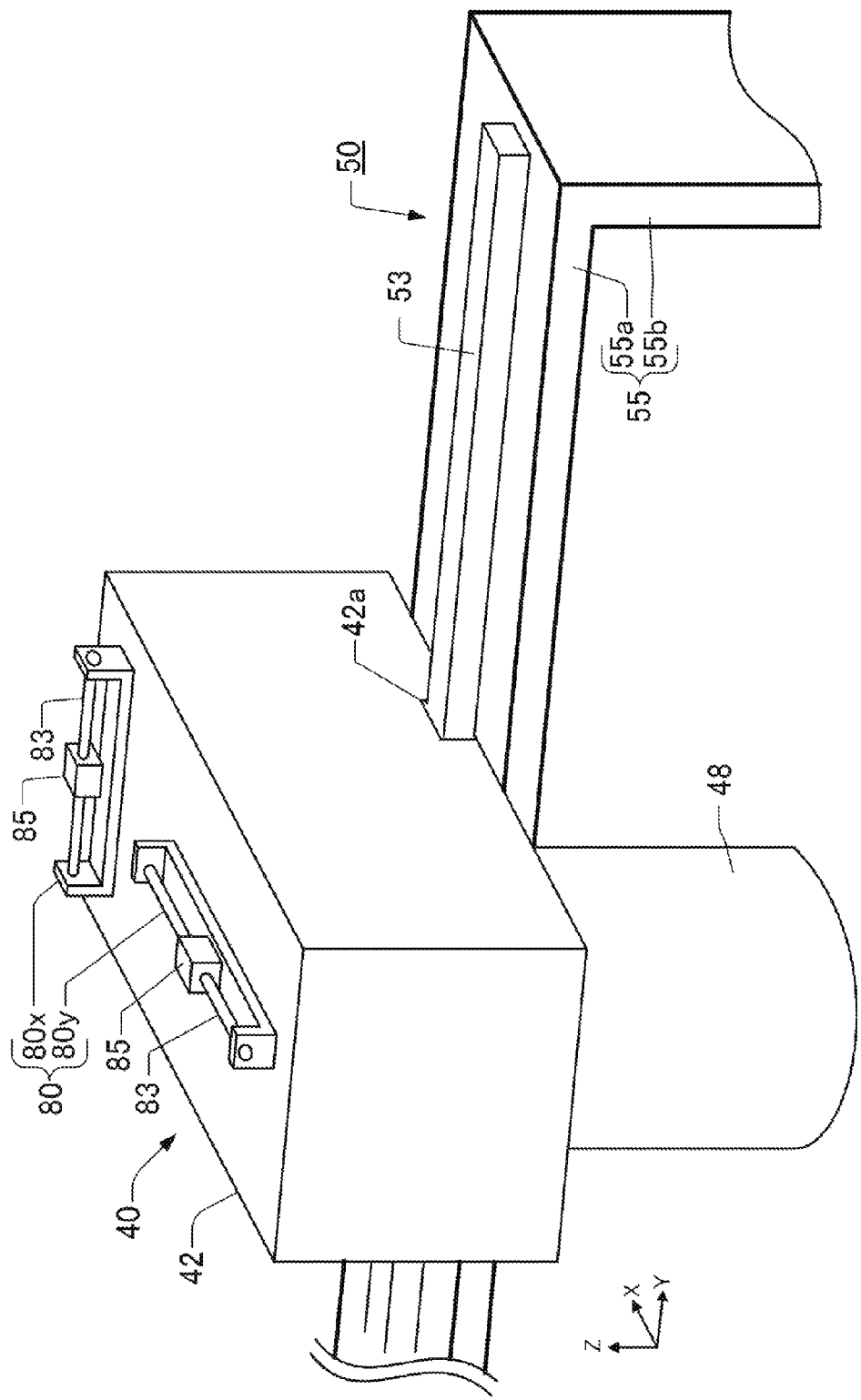
FIG. 4 is a view showing a state where a counter mass drive part 80 is arranged on the spatial light modulation unit 40.

FIG. 4 is a view showing a state where the counter mass drive part 80 is arranged on an upper surface (ceiling surface) of the cover 42 of the spatial light modulation unit 40. The counter mass drive part 80 is constituted of a guide rail 83 and a counter mass 85. A pulse motor or the like which linearly moves the counter mass 85 per se along the guide rail 83 is incorporated in the counter mass 85. A weight is also incorporated in the counter mass 85 so as to make the counter mass 85 have a required weight. The X-axis counter mass drive part 80x is arranged parallel to an X-axis so as to drive the counter mass 85 in the X-axis direction, and the Y-axis counter mass drive part 80y is arranged parallel to a Y-axis so as to drive the counter mass 85 in the Y-axis direction.

When the spatial light modulation unit 40 is accelerated or decelerated, due to a weight of the spatial light modulation unit 40 per se or a weight of the portal frame 55 per se, the spatial light modulation unit 40 vibrates or the portal frame 55 vibrates. When the spatial light modulation unit 40 or the portal frame 55 vibrates, in a worst case, the exposure of information data by the spatial light modulation unit 40 is deviated so that the exposure cannot be performed with high accuracy. In view of the above, when the spatial light modulation unit 40 is accelerated or decelerated in the +X-axis direction, the X-axis counter mass drive part 80x drives the counter mass 85 in an accelerated or decelerated manner in the −X-axis direction. Further, when the spatial light modulation unit 40 is accelerated or decelerated in the +Y-axis direction, the Y-axis counter mass drive part 80y drives the counter mass 85 in an accelerated or decelerated manner in the −Y-axis direction.

Due to such an operation, it is possible to suppress a reaction of the spatial light modulation unit 40 or the portal frame 55 which is generated when the spatial light modulation unit 40 exposes information data on the printed circuit board PWA or when the spatial light modulation unit 40 moves to a next exposure region.

<Constitution of Control Part 90>

Figure 5:
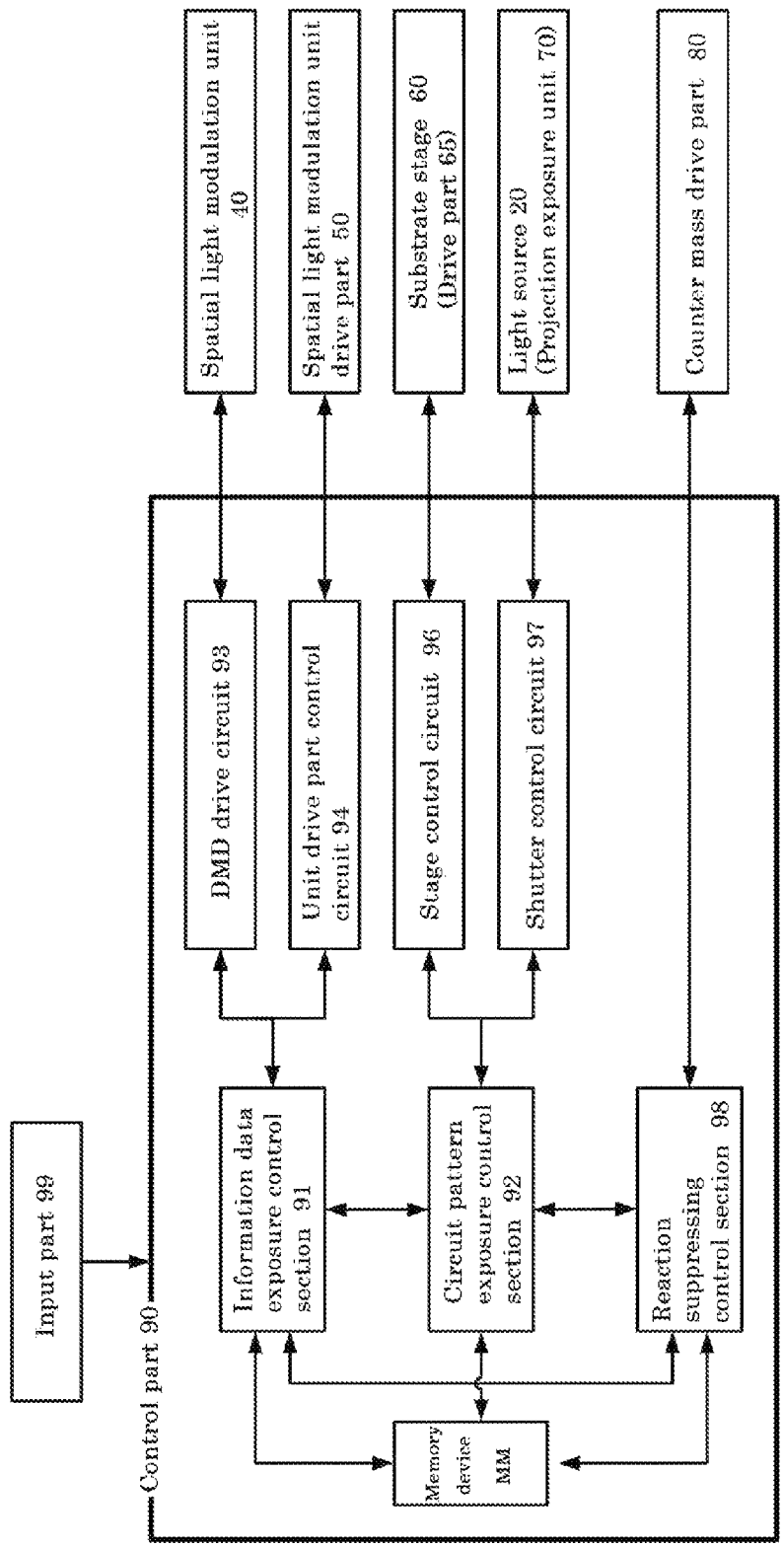
FIG. 5 is a block diagram showing the constitution of a control part 90 of the exposure device 100.

FIG. 5 is a block diagram showing the constitution of the control part 90 of the exposure device 100. The exposure device 100 is controlled by the control part 90. The control part 90 includes: an information data exposure control section 91 which controls the exposure of information data; a circuit pattern exposure control section 92 which controls the exposure of a circuit pattern; and a reaction suppressing control section 98 which suppresses a reaction which is generated in the spatial light modulation unit 40. The information data exposure control section 91, the circuit pattern exposure control section 92 and the reaction suppressing control section 98 are connected to a memory device MM, and these control sections are connected to each other for enabling the exchange of information among them.

The memory device MM stores therein data such as exposure data on the printed circuit board PWA, data on an exposure region of a circuit pattern, positional information of information data, photoresist sensitivity of the printed circuit board PWA, and a moving speed of the substrate stage 60. Further, the memory device MM also stores therein in advance, in the form of a lookup table, data on a speed of acceleration or deceleration of the counter mass 85 in the X-axis direction at which a reaction generated in the spatial light modulation unit 40 can be suppressed when the portal frame 55 is accelerated or decelerated in the X-axis direction. In the same manner, the memory device MM stores therein, as a lookup table, in advance, data on a speed of acceleration or deceleration of the counter mass 85 in the Y-axis direction at which a reaction generated in the spatial light modulation unit 40 can be suppressed when the spatial light modulation unit 40 is accelerated or decelerated in the Y-axis direction by the Y-axis drive device 53. Data to be stored in the memory device MM is inputted by an external input part 99 (for example, a plant side LAN or a manual input) connected to the control part 90.

The information data exposure control section 91 is connected to a DMD drive circuit 93 and a control circuit 94 of the first spatial light modulation unit drive part 50. The information data exposure control section 91 converts identification signal exposure data stored in the memory device MM into DMD drive data. The DMD drive circuit 93 is connected to the DMD 47 of the spatial light modulation unit 40, and inclines approximately one million pieces of micro-mirrors by ±12 degrees. The control circuit 94 of the first spatial light modulation unit drive part 50 is connected to the X-axis drive device 51 and the Y-axis drive device 53 of the first spatial light modulation unit drive part 50 and moves the spatial light modulation unit 40 in the X-axis direction and in the Y-axis direction. The information data exposure control section 91 transmits a moving speed of the spatial light modulation unit 40 to the control circuit 94 of the first spatial light modulation unit drive part based on a condition such as photoresist sensitivity of the printed circuit board PWA stored in the memory device MM. That is, the information data exposure control section 91 performs a control such that information data is exposed on a plurality of regions of the printed circuit board PWA.

The circuit pattern exposure control section 92 is connected to a stage control circuit 96 and a shutter control circuit 97. The stage control circuit 96 is connected to the stage drive part 65 of the substrate stage 60, and moves the substrate stage 60 in the X-axis direction and in the Y-axis direction. The shutter control circuit 97 is connected to the shutter part 25 of the light source 20, and opens or closes the shutter part 25. That is, the circuit pattern exposure control section 92 performs a control such that the circuit pattern PA on the photomask MK (see FIG. 1) is exposed on a plurality of regions of the printed circuit board PWA.

The reaction suppressing control section 98 is connected to the counter mass drive part 80, and transmits the signal for driving the counter mass 85 to the counter mass drive part 80 such that a reaction generated in the spatial light modulation unit 40 at the time of acceleration or deceleration becomes small.

<Manner of Operation of Exposure Device 100>

Figure 6:
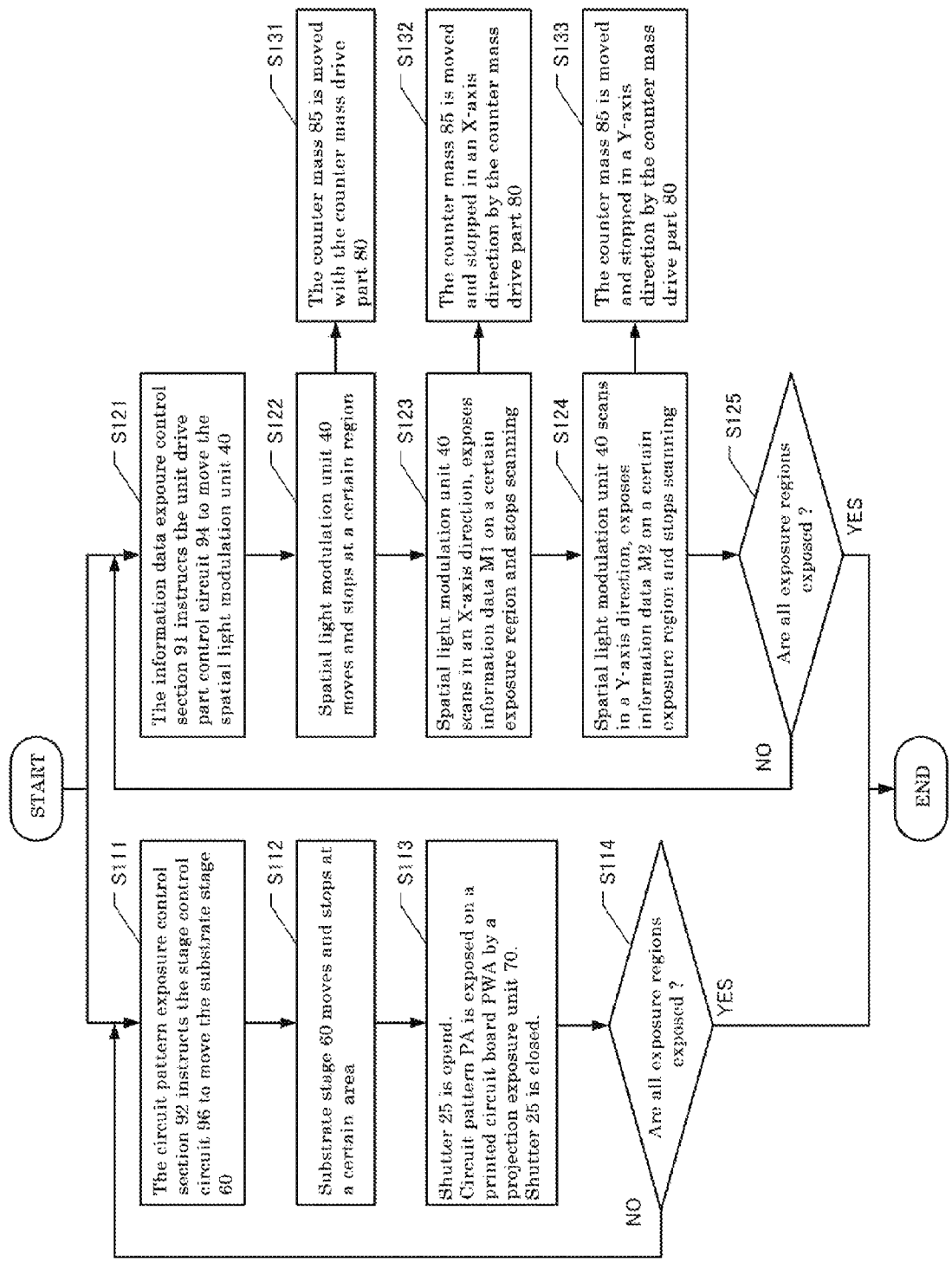
FIG. 6 is a flowchart of exposure performed by the exposure device 100.

The manner of operation of the exposure device 100 is explained. FIG. 6 is a flowchart showing the exposure performed by the exposure device 100. The manner of operation of the exposure device 100 is explained in conjunction with a plan view of the printed circuit board PWA shown in FIG. 7.

Figure 7:
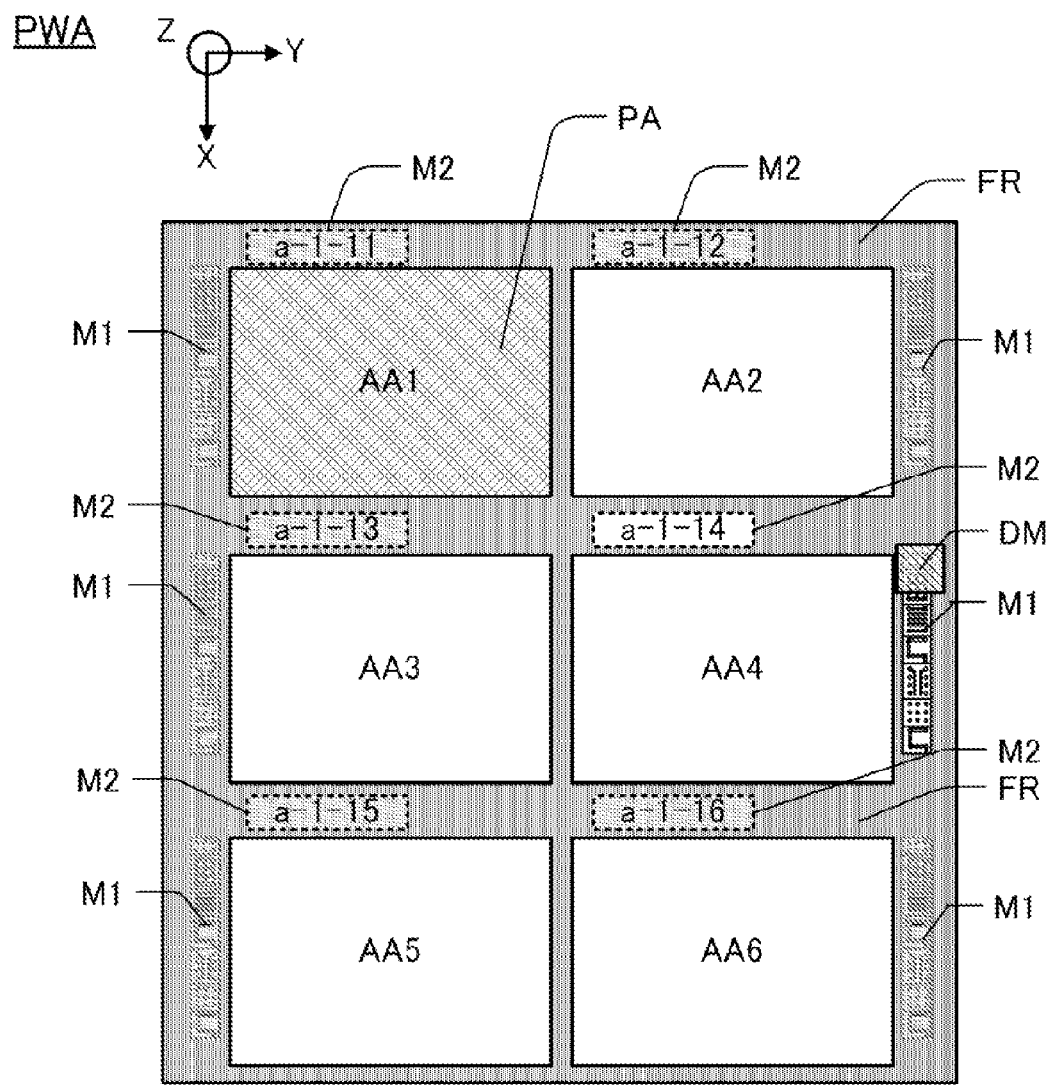
FIG. 7 is a plan view showing an exposed printed circuit board PWA.

On the printed circuit board PWA shown in FIG. 7, the circuit pattern PA (an exposure region AA1) or information data (M1, M2) is exposed. However, these pattern and data are not exposed on the printed circuit board PWA before the exposure. Further, a photoresist FR which is a photosensitive material is formed on a surface of the printed circuit board PWA.

Firstly, the printed circuit board PWA is conveyed to the substrate stage 60 by a conveying device not shown in the drawing.

In step S111, the circuit pattern exposure control section 92 instructs the stage control circuit 96 to move the substrate stage 60.

In step S112, the stage control circuit 96 moves the substrate stage 60 in the X-axis direction or in the Y-axis direction until an exposure region of the printed circuit board PWA is brought into an area below the projection exposure unit 70. The stage control circuit 96 stops the substrate stage 60 when the exposure region of the printed circuit board PWA arrives at the predetermined area. For example, the exposure region AA1 shown in FIG. 7 is brought into an area below the projection exposure unit 70.

In step S113, in a state where the substrate stage 60 is in a stopped state, the shutter control circuit 97 opens the shutter 25. Accordingly, a circuit pattern PA is exposed on the printed circuit board PWA through the projection exposure unit 70. After a lapse of a fixed time, the shutter control circuit 97 closes the shutter 25. In FIG. 7, the circuit pattern PA is exposed on the exposure region AA1.

In step S114, the circuit pattern exposure control section 92 determines whether the exposure is performed on all exposure regions. For example, when the exposure is performed on only the exposure region AA1 shown in FIG. 7, the processing goes to step S111. When exposure is performed on the exposure region ranging from the exposure region AA1 to an exposure region AA6, the exposure by the projection exposure unit 70 is finished.

In this manner, in the exposure performed by the projection exposure unit 70, each time the substrate stage 60 moves to the exposure region and stops there, the shutter 25 is opened and closed so that a circuit pattern PA is exposed on the printed circuit board PWA (also referred to as step and repeat). By repeating such an operation, as shown in FIG. 7, the exposure of the circuit pattern PA is performed on six pieces of exposure regions AA1 to AA6.

Next, in step S121, the information exposure control section 91 instructs the drive part control circuit 94 to move the spatial light modulation unit 40.

In step S122, the unit drive part control circuit 94 drives the spatial light modulation unit drive part 50 thus moving the spatial light modulation unit 40 in the X-axis direction or in the Y-axis direction. For example, the spatial light modulation unit 40 is moved to an exposure region DM relating to information data M1 adjacent to the exposure region AA4 shown in FIG. 7.

When the projection exposure unit 70 performs exposure on the exposure region AA1, the unit drive part control circuit 94 does not move the spatial light modulation unit 40 to exposure regions DM of the exposure region AA1, the exposure region AA2 and the exposure region AA3 arranged adjacent to the exposure region AA1. This operation is performed for preventing the lowering of an image contrast of the information data M1 which the spatial light modulation unit 40 exposes due to a multiple exposure or a flare light caused by the projection exposure unit 70. Accordingly, when the projection exposure unit 70 performs the exposure of a circuit pattern PA on the exposure region AA1, the unit drive part control circuit 94 moves the spatial light modulation unit 40 to the exposure region DM of the exposure region AA4, the exposure region AA5 and the exposure region AA6 which are not arranged adjacent to the exposure region AA1. Further, the unit drive part control circuit 94 decides an appropriate exposure region DM based on the number of divided boards from one sheet of printed circuit board PWA and the calculation which prevents the collision between the movement of the substrate stage 60 and a scanning region of the spatial light modulation unit 40.

In step S123, the first spatial light modulation unit drive part 50 moves (scans) the spatial light modulation unit 40 in the direction approximately parallel to a side of the printed circuit board PWA. In the midst of movement (scanning) of the spatial light modulation unit 40 in the X-axis direction, the DMD 47 of the spatial light modulation unit 40 is driven through the DMD drive circuit 93. Accordingly, the information data M1 is exposed on the printed circuit board PWA in the midst of the movement (scanning) of the spatial light modulation unit 40. As shown in FIG. 7, information data M1 is formed adjacent to the circuit pattern PA in six exposure regions (AA1 to AA6). The spatial light modulation unit 40 performs the scanning in the X-axis direction so that information data M1 is exposed on the predetermined exposure region and the scanning is finished.

Information data M1 is information on a test coupon such as a circuit for a quality conformance test or the like. There may be a case where a defect is present in the inside of the printed circuit board PWA which cannot be recognized in external appearance. Accordingly, test coupon information (information data M1) formed adjacent to the circuit pattern PA is sampled, is broken and is subjected to an inspection or the like. Further, a through hole or a via which is formed as test coupon information is formed such that a conductive state or a connection state can be measured in a daisy pattern where through holes or vias are connected in series, and a comb-shaped pattern which forms test coupon information is provided for measuring insulation resistance. Since the test pattern can be electronically formed in the DMD 47, test coupon information can be changed in a desired manner.

In step S124, in the midst of movement of the spatial light modulation unit 40 in the Y-axis direction, the DMD 47 is driven through the DMD drive circuit 93. Accordingly, information data M2 is exposed on the printed circuit board PWA in the midst of the movement (scanning) of the spatial light modulation unit 40. As shown in FIG. 7, information data M2 is formed adjacent to the circuit pattern PA in six exposure regions (AA1 to AA6). The spatial light modulation unit 40 performs the scanning in the Y-axis direction so that the exposure of information data M2 is performed on the predetermined exposure region and the scanning is finished.

Information data M2 is character information or graphic information for controlling a circuit pattern region. Since the DMD 47 can electronically change information, information data M2 is formed in such a manner as "a-1-11", "a-1-12" for every circuit pattern PA of the plurality of circuit patterns PA on one sheet of printed circuit board PWA. Also with respect to information data M2, in the same manner as information data M1, when the projection exposure unit 70 performs exposure on the exposure region AA1, the unit drive part control circuit 94 does not move the spatial light modulation unit 40 to the exposure regions DM relating to the exposure region AA1, and the exposure region AA2 and the exposure region AA3 arranged adjacent to the exposure region AA1.

The sequence of step S123 and step S124 may be reversed. Positions where information data M1 and information data M2 are formed can be suitably changed dependent on a size, the arrangement or the like of a circuit pattern PA. There may be a case where only one of information data M1 and information data M2 is formed. Further, information data M2 may be also exposed by scanning in the X-axis direction in accordance with the flow of S111, S112 and S113.

In step S125, the unit drive part control circuit 94 determines whether the exposure is performed on all exposure regions are exposed. For example, when the exposure is performed on only information data M1 arranged adjacent to the exposure region AA4 shown in FIG. 7, the processing goes to step S121. When the exposure is performed on all exposure regions DM, the exposure by the spatial light modulation unit 40 is finished. In this manner, the exposure by the spatial light modulation unit 40 is repeatedly applied to the printed circuit board PWA.

In step S131, in accordance with the acceleration or the deceleration of the spatial light modulation unit 40 in the X-axis direction or in the Y-axis direction (S122), the counter mass drive part 80 accelerates or decelerates the counter mass 85 in the opposite direction. The reaction suppressing control section 98 controls the counter mass drive part 80 based on a lookup table stored in the memory device MM used for determining an amount that the counter mass 85 is to be accelerated or decelerated corresponding to the acceleration or deceleration of the spatial light modulation unit 40.

In step S132, along with scanning performed by the spatial light modulation unit 40 in the X-axis direction (S123), the counter mass drive part 80 moves the counter mass 85 in the −X-axis direction and stops the counter mass 85.

In step S133, along with scanning performed by the spatial light modulation unit 40 in the Y-axis direction (S124), the counter mass drive part 80 moves the counter mass 85 in the −Y-axis direction and stops the counter mass 85.

In the above-mentioned explanation made using FIG. 6 and FIG. 7, timing of the exposure of a circuit pattern PA and timing of the exposure of information data M1, M2 are not specially specified. That is, in FIG. 6, the explanation is made with respect to the case where the exposure of the circuit pattern PA (S111 to S114) and the exposure of information data M1, M2 (S121 to S125) are performed in parallel. Next, using FIG. 8 to FIG. 10, three kinds of timings of the exposure of the circuit pattern PA and the exposures of information data M1, M2 are explained.

Figure 8:
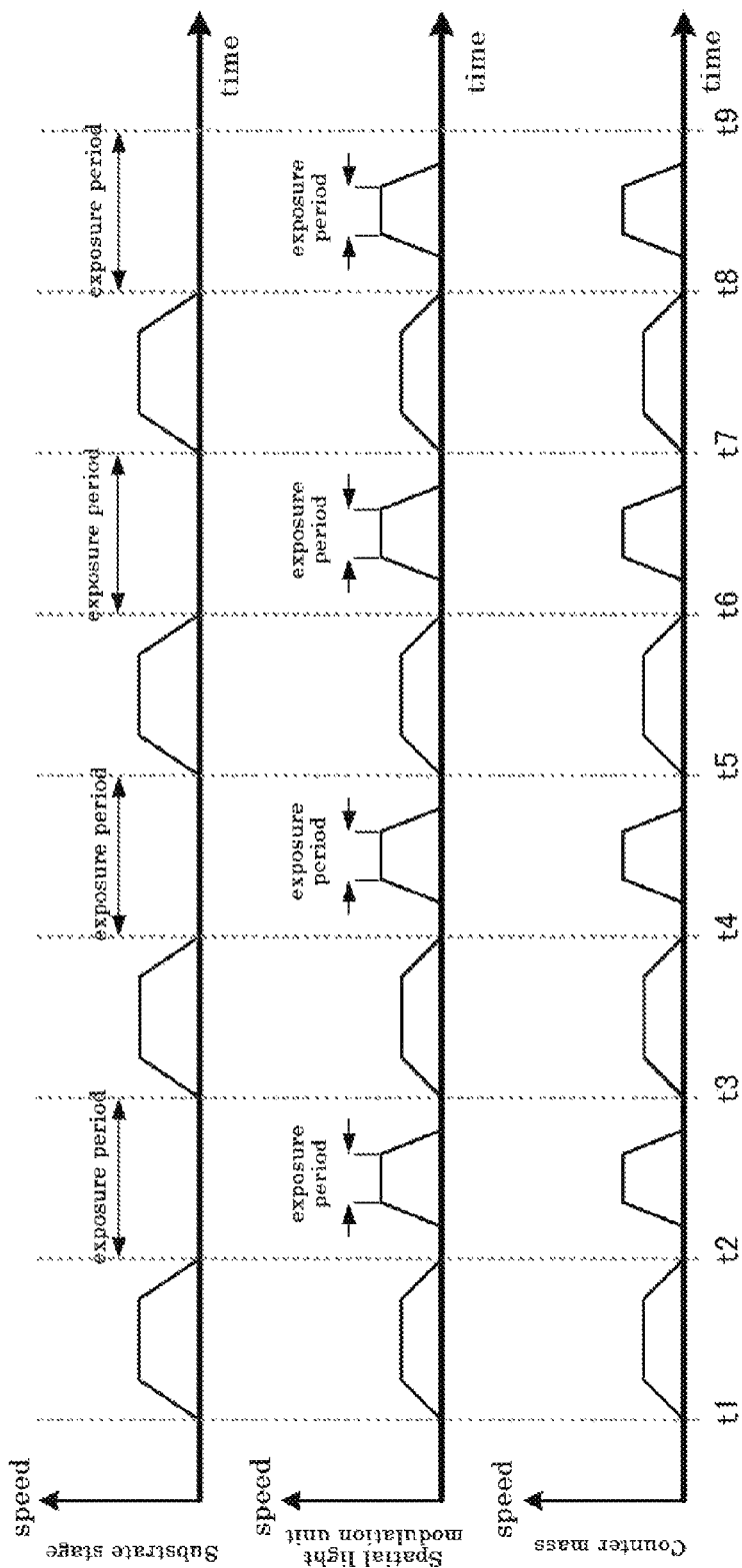
FIG. 8 is a first example of a timing chart.
Figure 9:
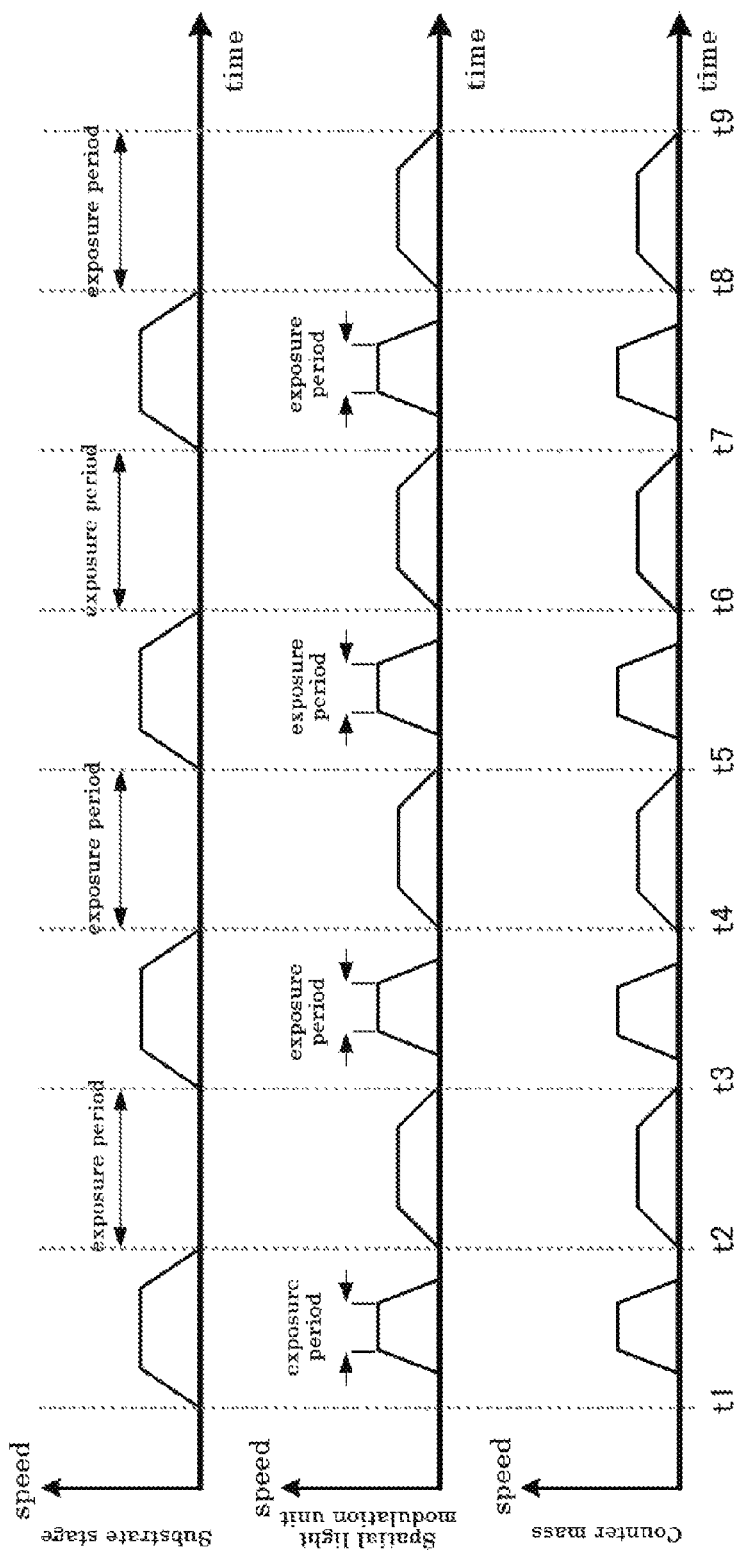
FIG. 9 is a second example of a timing chart.
Figure 10:
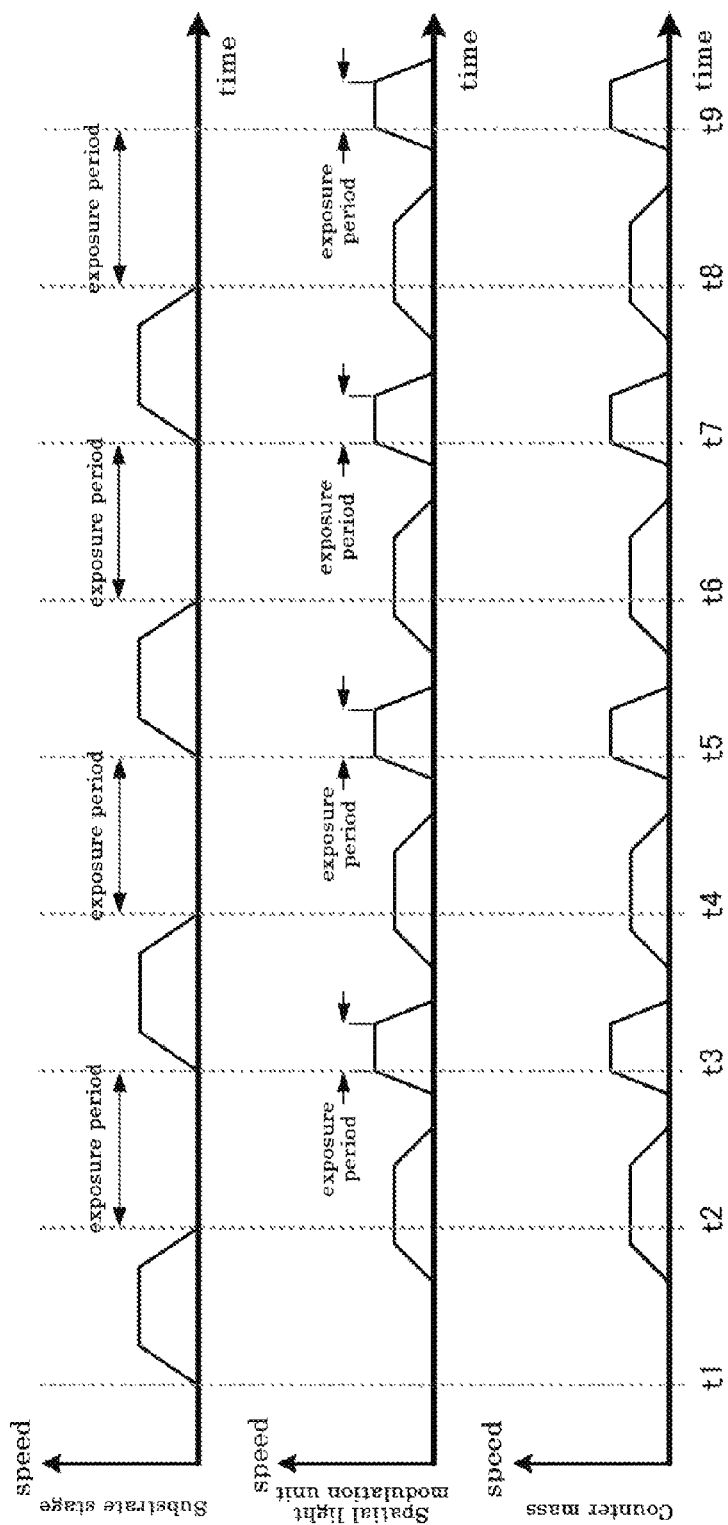
FIG. 10 is a third example of a timing chart.

FIG. 8 to FIG. 10 are views for explaining a moving speed of the substrate stage 60, a moving speed of the spatial light modulation unit 40, and a moving speed of the counter mass 85. A speed is taken on an axis of ordinates and a time is taken on an axis of abscissas. From the top, the relationship between the moving speed of the substrate stage 60 and time, the relationship between the moving speed of the spatial light modulation unit 40 and time, and the relationship between the moving speed of the counter mass 85 and time are shown in order. In FIG. 8 to FIG. 10, a first example to a third example are explained hereinafter as an example where the spatial light modulation unit 40 exposes either one of information data M1 and information data M2.

<<Timing Chart: First Example>>

As shown in FIG. 8, the substrate stage 60 is accelerated, is moved to the next exposure region, is decelerated and is stopped (t1 to t2, t3 to t4, t5 to t6, t7 to t8). In the midst of a period where the substrate stage 60 is stopped, the projection exposure unit 70 performs the exposure of a circuit pattern PA on the printed circuit board PWA (t2 to t3, t4 to t5, t6 to t7, t8 to t9).

The spatial light modulation unit 40, in the midst of the movement of the substrate stage 60, is accelerated, is moved to the next exposure region, is decelerated and is stopped (t1 to t2, t3 to t4, t5 to t6, t7 to t8). In the midst of a period where the substrate stage 60 is stopped, the spatial light modulation unit 40 performs scanning such that the spatial light modulation unit 40 exposes either one of information data M1 and information data M2 on the printed circuit board PWA (during a period of a fixed speed in t2 to t3, t4 to t5, t6 to t7, t8 to t9).

The counter mass 85 is, for suppressing a reaction generated in the spatial light modulation unit 40, accelerated or decelerated in synchronism with the acceleration or the deceleration of the spatial light modulation unit 40.

In the timing chart of the first example, in the midst of the period where the substrate stage 60 is stopped, the spatial light modulation unit 40 performs scanning and hence, the spatial light modulation unit 40 can easily perform scanning at a fixed speed. Accordingly, the unit drive part control circuit 94 can easily control scanning performed by the spatial light modulation unit 40.

<<Timing Chart: Second Example>>

As shown in FIG. 9, the substrate stage 60 is accelerated, is moved to the next exposure region, is decelerated and is stopped (t1 to t2, t3 to t4, t5 to t6, t7 to t8). In the midst of the movement of the substrate stage 60, the projection exposure unit 70 performs the exposure of a circuit pattern PA on the printed circuit board PWA (t1 to t2, t3 to t4, t5 to t6, t7 to t8).

The spatial light modulation unit 40, in the midst of the movement of the substrate stage 60, performs scanning such that the spatial light modulation unit 40 exposes either one of information data M1 and information data M2 to the printed circuit board PWA (during a period of a fixed speed in t1 to t2, t3 to t4, t5 to t6, t7 to t8). In the midst of a period where the substrate stage 60 is stopped, the spatial light modulation unit 40 is accelerated, is moved to the next exposure region, is decelerated and is stopped (t2 to t3, t4 to t5, t6 to t7, t8 to t9).

The counter mass 85, for suppressing a reaction generated in the spatial light modulation unit 40, is accelerated or decelerated in synchronism with the acceleration or the deceleration of the spatial light modulation unit 40.

In the timing chart of the second example, the spatial light modulation unit 40 performs the scanning in the midst of the movement of the substrate stage 60 and hence, the exposure by the spatial light modulation unit 40 and the exposure by the projection exposure unit 70 do not overlap with each other. That is, it is possible to prevent a drawback that an image contrast of information data M1 which the spatial light modulation unit 40 exposes is lowered due to multiple exposure or a flare light.

<<Timing Chart: Third Example>>

As shown in FIG. 10, the substrate stage 60 is accelerated, is moved to the next exposure region, is decelerated and is stopped (t1 to t2, t3 to t4, t5 to t6, t7 to t8). In the midst of a period where the substrate stage 60 is stopped, the projection exposure unit 70 performs exposure of a circuit pattern PA on the printed circuit board PWA (t2 to t3, t4 to t5, t6 to t7, t8 to t9).

Irrespective of the substrate stage 60 being in the midst of the movement or at rest, the spatial light modulation unit 40 is accelerated, is moved to the next exposure region, is decelerated and is stopped (t1 to t9). Further, irrespective of the substrate stage 60 being in the midst of the movement or at rest (asynchronous), the spatial light modulation unit 40 performs scanning such that the spatial light modulation unit 40 exposes either one of information data M1 and information data M2 on the printed circuit board PWA (during period of a fixed speed in t2 to t9).

The counter mass 85, for suppressing a reaction generated in the spatial light modulation unit 40, is accelerated or decelerated in synchronism with the acceleration or the deceleration of the spatial light modulation unit 40.

In the timing chart of the third example, the spatial light modulation unit 40 performs scanning irrespective of the substrate stage 60 being in the midst of the movement or at rest and hence, information data M1 or information data M2 can be exposed within a short period.

<Constitution of Exposure Device 200 of Second Embodiment>

Figure 11:
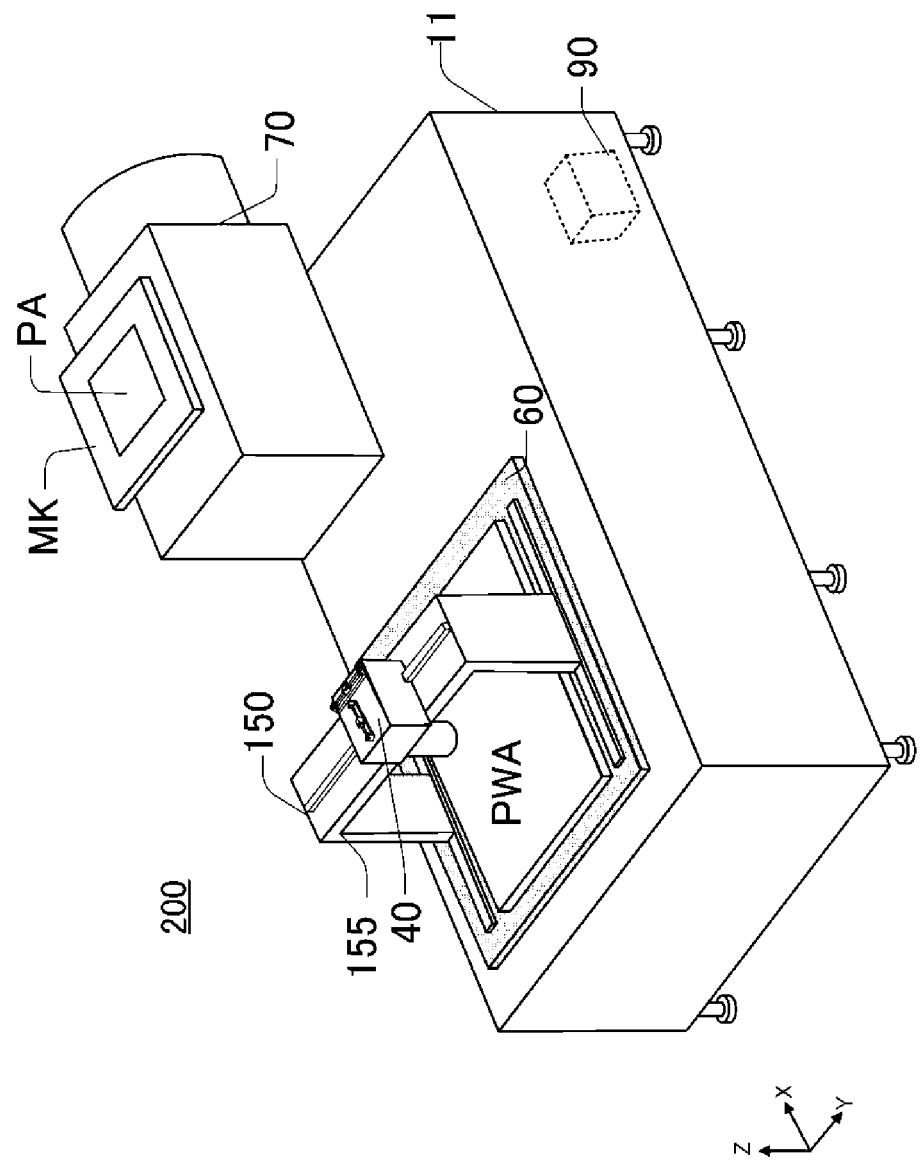
FIG. 11 is a perspective view showing an exposure device 200 according to the second embodiment of the present invention.

An exposure device 200 of the second embodiment is explained in conjunction with FIG. 11 and FIG. 12.

The exposure device 100 of the first embodiment and the exposure device 200 of the second embodiment differ from each other in the constitution of the spatial light modulation unit drive part. Parts of the exposure device 200 identical with the part s of the exposure device 100 are given the same symbols.

The exposure device 200 of the second embodiment includes a second spatial light modulation unit drive part 150. Since the constitutions other than the second spatial light modulation unit drive part 150 in the exposure device 200 of the second embodiment are equal to the corresponding constitutions of the exposure device 100 of the first embodiment and hence, the explanation of other constitutions is omitted.

A spatial light modulation unit 40 is placed on the second spatial light modulation unit drive part 150. The second spatial light modulation unit drive part 150 includes a portal frame 155 which is constituted of a beam which extends in the Y-axis direction, and support struts which extend in the Z-axis direction from ends of the beam. The second spatial light modulation unit drive part 150 moves the spatial light modulation unit 40 in the X-axis direction and in the Y-axis direction. The second spatial light modulation unit drive part 150 is placed on a substrate stage 60 arranged on an upper portion of a housing 11.

Figure 12A:
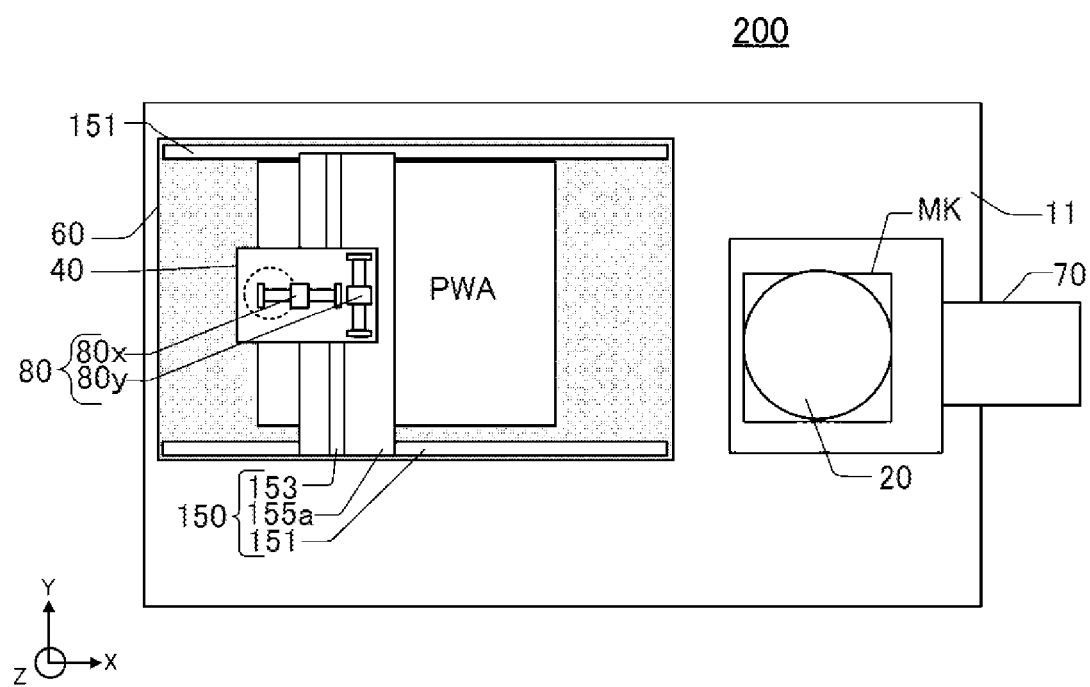
FIG. 12A is a plan view of the exposure device 200 as viewed from above.
Figure 12B:
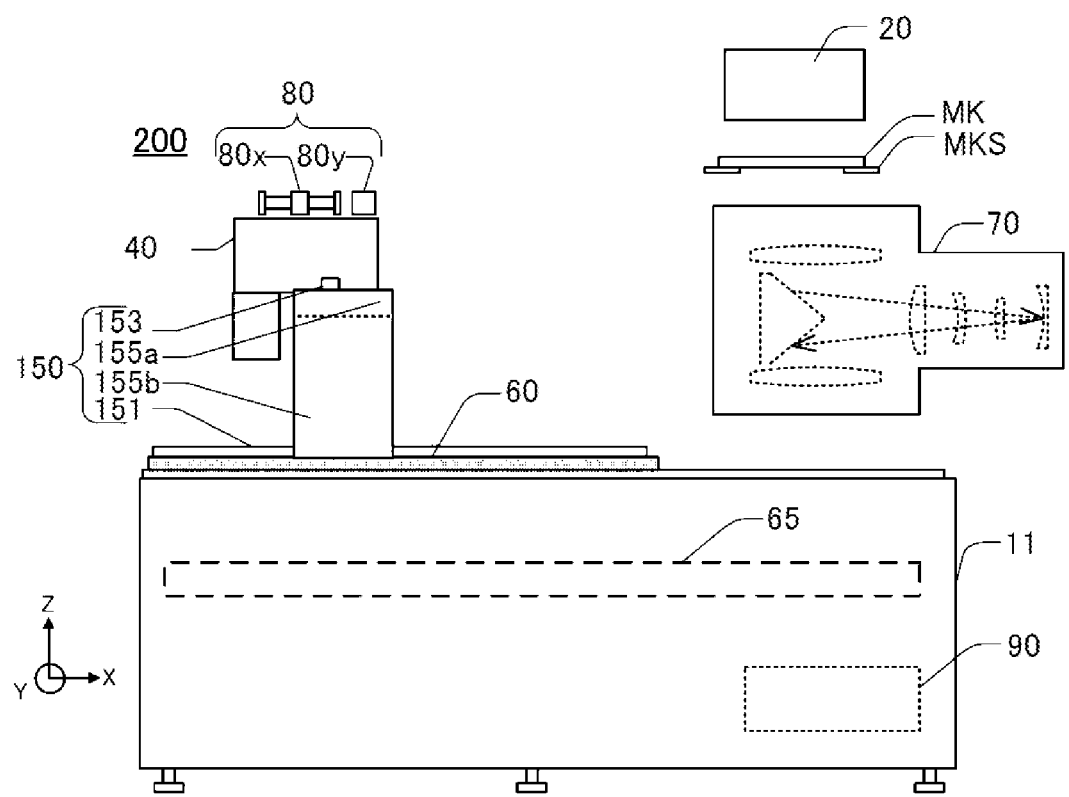
FIG. 12B is a side view of the exposure device 200 as view from a side.

FIG. 12A is a plan view of the exposure device 200 as viewed from above. FIG. 12B is a side view of the exposure device 200 as viewed from a side.

The portal frame 155 of the second spatial light modulation unit drive part 150 includes a beam 155a which extends in the Y-axis direction, and a pair of support struts 155b which extends in the Z-axis direction from ends of the beam. A Y-axis drive device 153 which moves the spatial light modulation unit 40 in the Y-axis direction is mounted on the beam 155a. Further, an X-axis drive device 151 which moves the spatial light modulation unit 40 in the X-axis direction is provided to distal ends of the pair of support struts 155b. The X-axis drive devices 151 are provided at ±Y-axis ends of the substrate stage 60 such that the X-axis drive devices 151 extend in the X-axis direction. Due to such a constitution, the spatial light modulation unit 40 moves in the X-axis direction and in the Y-axis direction.

The second spatial light modulation unit drive part 150 is placed on the substrate stage 60 and hence, the portal frame 155 can be made small compared to the portal frame 55 of the exposure device 100.

Although the first and second embodiments of the invention have been explained in detail heretofore, as can be clearly understood by those who are skilled in the art, the invention can be carried out by adding various changes or modifications to the embodiments within the technical scope of the invention. For example, on the upper surface (ceiling surface) of the cover 42 of the spatial light modulation unit 40 shown in FIG. 4, the X-axis counter mass drive part 80x and the Y-axis counter mass drive part 80y which drives the counter mass in the Y-axis direction are arranged. However, the X-axis counter mass drive part 80x and the Y-axis counter mass drive part 80y may be mounted on side surfaces of the cover 42. Further, the counter mass drive part 80 may swing a counter mass like a pendulum in place of the counter mass 85 which moves linearly.

Next, an exposure device according to a third embodiment of the invention is explained.

<Constitution of Exposure Device 300 of Third Embodiment>

Figure 13:
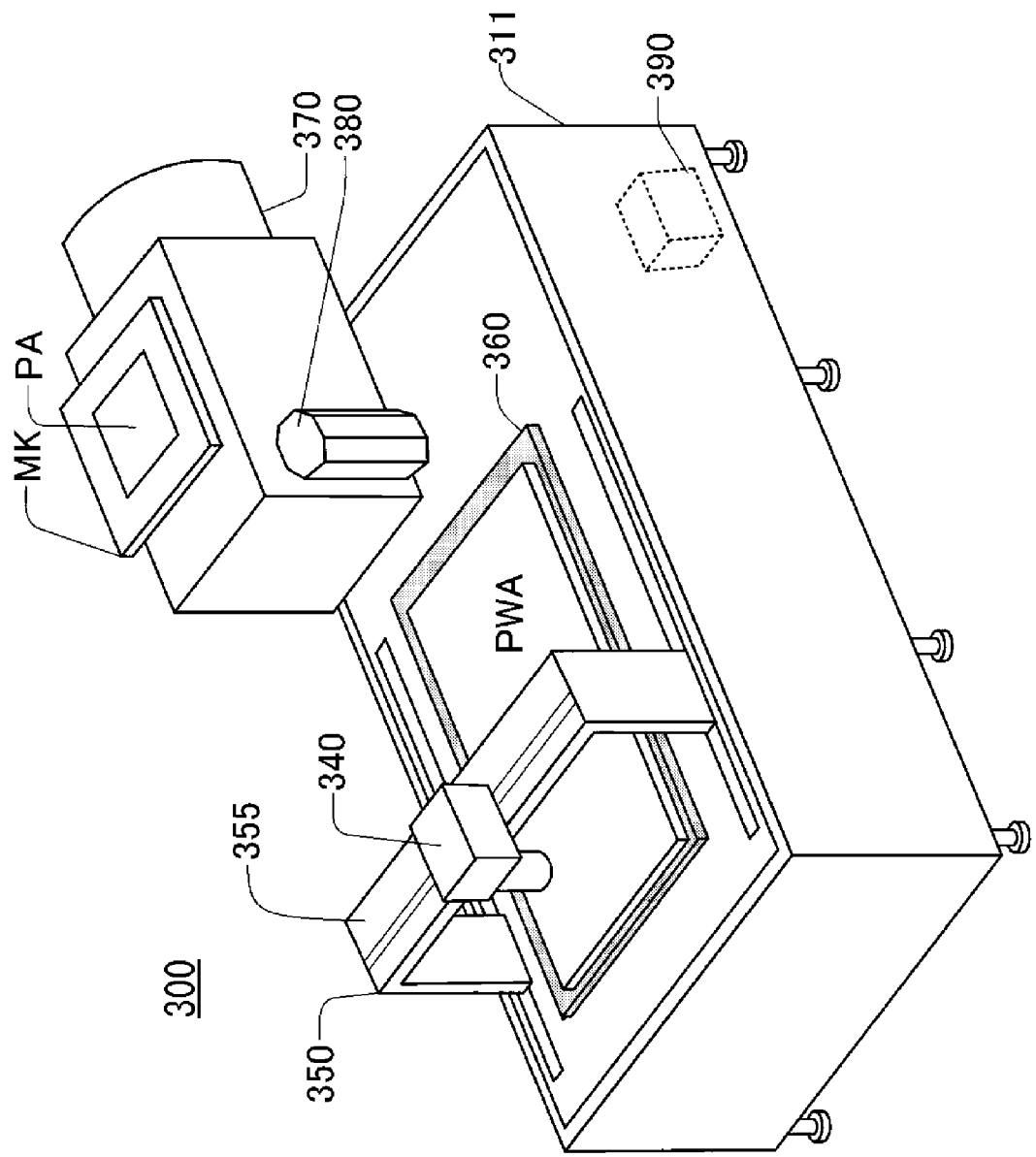
FIG. 13 is a perspective view showing an exposure device 300 according to the third embodiment of the present invention.

FIG. 13 is a perspective view of an exposure device 300. In FIG. 13, a light source is not shown, and the exposure device 300 is depicted such that the long-axis direction of a housing 311 is taken along the X-axis direction, and the short-axis direction of the housing 311 is taken along the Y-axis direction. Further, for facilitating the understanding of the arrangement of a projection exposure unit 370, support struts and the like for supporting the projection exposure unit 370 are not shown in the drawing.

The exposure device 300 is constituted of the housing 311, a spatial light modulation unit 340, a substrate stage 360 and the projection exposure unit 370. The housing 311 supports the spatial light modulation unit 340, the substrate stage 360 and the projection exposure unit 370, while a control part 390 which controls the spatial light modulation unit 340, the substrate stage 360 and the projection exposure unit 370 is arranged in the inside of the housing 311. The housing 311 is supported on vibration-proof mounts.

The spatial light modulation unit 340 is placed on a spatial light modulation unit drive part 350. The spatial light modulation unit drive part 350 includes a portal frame 355 which is constituted of a beam which extends in the Y-axis direction, and support struts which extend in the Z-axis direction from ends of the beam. The spatial light modulation unit drive part 350 moves the spatial light modulation unit 340 in the X-axis direction and in the Y-axis direction. The substrate stage 360 is mounted on an upper portion of the housing 311.

In the same manner as the first embodiment, the spatial light modulation unit 340 can, on a peripheral region of the printed circuit board PWA, expose character information or graphic information used for substrate control for controlling a printed circuit board PWA, character information or graphic information used for substrate control for controlling respective divided substrates after division of the printed circuit board PWA, test coupon information including a test coupon such as a quality conformance test or a test pattern or the like.

The projection exposure unit 370 is constituted of a plurality of lenses or a plurality of mirrors or the like. The projection exposure unit 370 is supported and fixed by the support struts not shown in the drawing. A photomask MK on which a circuit pattern PA is drawn is arranged on a side opposite to the printed circuit board PWA with the projection exposure unit 370 sandwiched therebetween. The projection exposure unit 370 exposes a circuit pattern PA on the photomask MK irradiated with light including ultraviolet rays to the printed circuit board PWA. In this embodiment, a catadioptric projection exposure unit referred to as a Dyson-type projection exposure unit is used. However, a refraction-type projection exposure unit which is constituted of only a plurality of lenses may be used or a reflection-type projection exposure unit referred to as an Ophner-type projection exposure unit may also be used.

An alignment camera 380 is mounted on a lens barrel of the projection exposure unit 370. The alignment camera 380 images alignment marks AM (see FIG. 19) formed on the printed circuit board PWA.

Figure 14A:
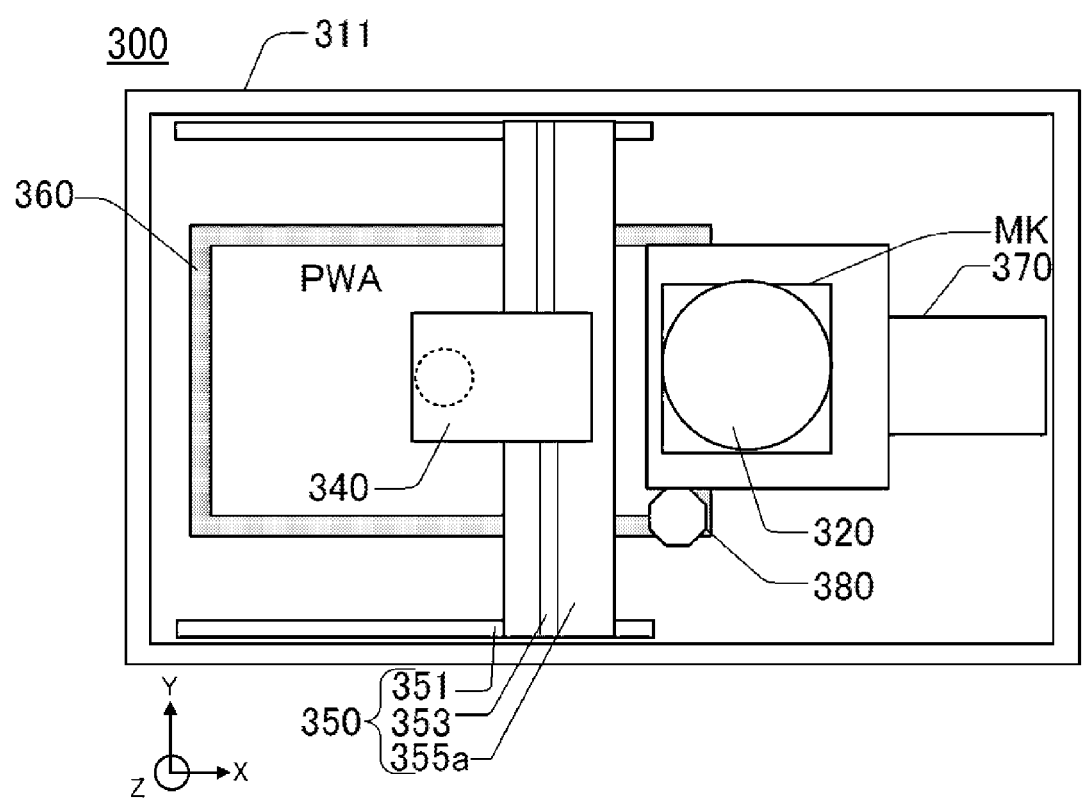
FIG. 14A is a view of the exposure device 300 as viewed from above.
Figure 14B:
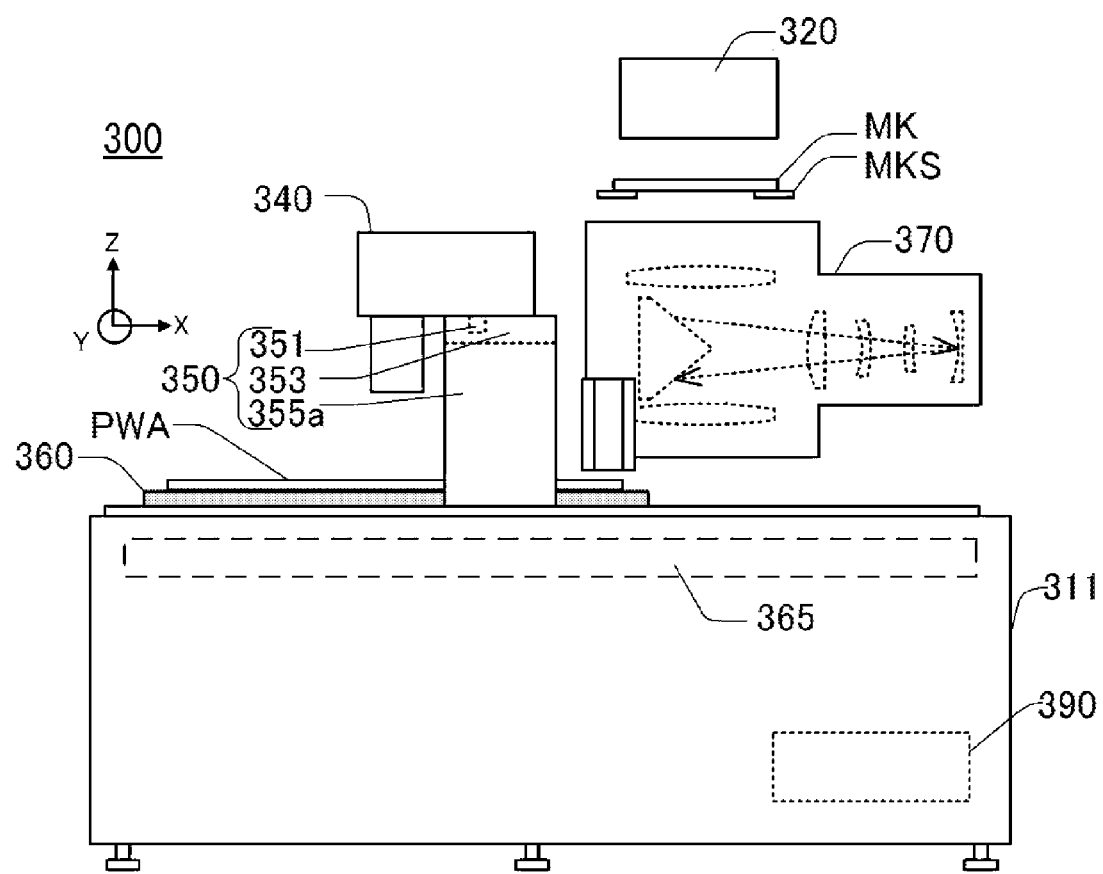
FIG. 14B is a view of the exposure device as viewed from a side.

FIG. 14A is a plan view of the exposure device 300 including the light source as viewed from above. FIG. 14B is a side view of the exposure device 300 as viewed from a side.

<Constitution of Spatial Light Modulation Unit 340>

Figure 15:
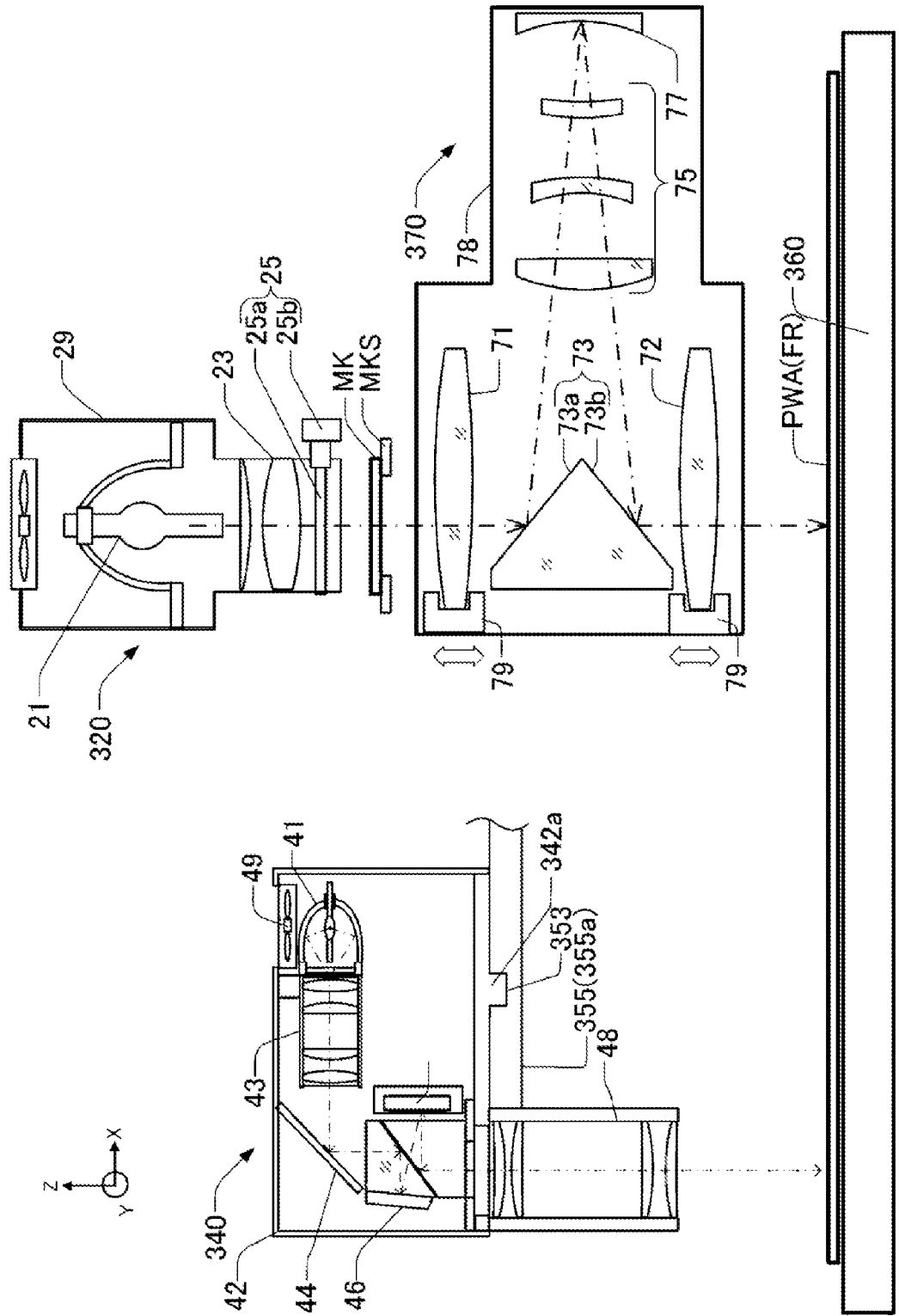
FIG. 15 is an enlarged conceptual view showing a spatial light modulation unit 340 and a projection exposure unit 370.

FIG. 15 is a conceptual view showing the constitution of the spatial light modulation unit 340, the light source 320 and the projection exposure unit 370.

The spatial light modulation unit 340 has the substantially same constitution and the manner of operation as the spatial light modulation unit 40 of the first embodiment. In the third embodiment, an exhaust port is formed in the cover 42, and a fan 49 is arranged in the exhaust port. Due to such a constitution, it is possible to prevent heat from being accumulated in the cover 42. An engaging portion 342a which engages with a Y-axis drive device 353 mounted on a beam 355a is formed on a portion of the cover 42.

Information data to be exposed on the printed circuit board PWA can be obtained by electronically changing the directions of one million pieces of micro-mirrors in the DMD 47. Accordingly, the size of information data to be exposed on the printed circuit board PWA is adjusted to arbitrary magnification.

<Constitution of Light Source 320 and Projection Exposure Unit 370>

As shown in FIG. 15, a photomask MK which is placed on a mask stage MKS is arranged above (on a +Z-axis side of) the projection exposure unit 370. The light source 320 is arranged above the photomask MK.

The light source 320 is constituted of a mercury vapor lamp 21, an illumination optical system 23 and a shutter part 25. The mercury vapor lamp 21 is surrounded by a cover 29, and the cover 29 has the structure which prevents a leakage of lights other than light from the optical system. The mercury vapor lamp 21 irradiates a light including a g-line ray (365 nm), an h-line ray (405 nm) and an i-line ray (436 nm). The cover 29 is configured such that an exhaust port and an irradiation port are formed in the cover 29 thus enabling the discharge of air and the irradiation of a light beam.

A light beam irradiated from the mercury vapor lamp 21 is reflected in the direction toward the substrate by an elliptical mirror and is focused by the illumination optical system 23. The light beam incident on the illumination optical system 23 is formed into parallel light beams and the light beams are irradiated toward the photomask MK. The illumination optical system 23 is arranged perpendicular to a surface of the photomask MK.

The shutter part 25 is arranged in a path ranging from the mercury vapor lamp 21 to the photomask MK. In this embodiment, the shutter part 25 is arranged below the illumination optical system 23. The shutter part 25 is constituted of a shutter blade 25a and a shutter drive part 25b. The shutter drive part 25b is constituted of a rotary motor or the like, and brings the shutter blade 25a into an optical path or retracts the shutter blade 25a from the optical path. In this manner, the shutter part 25 blocks a light beam irradiated from the mercury vapor lamp 21 or allows the light beam to pass therethrough. The shutter blade 25a retracts from the optical path when a certain region of the printed circuit board PWA is exposed, and the shutter blade 25a advances into the optical path when the printed circuit board PWA moves to a next region.

Next, the projection exposure unit 370 is explained. The projection exposure unit 370 includes: an incident-side convex lens 71 and an irradiation-side convex lens 72; a reflection mirror 73 which is arranged between the incident-side convex lens 71 and the irradiation-side convex lens 72; a correction lens 75; and a concave-surface reflection mirror 77 in the inside of a lens barrel 78.

The incident-side convex lens 71 and the irradiation-side convex lens 72 have the same refractive index, and are arranged at positions which have the common axis. The incident-side convex lens 71 and the irradiation-side convex lens 72 are supported by a magnification adjusting part 79. The magnification adjusting part 79 includes support tables which support the incident-side convex lens 71 and the irradiation-side convex lens 72 respectively, linear guides, motors and the like. When the printed circuit board PWA is expanded or contracted due to heat treatment or the like, the magnification adjusting part 79 moves the incident-side convex lens 71 and the irradiation-side convex lens 72 thus making a circuit pattern PA on a photomask MK (see FIG. 13) conform to an expanded or contracted state of the printed circuit board PWA.

The reflection mirror 73 has: a first reflection surface 73a which guides a projection light from the incident-side convex lens 71 to the correction lens 75 and the concave-surface reflection mirror 77; and a second reflection surface 73b which guides the projection light from the correction lens 75 and the concave-surface reflection mirror 77 to the irradiation-side convex lens 72. The correction lens 75 which is constituted of a plurality of lenses corrects the aberration of the projection light from the reflection mirror 73. The concave-surface reflection mirror 77 reflects the projection light transmitted through the correction lens 75.

That is, the projection exposure unit 370 performs the magnification adjustment of the projection light which passes through the circuit pattern PA on the photomask MK, and projects the projection light onto a photoresist FR surface of the printed circuit board PWA.

Next, the magnification adjustment performed by the magnification adjusting part 79 is explained. With respect to the magnification adjusting part 79, how much the magnification changes when the incident-side convex lens 71 and the irradiation-side convex lens 72 are moved by arbitrary distances along an optical axis is stored in the memory device or the like.

When the magnification at which a projection light is projected to the printed circuit board PWA is 1 (equal magnification), the magnification adjusting part 79 performs the adjustment such that a distance from the incident-side convex lens 71 to the first reflection surface 73a of the reflection mirror 73 and a distance from the second reflection surface 73b to the irradiation-side convex lens 72 become equal to each other.

To reduce the magnification, the magnification adjusting part 79 moves the incident-side convex lens 71 and the irradiation-side convex lens 72 such that the incident-side convex lens 71 is spaced apart from the reflection mirror 73, and the irradiation-side convex lens 72 approaches the reflection mirror 73. On the other hand, to increase the magnification, the magnification adjusting part 79 moves the incident-side convex lens 71 and the irradiation-side convex lens 72 such that the incident-side convex lens 71 approaches the reflection mirror 73, and the irradiation-side convex lens 72 is spaced apart from the reflection mirror 73.

<Constitution of Mercury Vapor Lamp 21 and Mercury Vapor Lamp 41>

The mercury vapor lamp 21 used in the projection exposure unit 370 irradiates the whole surface of the photomask MK and hence, an irradiation light amount of the mercury vapor lamp 21 is large. On the other hand, a mercury vapor lamp 41 used in the spatial light modulation unit 40 has a small irradiation amount since a region of information data is small. When the mercury vapor lamp 41 per se can be miniaturized, the mobility of the spatial light modulation unit 40 when the spatial light modulation unit 40 performs scanning can be enhanced. Accordingly, it is desirable that the mercury vapor lamp 41 per se is made as small as possible, while sensitivity of the mercury vapor lamp 41 for the photoresist FR is not lowered.

Figure 16:
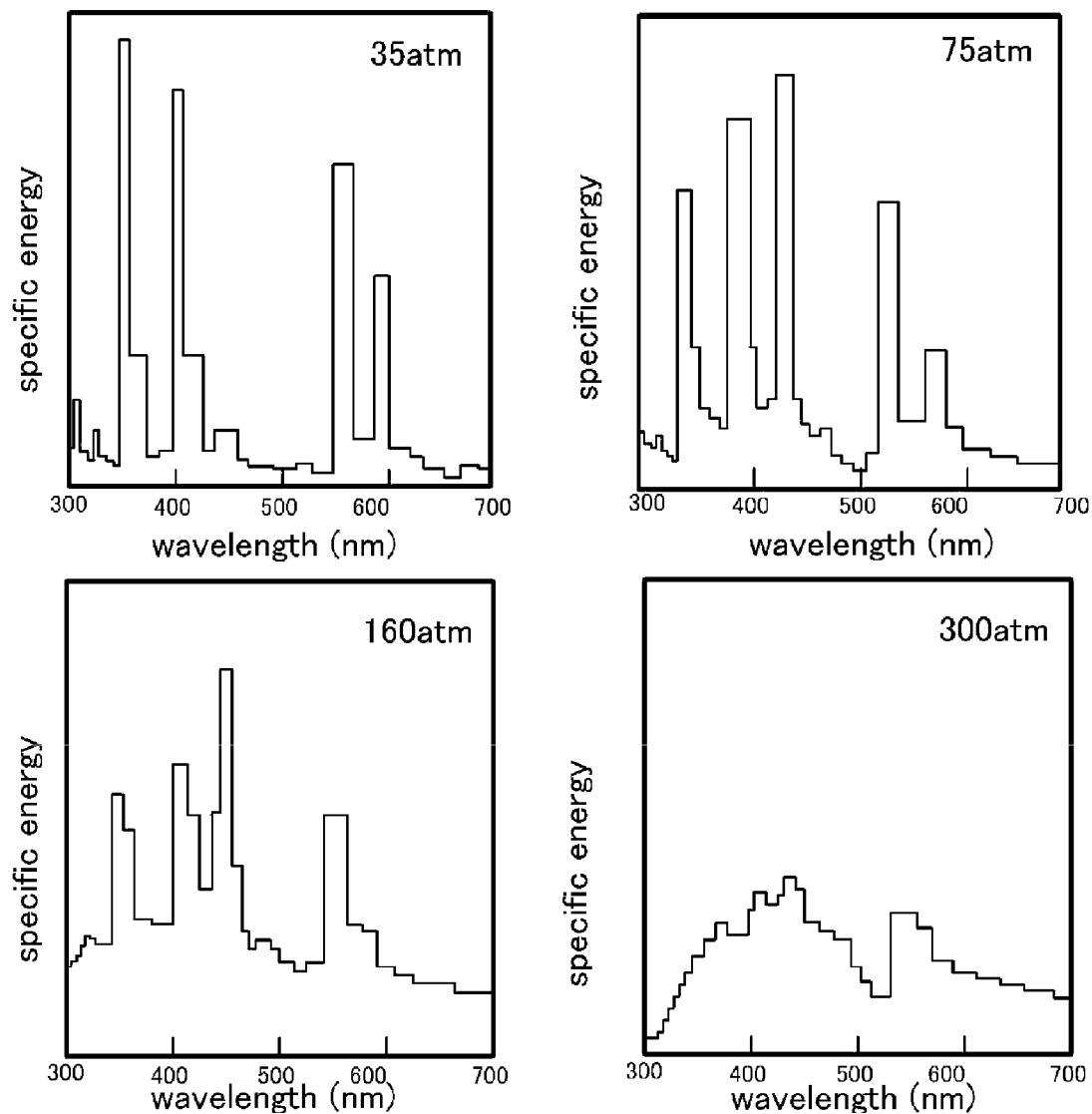
FIG. 16 is a graph showing specific energies of mercury lamps which differ in mercury vapor pressure from each other with respect to respective wave lengths.

FIG. 16 is a graph showing specific energies of mercury vapor lamps which differ in mercury vapor pressure from each other with respect to respective wave lengths. As has been known in general, the spectral distribution of a mercury vapor lamp exhibits the relative spectral distribution where a continuous spectral component is increased along with the increase of mercury vapor pressure at the time of turning on the mercury vapor lamp. Although a bright line spectrum is strong when mercury vapor pressure at the time of turning on the mercury vapor lamp is approximately 10 to 30 atmospheric pressure, a continuous spectrum becomes strong when mercury vapor pressure is around approximately 200 atmospheric pressure. Mercury vapor pressure at the time of turning on the mercury vapor lamp is substantially determined based on an amount of mercury sealed in the mercury vapor lamp and a turn-on input voltage.

In this embodiment, with respect to the mercury vapor lamp 21 used in the projection exposure unit 370, a mercury sealed amount falls within a range from 1 mg/cm$^3$ to 50 mg/cm$^3$ (mercury vapor pressure: approximately 30 atmospheric pressure). Such a mercury sealed amount is set for making the mercury vapor lamp 21 correspond to photo sensitivity of the photoresist FR or a circuit pattern PA having a fine line width. On the other hand, with respect to the mercury vapor lamp 41 used in the spatial light modulation unit 340, a mercury sealed amount is 150 mg/cm$^3$ (mercury vapor pressure: approximately 200 atmospheric pressure) or more. In this manner, the mercury vapor lamp 21 used in the projection exposure unit 370 satisfies requirements such as a fine pattern and high energy, and the mercury vapor lamp 41 used in the spatial light modulation unit 340 is small-sized so that the mercury vapor lamp 41 can be mounted on an operating unit easily, and can acquire emission of light with high brightness within a predetermined wavelength range.

<Constitution of Control Part 390>

Figure 17:
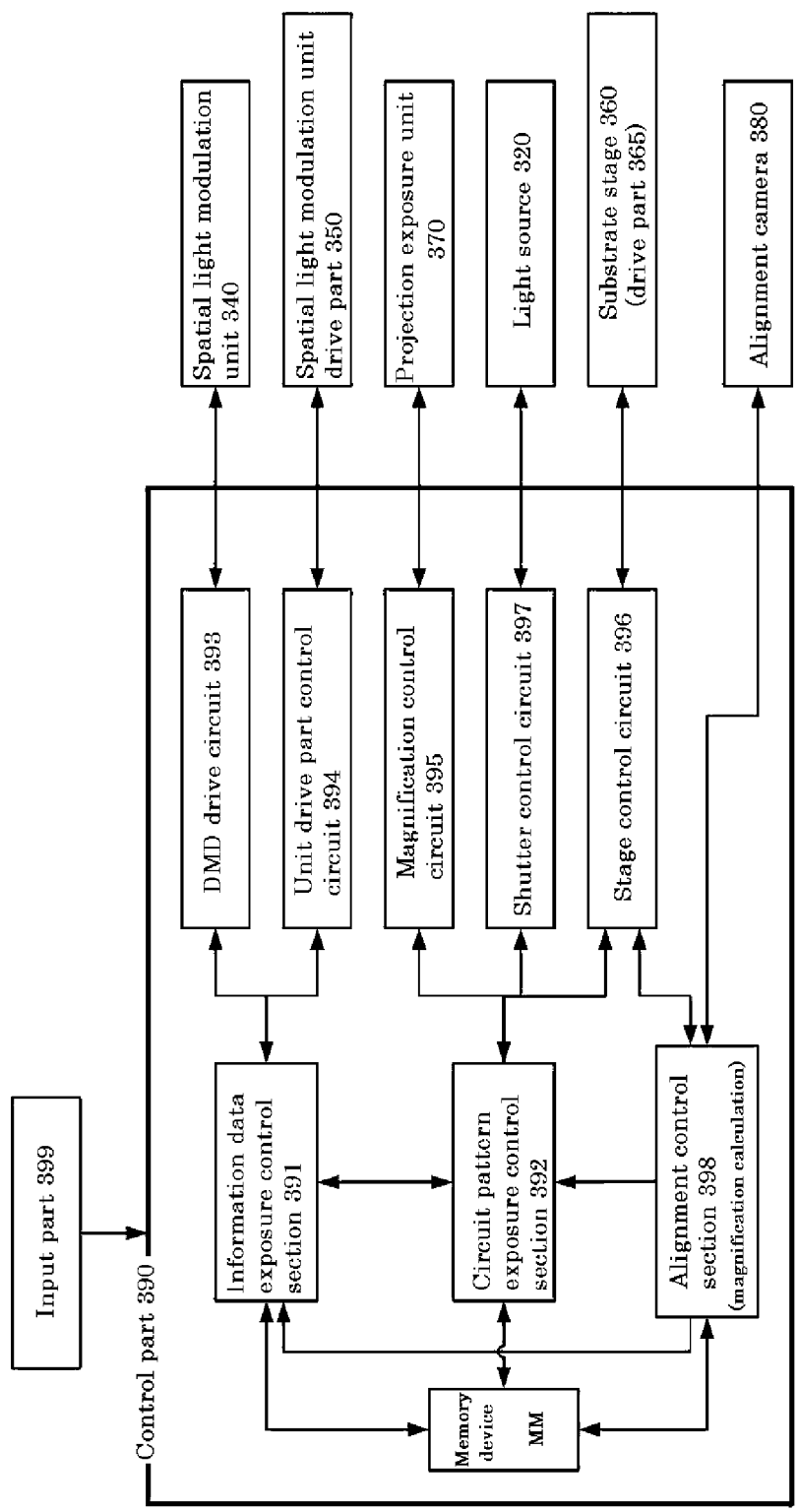
FIG. 17 is a block diagram showing the constitution of the exposure device 300 and a control part 390.

FIG. 17 is a block diagram showing the constitution of the control part 390 of the exposure device 300. The exposure device 300 is controlled by the control part 390. The control part 390 includes: an information data exposure control section 391 which controls the exposure of information data; a circuit pattern exposure control section 392 which controls the exposure of a circuit pattern; and an alignment control section 398. The information data exposure control section 391, the circuit pattern exposure control section 392 and the alignment control section 398 are connected to a memory device MM.

The memory device MM stores therein data such as exposure data on the printed circuit board PWA, data on an exposure region of a circuit pattern, positional information of information data, positional information of alignment marks, photoresist sensitivity of the printed circuit board PWA, and a moving speed of the substrate stage 360. Data to be stored in the memory device MM is inputted by an external input part 399 (for example, a plant side LAN or a manual input) connected to the control part 390.

The information data exposure control section 391 is connected to a DMD drive circuit 393 and a control circuit 394 of the spatial light modulation unit drive part. The information data exposure control section 391 converts identification signal exposure data stored in the memory device MM into DMD drive data. The DMD drive circuit 393 is connected to the DMD 47 of the spatial light modulation unit 340, and inclines approximately one million pieces of micro-mirrors by ±12 degrees. The control circuit 394 of the spatial light modulation unit drive part is connected to the X-axis drive device 351 and the Y-axis drive device 353 of the spatial light modulation unit drive part 350 and moves the spatial light modulation unit 340 in the X-axis direction and in the Y-axis direction. The information data exposure control section 391 transmits a moving speed of the spatial light modulation unit 340 to the control circuit 394 of the spatial light modulation unit drive part based on a condition such as photoresist sensitivity of the printed circuit board PWA stored in the memory device MM. That is, the information data exposure control section 391 performs a control such that information data is exposed on a plurality of regions of the printed circuit board PWA.

The circuit pattern exposure control section 392 is connected to a magnification control circuit 395, a stage control circuit 396 and a shutter control circuit 397. The magnification control circuit 95 is connected to the magnification adjusting part 79 of the projection exposure unit 370, and moves the incident-side convex lens 71 and the irradiation-side convex lens 72. The stage control circuit 396 is connected to the stage drive part 365 of the substrate stage 360, and moves the substrate stage 360 in the X-axis direction and in the Y-axis direction. The shutter control circuit 397 is connected to the shutter part 25 of the light source 320, and opens or closes the shutter part 25. That is, the circuit pattern exposure control section 392 performs the control such that the circuit pattern PA on the photomask MK (see FIG. 13) is exposed on a plurality of regions of the printed circuit board PWA with appropriate magnification.

Figure 19:
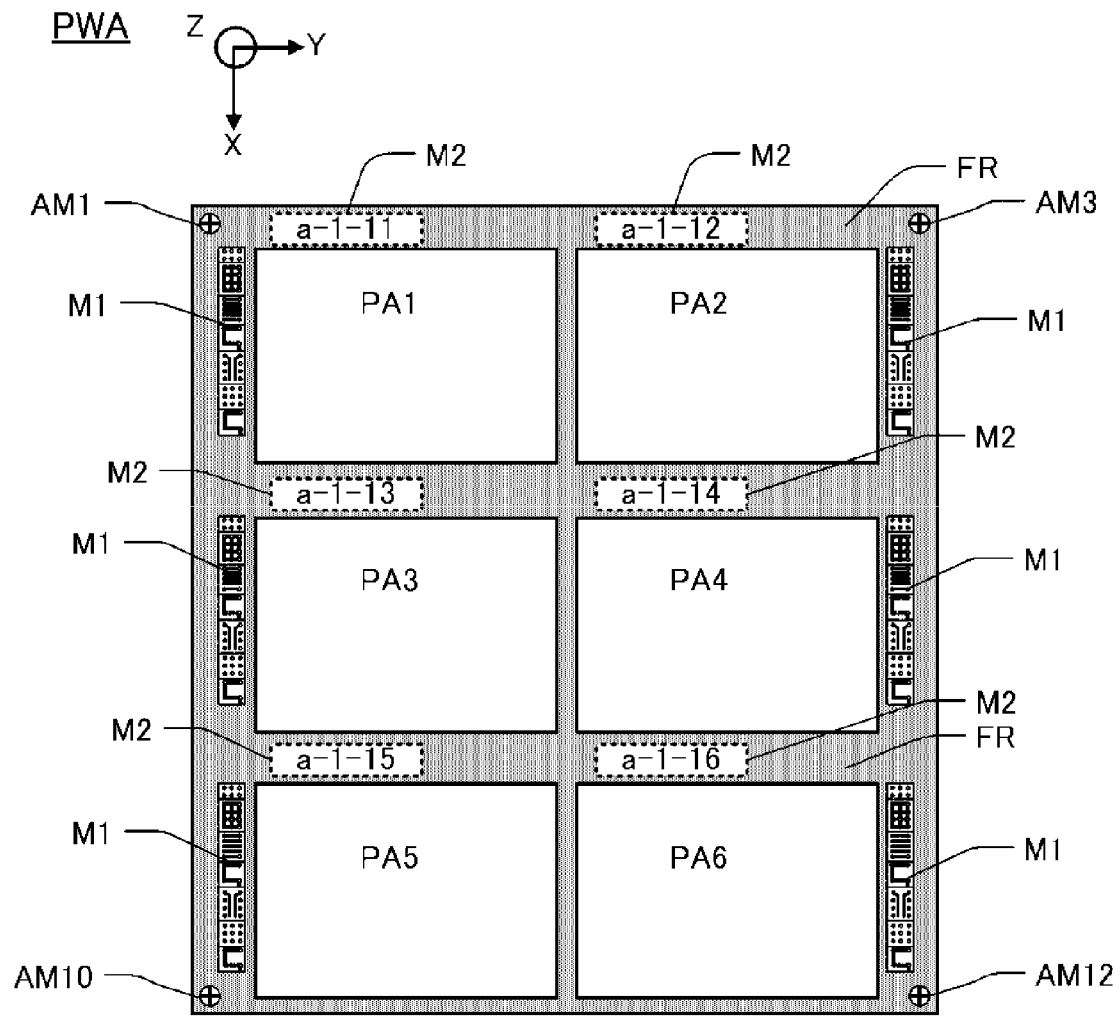
FIG. 19 is a plan view showing an exposed printed circuit board PWA.

The alignment control section 398 is connected to the stage control circuit 396 and the alignment camera 380, and images the alignment marks AM formed on a plurality of portions of the printed circuit board PWA (see FIG. 19). The alignment control section 398 calculates an expansion or contraction state of a wiring pattern of the printed circuit board PWA, that is, performs the multiplication calculation, by imaging the alignment marks AM.

<Manner of Operation of Exposure Device 300>

Figure 18:
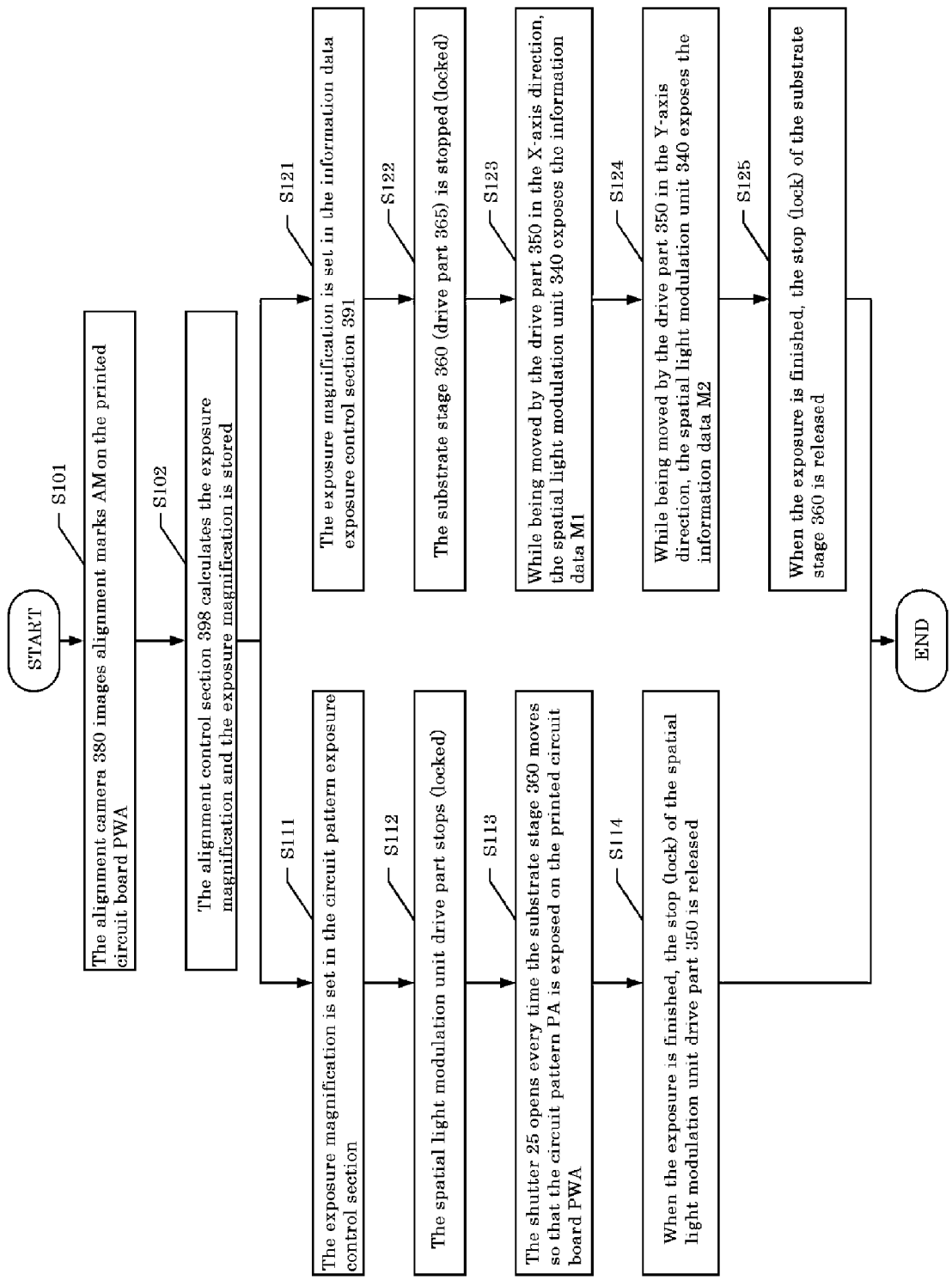
FIG. 18 is a flowchart of exposure performed by the exposure device 300.

The manner of operation of the exposure device 300 is explained. FIG. 18 is a flowchart showing the exposure performed by the exposure device 300. The manner of operation of the exposure device 300 is explained in conjunction with a plan view of the printed circuit board PWA shown in FIG. 19 and information data M1 shown in FIG. 20. In FIG. 19, the circuit pattern PA or information data (M1, M2) is exposed on the printed circuit board PWA. However, before the exposure, only the alignment marks AM (AM1, AM3, AM10, AM12) are formed on the printed circuit board PWA. Further, a photoresist FR which is a photosensitive material is formed on a surface of the printed circuit board PWA.

Firstly, the printed circuit board PWA is conveyed to the substrate stage 360 by a conveying device not shown in the drawing.

Then, in step S101, the alignment control section 398 moves the substrate stage 360 in the X-axis direction and in the Y-axis direction so that an alignment mark AM on the printed circuit board PWA is present below the alignment camera 380. The alignment camera 380 images a plurality of alignment marks AM on the printed circuit board PWA. The alignment marks AM (AM1, AM3, AM10, AM12) are formed on four corners of the printed circuit board PWA, and may be also formed of through holes which penetrate the printed circuit board PWA, for example.

In step S102, the alignment control section 398 calculates the expansion and contraction of the printed circuit board PWA based on the positions of the alignment marks AM in the X-axis direction and in the Y-axis direction which are imaged by the alignment camera 380. For example, when the printed circuit board PWA is expanded with the magnification of 1.01 times both in the X-axis direction and in the Y-axis direction, the exposure magnification is set to 1.01. This exposure magnification is stored in the memory device MM.

Next, in step S111, the exposure magnification stored in the memory device MM is set in the circuit pattern exposure control section 392. The circuit pattern exposure control section 392 moves the incident-side convex lens 71 and the irradiation-side convex lens 72 of the projection exposure unit 370 to positions corresponding to the exposure magnification through the magnification control circuit 395.

In step S112, the circuit pattern exposure control section 392 outputs a stop (lock) instruction to the information data exposure control section 391 for preventing the spatial light modulation unit drive part 350 from moving in the X-axis direction or in the Y-axis direction. Accordingly, there is no possibility that a circuit pattern PA on the photomask MK (see FIG. 13) is exposed on the printed circuit board PWA in the midst of the movement of the spatial light modulation unit drive part 350. On the other hand, when the spatial light modulation unit drive part 350 moves, there is a possibility that the substrate stage 360, the projection exposure unit 370 and the like slightly vibrate so that the circuit pattern PA cannot be accurately exposed on the printed circuit board PWA.

In step S113, the circuit pattern exposure control section 92 moves the substrate stage 360 to a predetermined position and, thereafter, stops the substrate stage 360. Then, the shutter control circuit 397 opens the shutter part 25, and closes the shutter part 25 after the exposure of a predetermined amount is performed. The circuit pattern exposure control section 392 moves the substrate stage 360 to a predetermined position again, and opens or closes the shutter part. By repeating such an operation, as shown in FIG. 19, the exposure of circuit patterns PA (PA1 to PA6) where exposure magnification is corrected is performed on the printed circuit board PWA in six regions.

In step S114, when the exposure is finished, the circuit pattern exposure control section 392 outputs an instruction to cancel the stop of the spatial light modulation unit drive part 350 to the information data exposure control section 391. Accordingly, the spatial light modulation unit drive part 350 can move.

Next, in step S121, the exposure magnification stored in the memory device MM is set in the information data exposure control section 391. The information data exposure control section 391 calculates which micro-mirrors are to be inclined corresponding to the exposure magnification.

In step S122, the information data exposure control section 391 outputs a stop (lock) signal to the circuit pattern exposure control section 392 for preventing the substrate stage 360 (or the stage drive part 365) from moving in the X-axis direction or in the Y-axis direction. Accordingly, there is no possibility that information data M1, M2 is exposed on the printed circuit board PWA in the midst of the movement of the substrate stage 360. There is no vibrations caused by the movement of the substrate stage 360 so that information data M1, M2 can be accurately exposed on the printed circuit board PWA.

In step S123, the spatial light modulation unit drive part 350 moves the spatial light modulation unit 340 in the direction approximately parallel to a side of the printed circuit board PWA. In the midst of movement of the spatial light modulation unit 340 in the X-axis direction, the DMD 47 of the spatial light modulation unit 340 is driven through the DMD drive circuit 393. Accordingly, in the midst of the movement (scanning) of the spatial light modulation unit 340, information data M1 where the exposure magnification is corrected is exposed on the printed circuit board PWA. As shown in FIG. 19, information data M1 is formed adjacent to the circuit pattern PA in six regions.

Figure 20:
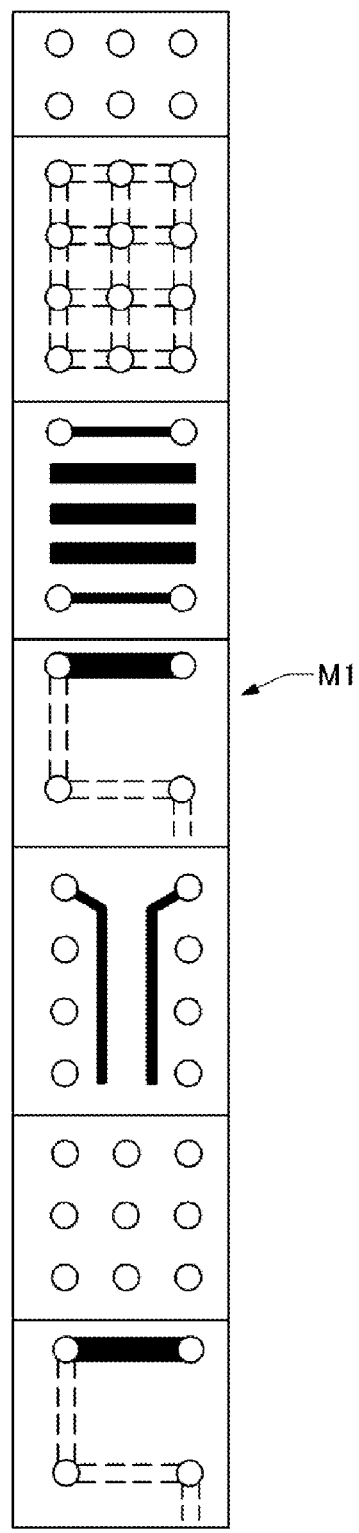
FIG. 20 is a view showing examples of the test coupon information (information data M1).

Information data M1 is test coupon information such as a circuit for a quality conformance test or the like. There may be a case where a defect is present in the inside of the printed circuit board PWA which cannot be recognized in external appearance. Accordingly, test coupon information (information data M1) formed adjacent to the circuit pattern PA is sampled, is broken and is subjected to an inspection or the like. As shown in FIG. 20, the test coupon information is formed in the same manner as the circuit pattern PA with respect to a pattern width distance, a hole diameter, a pad diameter, a clearance diameter of an inner layer, and the arrangement of conductive layers. Further, a through hole or a via which is formed as test coupon information is formed such that a conductive state or a connection state can be measured in a daisy pattern where through holes or vias are connected in series, or comb-shaped pattern which forms test coupon information is provided for measuring insulation resistance.

The test pattern is electronically formed by the DMD 47 and hence, test coupon information can be arbitrarily changed, and the magnification of the test coupon information can be also changed in conformity with the exposure magnification of the circuit pattern PA. Since the circuit pattern PA and the test coupon information can be exposed on the printed circuit board PWA with the same size, the highly reliable quality inspection can be performed.

In step S124, in the midst of movement of the spatial light modulation unit 340 in the Y-axis direction, the DMD 47 is driven through the DMD drive circuit 393. Accordingly, in the midst of the movement (scanning) of the spatial light modulation unit 340, information data M2 where the exposure magnification is corrected is exposed on the printed circuit board PWA. As shown in FIG. 19, information data M2 is formed adjacent to the circuit pattern PA in six exposure regions (AA1 to AA6).

Information data M2 is character information or graphic information for controlling a circuit pattern region. Since the DMD 47 can electronically change information, information data M2 is formed in such a manner as "a-1-11", "a-1-12" for every circuit pattern PA of the plurality of circuit patterns PA on one printed circuit board PWA. When necessary, the magnification of information data M2 which is character information can be also changed in conformity with the exposure magnification of the circuit pattern PA.

The sequence of step S123 and step S124 may be reversed or only one of these steps may also be used. Further, positions where information data M1 and information data M2 are formed can be suitably changed dependent on a size, the arrangement or the like of a circuit pattern PA.

In step S125, after the exposure is finished, the information data exposure control section 391 outputs an instruction to cancel the stop of the substrate stage 360 (or the stage drive part 365) to the circuit pattern exposure control section 392. Accordingly, the substrate stage 360 can move.

In the above explanation, after the exposure of a circuit pattern PA is finished (steps S111 to S114), the exposure of information data M1, M2 is started. This sequence may be reversed such that the exposure of the circuit pattern PA is started after the exposure of the information data M1, M2 (steps S121 to S125) is finished. Further, it may be possible that immediately after the exposure of one circuit pattern PA is finished, information data M1, M2 is exposed adjacent to one circuit pattern PA and, thereafter, when the exposure of the information data M1, M2 is finished, the exposure of another circuit pattern PA is performed again.

Further, in the above explanation, the alignment marks AM (AM1, AM3, AM10, AM12) are formed at four corners of the printed circuit board PWA. Then, the magnification of information data M2 is changed in conformity with the exposure magnification of the circuit pattern PA based on four alignment marks AM. By forming the larger number of alignment marks AM around the circuit pattern PA which constitutes an exposure region, the magnification of information data M2 can be changed at a finer rate.

Figure 21:
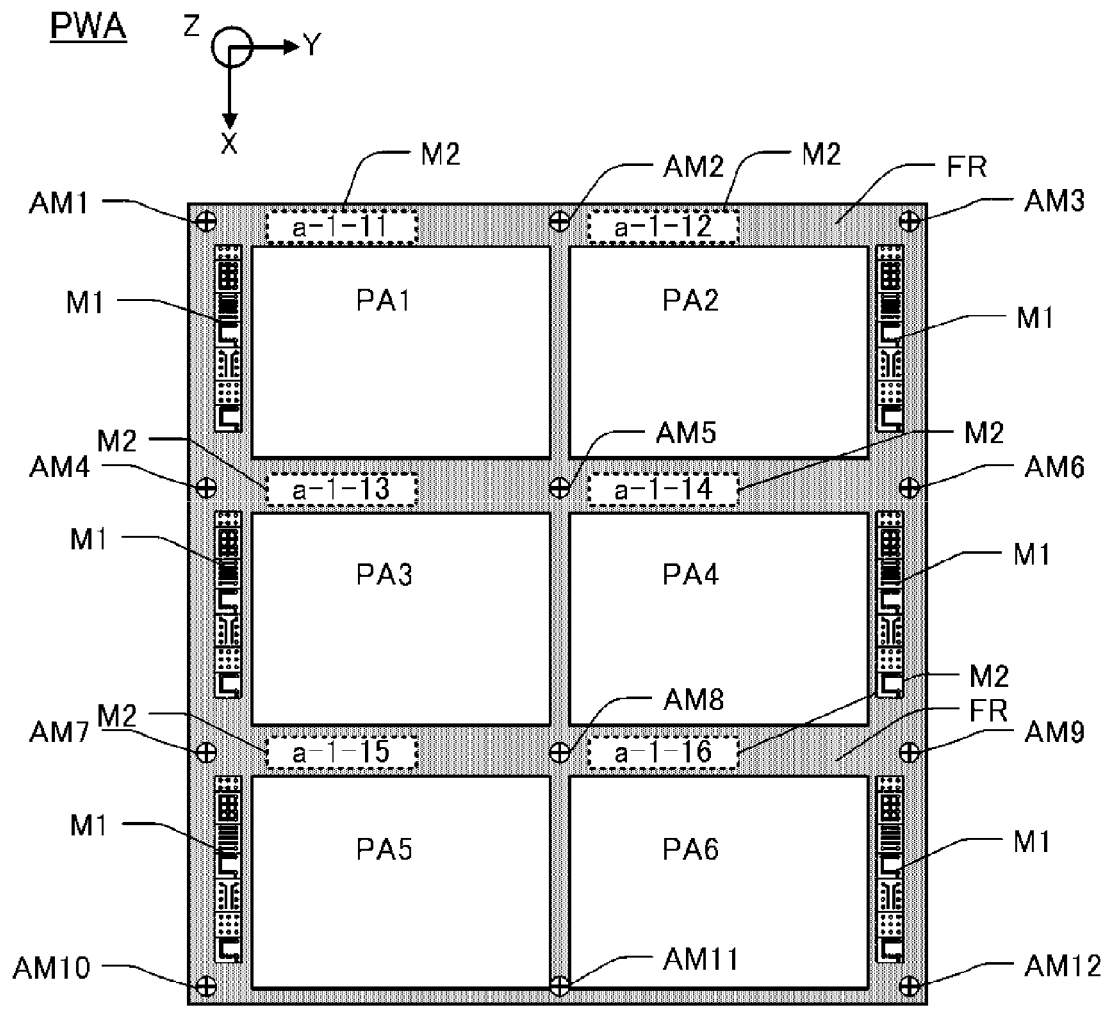
FIG. 21 is a plan view showing a printed circuit board PWA on which four alignment marks AM are formed each circuit pattern PA.

FIG. 21 is a plan view showing the printed circuit board PWA where four alignment marks AM are formed on four corners of the circuit pattern PA, and twelve alignment marks AM (AM1 to AM12) are formed for six circuit patterns PA (PA1 to PA6).

In step S101 explained in conjunction with FIG. 18, the alignment camera 380 images twelve alignment marks AM (AM1 to AM12) on the printed circuit board PWA. Then, in step S102, the alignment control section 398 calculates the expansion and contraction of the circuit pattern PA based on positions of the alignment marks AM imaged by the alignment camera 380 in the X-axis direction and in the Y-axis direction. For example, if the circuit patterns PA1, PA2 are enlarged 1.01 times along both in the X and Y axis directions, the exposure magnification is set to 1.01.

In a case that the spatial light modulation unit 340 exposes the information data M2 other than the circuit pattern PA, the exposure magnification may be varied by calculating the expansion and contraction of the information data M2 only in the Y-axis direction using the alignment marks Am1 and AM2.

In a case that the spatial light modulation unit 340 exposes the information data M1, the exposure magnification may be varied by calculating the expansion and contraction of the information data M1 only in X-axis direction using the alignment marks AM1 and AM4. Alternatively, the expansion and contraction in the X and Y directions may be corrected also using the components of the alignment marks AM4 and AM8 or the alignment marks AM6 and AM7 in the slant direction. Further, the auxiliary alignment marks may be arranged between each of the alignment marks AM1-AM12 so as to correct the drawing pattern data in fine regions in accordance with the expansion and contraction of the substrate.

Although the third embodiment of the present invention have been explained in detail heretofore, as can be clearly understood by those who are skilled in the art, the invention can be carried out by adding various changes or modifications to the embodiments within the technical scope of the invention. For example, the mercury lamp 41 of the spatial light modulation unit 340 and the mercury lamp 21 for the projection exposure unit 370 are the same light source including ultraviolet rays. Accordingly, omitting the mercury lamp 41, light including ultra violetrays may be lead to the spatial light modulation unit 340 from the mercury lamp 21 without the mercury lamp 41.

Next, an exposure device according to the fourth embodiment of the present invention is explained hereinafter.

<Constitution of Exposure Device 400 of Fourth Embodiment>

Figure 22:
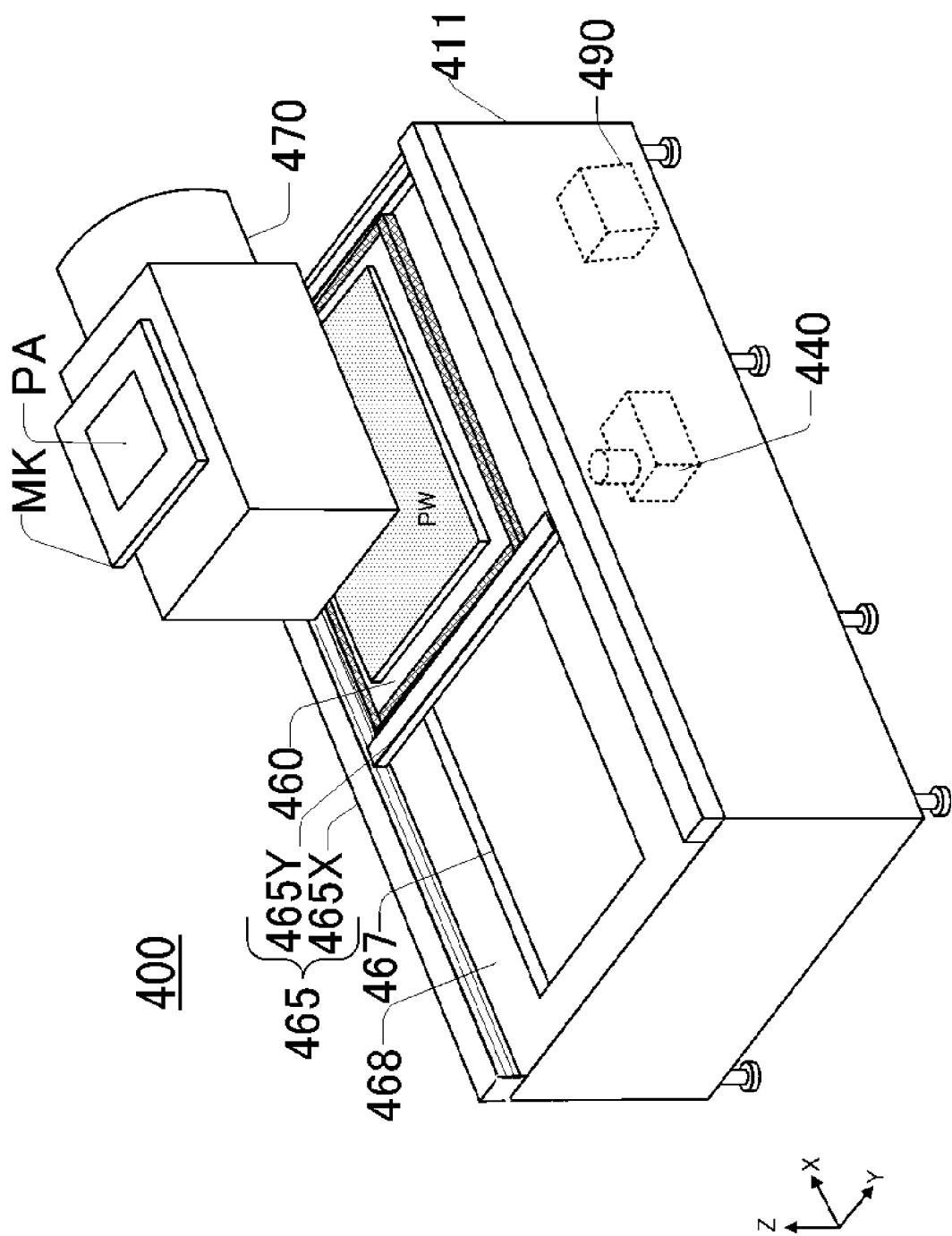
FIG. 22 is a perspective view showing an exposure device 400 according to the fourth embodiment of the present invention.

FIG. 22 is a perspective view of the exposure device 400. In FIG. 22, a light source is not shown, and the exposure device 400 is depicted such that the long-axis direction of a housing 411 is taken along the X-axis direction, and the short-axis direction of the housing 411 is taken along the Y-axis direction. Further, for facilitating the understanding of the arrangement of a projection exposure unit 470, support struts and the like for supporting the projection exposure unit 470 are not shown in the drawings.

The exposure device 400 is constituted of the housing 411, a spatial light modulation unit 440, a substrate stage 460 and the projection exposure unit 470. The housing 411 supports the substrate stage 460 and the projection exposure unit 470, and contains an optical light modulation unit 440 and a control part 490 arranged therein. The housing 411 is supported on vibration-proof mounts so that vibration is not applied to the printed circuit board PW, the projection exposure unit 470 and others mounted on the substrate stage 460. The circuit pattern and the information data are formed on the both surfaces (top and bottom surfaces). The printed circuit board PW is a laminated board of, e.g., a glass epoxy layer and a cooper thin film.

The spatial light modulation unit 440 arranged in the housing 411 can expose character information or graphic information used for substrate control for controlling a printed circuit board PW on a peripheral region of the printed circuit board PW. Further, there may be a case where the printed circuit board PW is cut and divided into plural divided substrates as products. Accordingly, the spatial light modulation unit 440 may also expose character information or graphic information used for substrate control for controlling the respective divided substrates after division. Further, the spatial light modulation unit 440 may also expose test coupon information including a test coupon such as a quality conformance test or a test pattern.

The substrate stage 460 is mounted on an upper portion of the housing 411. The substrate stage 460 has a rectangular surface in conformity with the rectangular printed circuit board PW. The substrate 460 includes a transparent plate 461 through which light including ultraviolet rays passes and an outer frame 462 (see FIG. 23A).

The substrate stage 460 includes a stage drive part 465 (an X-axis drive part 465$x$, a Y-axis drive part 465Y) constituted of, for example, ball screws, slide guides, screw driving motors and the like. The Y-axis drive part 465Y is sectionally fixed at the outer frame 462. The X-axis drive part 465$x$ is sectionally fixed at the Y-axis drive part 465Y. The X-axis drive part 465$x$ moves the Y-axis drive part 465Y in the Y-axis direction. The X-axis drive part 465$x$ moves the Y-axis drive part 465Y in the X-axis direction. Accordingly, the substrate stage 460 moves in the X-axis and Y-axis directions. Further, the exposure device 400 includes a length measuring device which measures a position in the X-axis direction or in the Y-axis direction to the substrate stage 460 from a reference position. For example, an encoder provided at the Y-axis drive part 465Y measures the position of the substrate stage 460.

A top plate 468 is placed on the upper surface of the housing 411. The above-described stage drive part 465 (465X, 465Y) is provided at the top plate 468. The top plate 468 has an opening 467 at the center thereof. The opening 467 should not have to be covered but may be covered with a glass plate or a synthetic silica plate. In the present embodiment, the case of the opening 467 being not covered anything will be described. The spatial light modulation unit 440 is provided below the opening 467.

The projection exposure unit 470 is arranged above the housing 411. The projection exposure unit 470 is constituted of a plurality of lenses, a plurality of mirrors or the like. The projection exposure unit 470 is supported and fixed by the housing 411 with the support struts not shown in the drawing. A photomask MK on which a circuit pattern PA is drawn is arranged on a side opposite to the printed circuit board PW with the projection exposure unit 470 sandwiched therebetween.

The projection exposure unit 470 performs exposure of a circuit pattern PA on the photomask MK irradiated with light including ultraviolet rays on the printed circuit board PWA. In this embodiment, a catadioptric projection exposure unit is used. However, a refraction-type projection exposure unit which is constituted of only a plurality of lenses may be used or a reflection-type projection exposure unit may also be used.

Figure 23A:
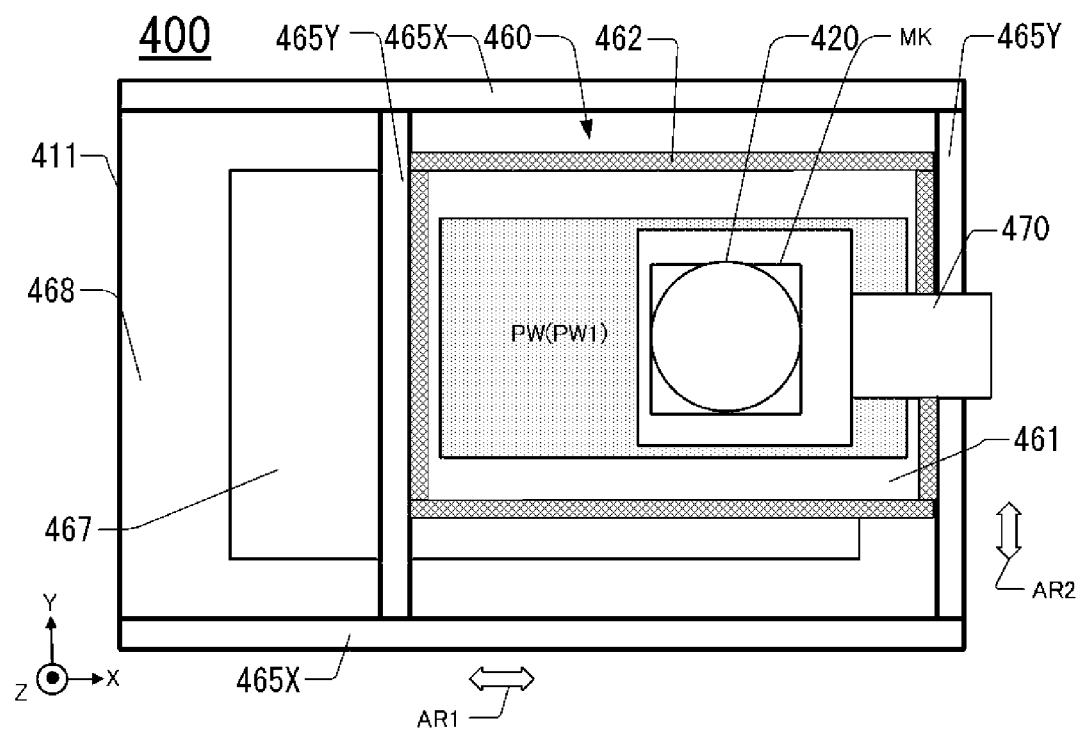
FIG. 23A is a plan view of the exposure device 400 as viewed from above.
Figure 23B:
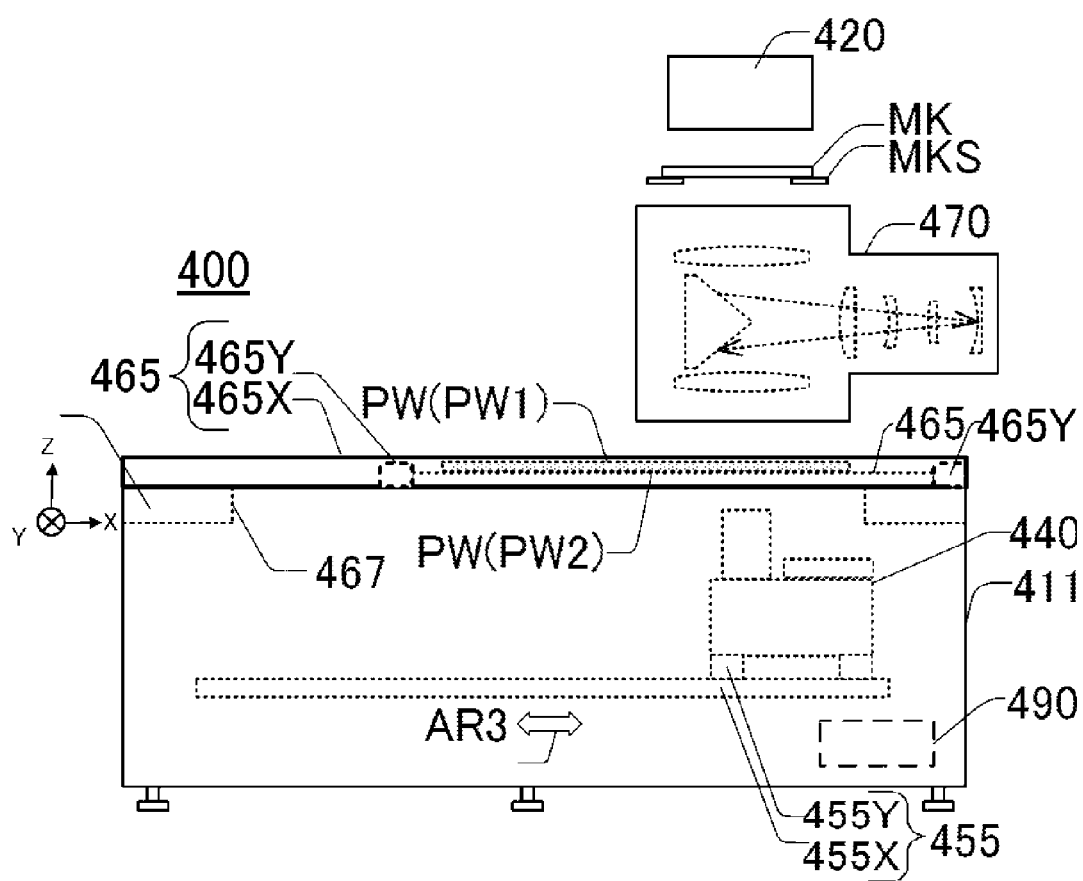
FIG. 23B is a side view of the exposure device 400 as viewed from a side.

FIG. 23A is a plan view of the exposure device 400 including the light source as viewed from the above. FIG. 23B is a side view of the exposure device 400 as view from the side. As shown in FIG. 23B, the photomask MK mounted on a mask stage MKS is arranged above the projection exposure unit 470 (+Z-axis side). A light source 420 is arranged above the photomask MK.

The printed circuit board PW is conveyed from an upper side in FIG. 23A, for example, by a conveying device not shown in the drawing. The printed circuit board PW is placed on and sucked to the substrate stage 460 in a state where a reference side of the printed circuit board PW is aligned with a predetermined position of the substrate stage 460. One side of the rectangular printed circuit board PW is substantially parallel to the X-axis direction, and other side of the printed circuit board PW is substantially parallel to the Y-axis direction. The substrate stage 460 on which the printed circuit board PW is mounted is moved, as shown by the arrow AR2, from the end of the top plate 468 (−Y-axis side) to the other end (+Y-axis side) thereof by the Y-axis drive part 465Y. Further, the substrate stage 460 is moved, as shown by the arrow AR1, from an end on a left side (−X-axis side) to an end on a right side (+X-axis side) of the top plate 468 of the housing 411 by the X-axis drive part 465*x*. By allowing the substrate stage 460 to move in the X-axis direction and in the Y-axis direction, an arbitrary exposure region of the printed circuit board PW is brought into an area below the projection exposure unit 470.

There is the opening 467 in the region where the substrate stage 460 is moved. Accordingly, there is a region that the substrate stage 460 is lifted up and moved in the air. Therefore, the transparent board 461 and the outer frame 462 are made of material having high rigidity. Further, the transparent plate 461 is supported by the outer frame 462 so as not to warp. The Y-axis drive part 465Y is also designed so as to have the high rigidity.

The spatial light modulation unit 440 arranged inside the housing 411 is also moved in the X-axis direction and Y-axis direction by a spatial light modulation unit drive device 455. The spatial light modulation unit drive device 455 includes a pair of an X-axis drive device 455X and a Y-axis drive device 455Y. The Y-axis drive device 455Y moves the spatial light modulation unit 440 in the Y-axis direction and is mounted on the X-axis drive device 455X. The X-axis drive device 455X moves the Y-axis drive device 455Y, so that the spatial light modulation unit 440 is moved in the X-axis direction as shown by the arrow AR3. Allowing the spatial light modulation unit 440 is moved in the X-axis direction and in the Y-axis direction, the arbitrary region of the lower surface PW2 of the printed circuit board PW is moved above the spatial light modulation unit 440.

The opening 467 is located above the spatial light modulation unit 440, and the transparent plate 461 of the substrate stage 460 is located above the opening 467. Therefore, light including ultraviolet rays from the spatial light modulation unit 440 reaches the lower surface PW2 of the printed circuit board PW.

<Configuration of Spatial Light Modulation Unit 440>

Figure 24:
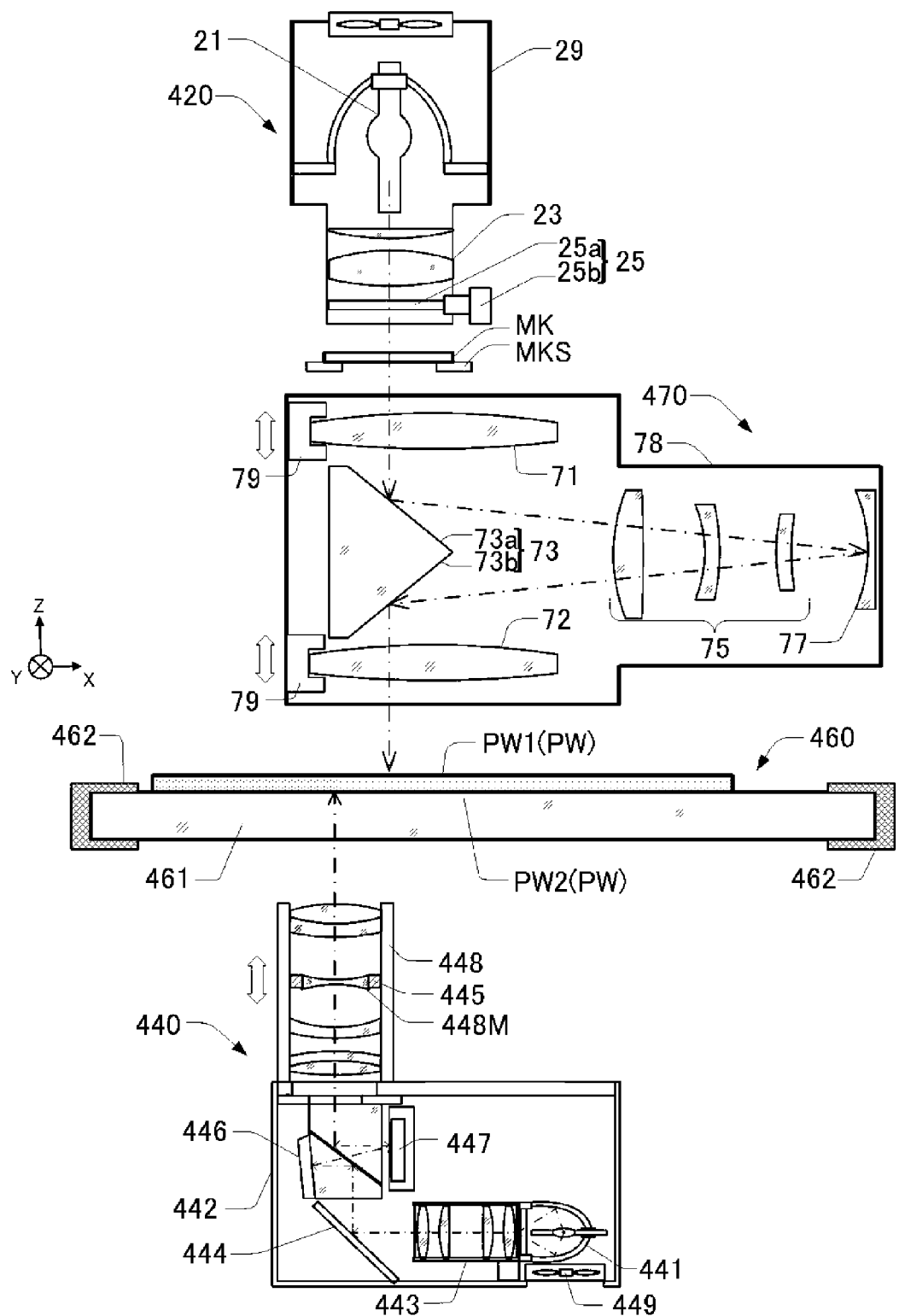
FIG. 24 is an enlarged conceptual view showing a spatial light modulation unit 440 and a projection exposure unit 470.

FIG. 24 is a conceptual view showing the configuration of the substrate stage 460, the special light modulation unit 440, the light source 420 and the projection exposure unit 470.

The spatial light modulation unit 440 is constituted of a mercury lamp 441, a first optical system 443, a cold mirror 444, a mirror block 446, a DMD (digital micro mirror device) 447 and a second optical system 448. The mercury lamp 441 irradiates a light including a g-line ray (365 nm), an h-line ray (405 nm) and an i-line ray (436 nm). The first optical system 443 includes an elliptical mirror and a group of lenses consisting of a plurality of lenses. The cold mirror 444 allows infrared rays to pass therethrough and reflects a light including ultraviolet rays.

The structure is adopted where parts ranging from the mercury lamp 441 to the second optical system 448 is surrounded by a cover 442 such that a light does not leak to the outside of the optical system. An exhaust port is formed in the cover 442, and a fan 449 is arranged in the exhaust port.

The mirror block 446 which is formed by combining a reflection mirror and a half mirror is arranged above (on a substrate PW side of) the cold mirror 444. The DMD 447 is arranged adjacent to the mirror block 446, and the second optical system 448 is arranged above (on a substrate PW side of) the mirror block 446. An optical axis of the second optical system 448 is arranged perpendicular to a lower surface PW2 of the printed circuit board PW. An optical axis of the DMD 447 is arranged substantially perpendicular to the optical axis of the second optical system 448.

The DMD 447 is constituted of approximately one million pieces of movable micro-mirrors. A mirror surface size of each micro-mirror is approximately ten and several μm square, and the micro-mirrors are arranged in a grid array. When the micro-mirror is brought into an "ON" state, a light beam is reflected toward the lower surface PW2 side of the printed circuit board PW. When the micro-mirror is brought into an "OFF" state, the light beam is reflected toward an ultraviolet-ray-absorbing-body side not shown in the drawing. Accordingly, by driving the respective micro-mirrors individually, the DMD 447 can irradiate a light beam which is spatially modulated into test coupon information, character information or graphic information (hereinafter referred to as information data) to the lower surface PW2 of the printed circuit board PW.

The DMD 447 and a photoresist FR surface formed on the lower surface PW2 of the printed circuit board PW are arranged at conjugate positions. Depending on the thickness or the refractive index of the transparent plate 461, the optical path length from the DMD 447 to the lower surface PW2 of the printed circuit board PW is varied. Due to this, when the transparent plate 461 is changed to another one, a light which passes through the second optical system 448 does not form an image on the photoresist FR surface of the printed circuit board PW which is formed of a photosensitive material. Further, when the transparent plate 41 is changed to other kinds or changed in thickness, the spherical aberration is largely changed. Then, a compensation lens 448M is driven by a lens drive part 445, so that the position of the DMD 47 and the position of the photoresist FR surface of the printed circuit board PW can be brought into a conjugate relationship to compensate the spherical aberration. Even though the compensation lens 448M is moved, it does not affect a coma aberration and others.

It should be noted that the compensation lens 448M is designed in the space without a cover over the opening 467 of the top plate 468. In a case that the cover made of, i.e., glass, a synthetic silica is arranged at the opening 467, the compensate lens 448M is designed considering a refraction index, thickness and the like of the material of the cover.

A light beam irradiated from the mercury lamp 441 is incident on the first optical system 443 so that the light beam is collimated. The light beam irradiated from the first optical system 443 is reflected toward a printed circuit board PW side by the cold mirror 44 and is incident on the mirror block 446. The light beam incident on the mirror block 446 advances toward the DMD 447 and is spatially modulated into information data by the DMD 447. The spatially modulated light beam is incident on the mirror block 446 again, and is irradiated to the photoresist FR surface of the printed circuit board PW through the second optical system 448. The area of information data exposed on the lower surface PW2 is adjusted to the arbitrary magnification.

<Configuration of Light Source 420 and Projection Exposure Unit 470>

Since a light source 420 and a projection exposure unit 470 of the fourth embodiment have the same configuration and operation as the second embodiment, the repetitive explanation will be omitted. The projection exposure unit of the fourth embodiment performs the magnification adjustment of the projection light which has passed through the circuit pattern PA on the photomask MK, and projects the projection light onto a photoresist FR surface of the upper surface PW1 of the printed circuit board PW.

<Configuration of Substrate Stage 460>

The transparent plate 461 of the substrate stage 460 is made of optical glass, synthetic silica, magnesium fluoride, calcium fluoride, or a functional resin such as polycarbonate and acryl. Since the flatness of the transparent plate 461 is important, for example, the transparent plate 461 is processed by a lapping method (double side lapping) that processes both surfaces simultaneously to produce a parallel plate. The thickness of the transparent plate 461 is decided by the components of the strength, transmittance and others. In a case of borosilicate glass to be used, Young's modulus is $8 \times 10^2 N/mm^2$. Assuming the size of the transparent plate 461 be 500 mm in the X-axis direction and 150 mm in the Y-axis direction, and the stress of the printed circuit board PW be 2500 Pascal, maximum deformation of the transparent plate 461 of approximately 7 mm in thickness is 0.8 mm. In consideration of transmittance of light including a g-ray (365 nm), a h-ray (405 nm) and an i-ray (436 nm), the transmittance of the transparent plate 461 is preferably higher than 90%. This is because the transmittance of the transparent plate 461 affects the output of the mercury lamp 441 (see FIG. 3). In a case of borosilicate glass to be used, transmittance of 90% or above requires the thickness of 10 mm or below.

Figure 25A:
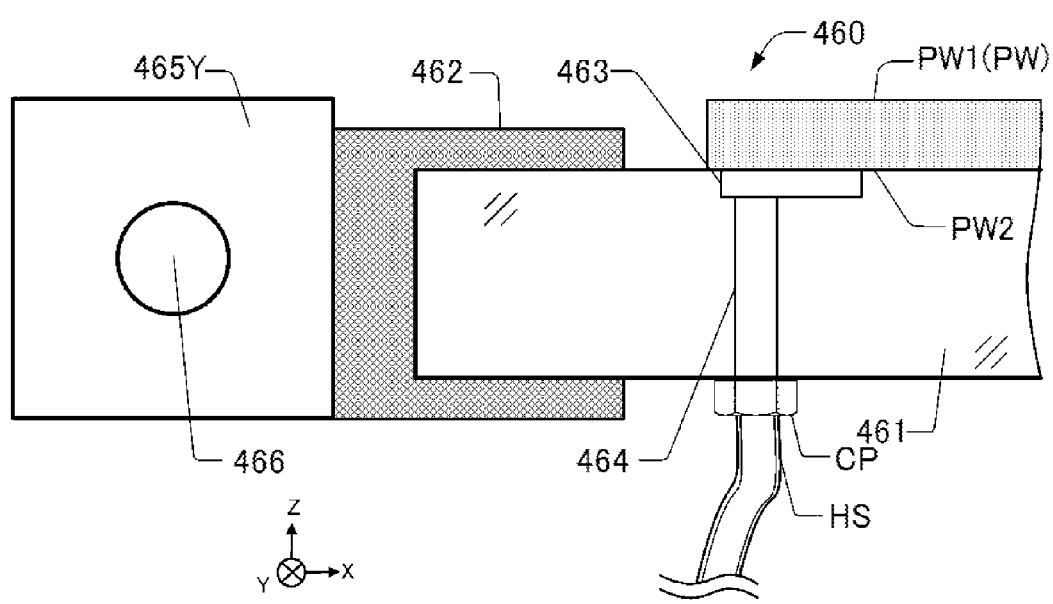
FIG. 25A is an enlarged side view of a transparent plate 461 and an outer frame 462.

As shown in FIG. 25A, the transparent plate 461 has the outer frame 462 arranged at four sides. The outer frame 462 sandwiches the upper and lower surfaces of the transparent plate 461. The center of each side of the outer frame 462 is curved upwards. When the transparent plate 461 has not being applied any gravity, the transparent plate 461 has the expanded shape around the center. When the transparent plate 461 with the outer frame 462 is placed horizontally, the entire surface of the transparent plate 461 becomes horizontal due to the gravity, which makes the maximum deformation 0.1 mm or below even though the thickness of the transparent plate 461 is approximately 6 mm. Since the center of each side of the outer frame 462 is formed to be curved upwards, the maximum deformation is made minimum despite the thin transparent plate 461.

The Y-axis drive part 465Y is fixed at a pair of two sides of the outer frame 462. The Y-axis drive part 465Y has a ball screw or the like arranged therein. As the ball screw 466 rotates, the substrate stage 460 can move.

Figure 25B:
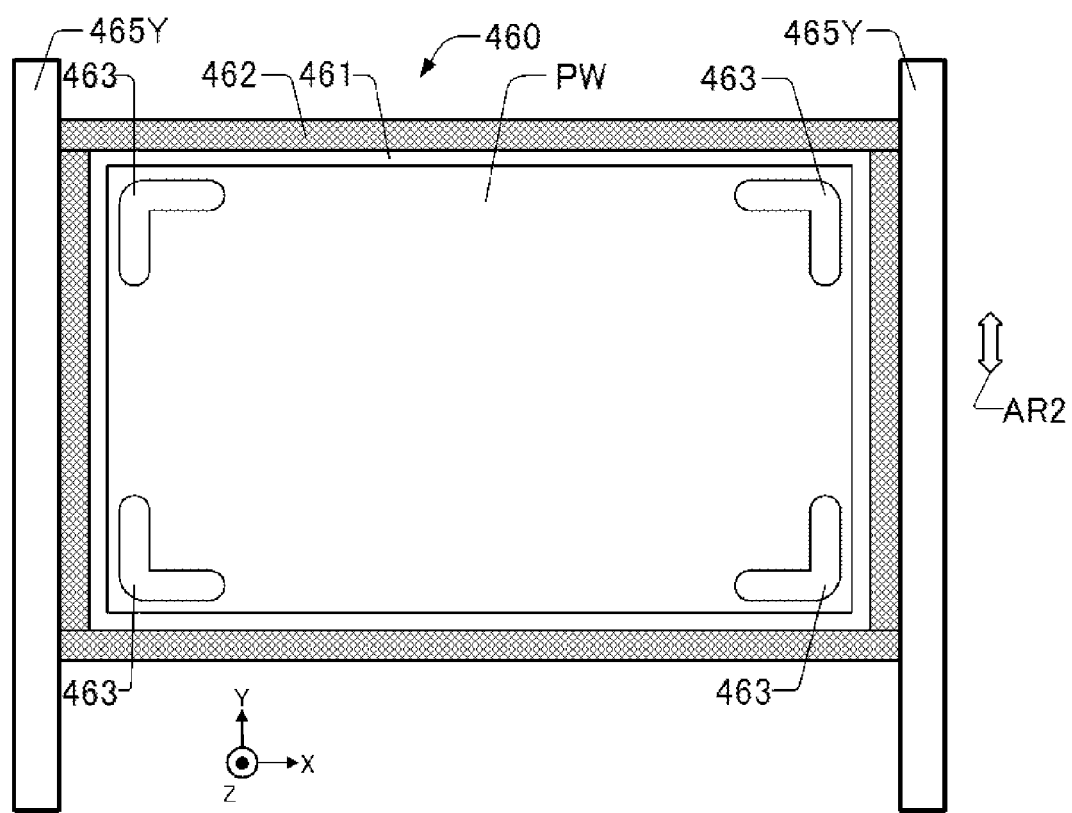
FIG. 25B is an enlarged plan view of the transparent plate 461 and the outer frame 462.

Since the transparent plate 461 needs to fix the printed circuit board PW, as shown in FIG. 25B, there formed substrate adhesion grooves near the four corners of the transparent plate 461. The substrate adhesion grooves are formed in an L-shaped adhesion groove extending the X-axis direction and the Y-axis direction but its shape is not limited to this shape. For example, the substrate adhesion groove 462 may be a shape of simple circle. As shown in FIG. 25A, the substrate adhesion groove 463 is connected to a through hole 464 to be connected to a hose HS attached to a cap CP. The hose HS is connected to a vacuum device not shown.

The substrate adhesion grooves are preferably formed near the four corners of the transparent plate 461 or near the sides of the transparent plate 461. This is because it would not hinder the light from the spatial light modulation unit 440. In other words, the spatial light modulation unit 440 irradiates the modulated light to the lower surface PW2 of the printed circuit board PW passing through the center region of the transparent plate 461. If the substrate adhesion grooves 463 would exist at the center region, the modulated light would be refracted and not be irradiated at the proper position.

The printed circuit board PW has various sizes depending on its application. Because of this, the position of the substrate adhesion grooves 463 is not uniform. Therefore, it is preferable to prepare plural transparent plates 461 having the substrate adhesion grooves 463 formed at the different positions according to the size of the printed circuit board PW.

<Configuration of Control Part 490>

Figure 26:
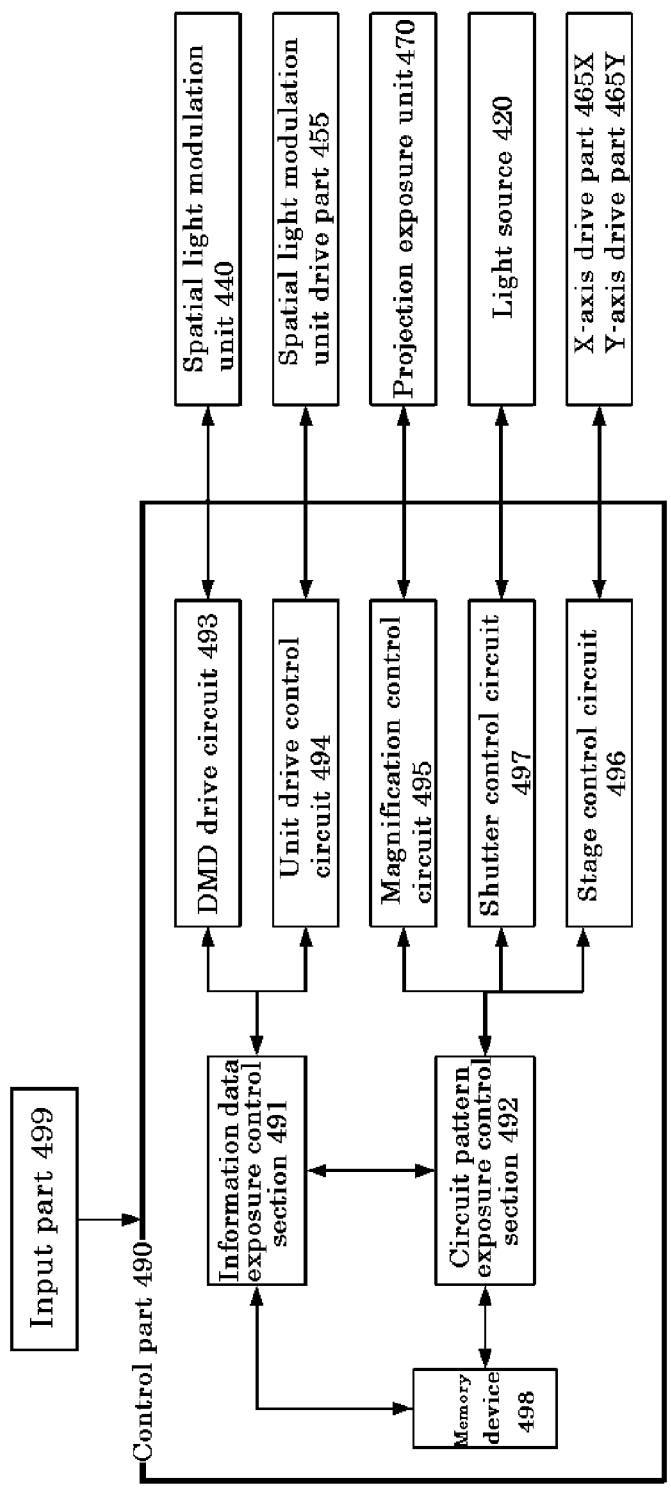
FIG. 26 is a block diagram showing the constitution of the exposure device 400 and the control part 90.

FIG. 26 is a block diagram showing the configuration of the control part 490 of the exposure device 400. The exposure device 400 is controlled by the control part 490. The control part 490 comprises an information data control unit 491 for controlling the exposure of the information data and a circuit pattern exposure control unit 492 for controlling the exposure. The information data exposure control unit 491 and the circuit patter exposure control unit 492 are connected to a memory device 498.

The memory device 498 stores exposure data for a printed circuit board PW, data of exposure region for a circuit pattern, positional information of information data, a photoresist sensitivity of a printed circuit board PW, a moving speed of a substrate stage 460 and other data. Data to be stored in the memory device 498 is entered by an external input unit 499 (for example, through manufacturer LAN and by hand).

The information data exposure control unit 491 is connected to a DMD drive circuit 493 and a drive control circuit 494 for the spatial light modulation unit. The information data exposure control unit 491 converts exposure data of identification mark stored in the memory device 498 into DMD drive data. The DMD drive circuit 493 is connected to the DMD 447 and makes approximately one hundred millionmicro mirrors on and off. The drive control circuit 494 of the spatial light modulation unit is connected to the X-axis drive device 455X and the Y-axis drive device 455Y of the spatial light modulation unit drive device 455 and moves the spatial light modulation unit 440 in the X-axis direction and the Y-axis direction. The information data exposure control unit 491 transmits the moving speed to the drive control circuit 494 of the spatial light modulation unit according to the condition of photoresist sensitivity of a printed circuit board PW or others stored in the memory device 498. In other words, the information data exposure control unit 491 controls the appropriate units to expose the information data on the plural regions of the printed circuit board PW.

The circuit pattern exposure control unit 492 is connected to a magnification control circuit 495, a stage control circuit 496 and a shutter control circuit 497. The magnification control circuit 495 is connected to the magnification adjusting part 79 of the projection exposure unit 470 and moves the incident-side convex lens 71 and the irradiation-side convex lens 72. The stage control circuit 496 is connected to the stage drive part 465 of the substrate stage 460 and moves the substrate stage 460 in the X-axis direction and the Y-axis direction. The shutter control circuit 497 is connected to the shutter part 25 of the light source 420 and opens and closes the shutter part 25. In other words, the circuit pattern exposure control unit 492 controls the appropriate units to expose the circuit pattern PA of the photomask MK with an appropriate magnification on the plural regions of the printed circuit board PW (see FIG. 22).

<Operation of Exposure Device 400>

Figure 27A:
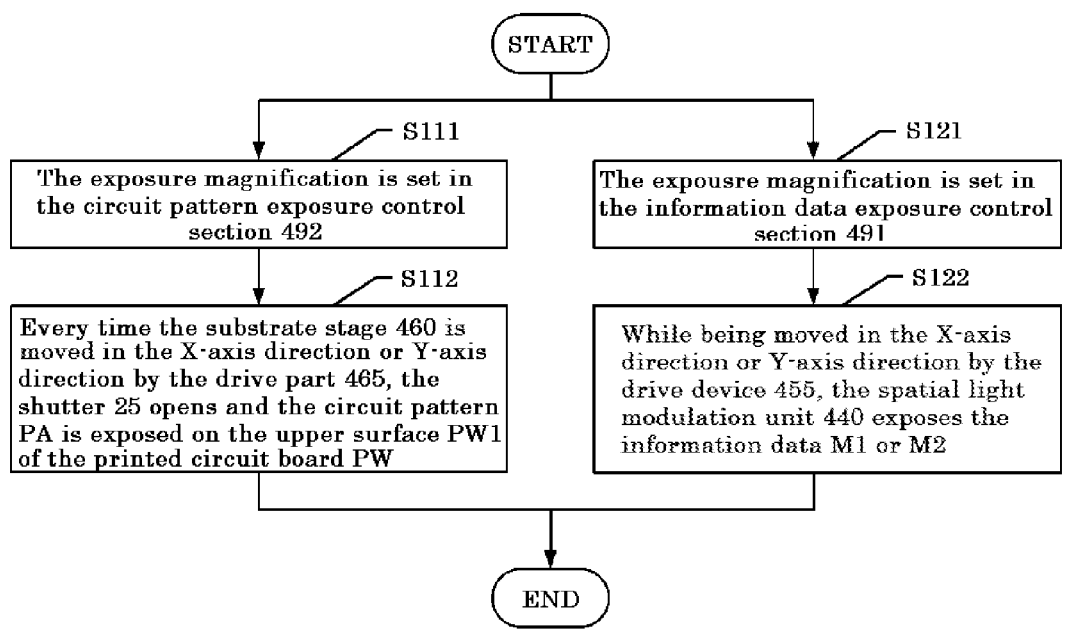
FIG. 27A is a flowchart of exposure performed by the exposure device 400.
Figure 27B:
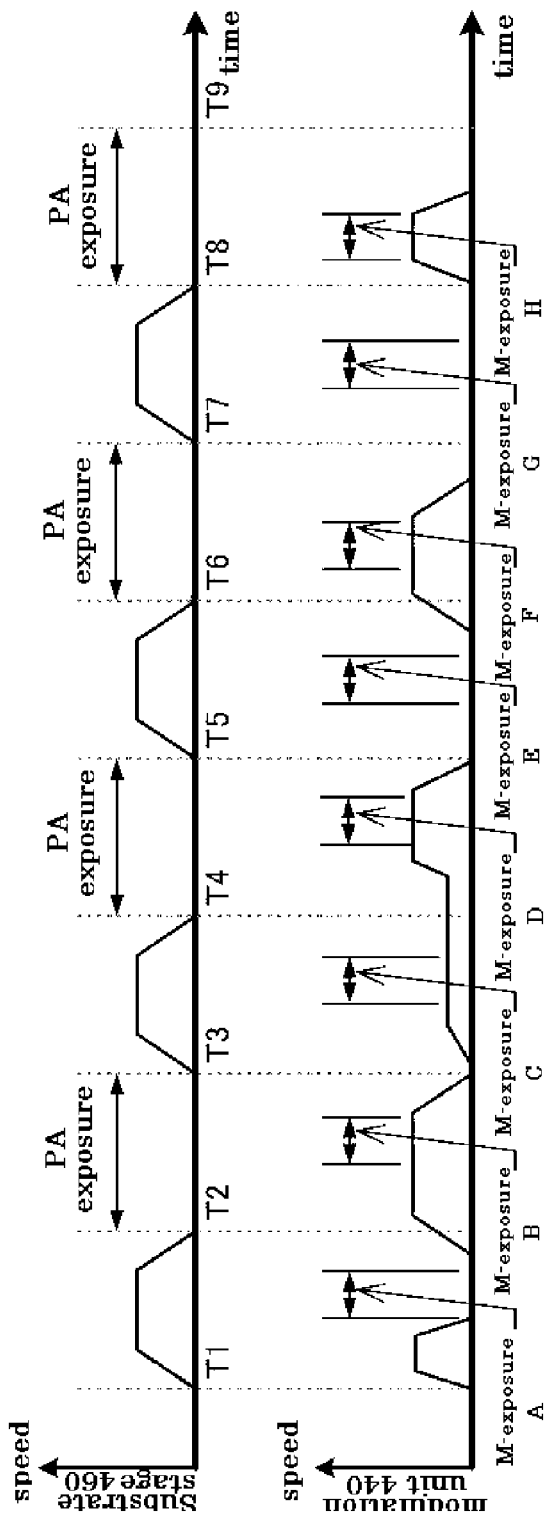
FIG. 27B is a view showing an exposure timing of the spatial light modulation unit 440 and an exposure timing of the projection exposure unit 470.
Figure 28A:
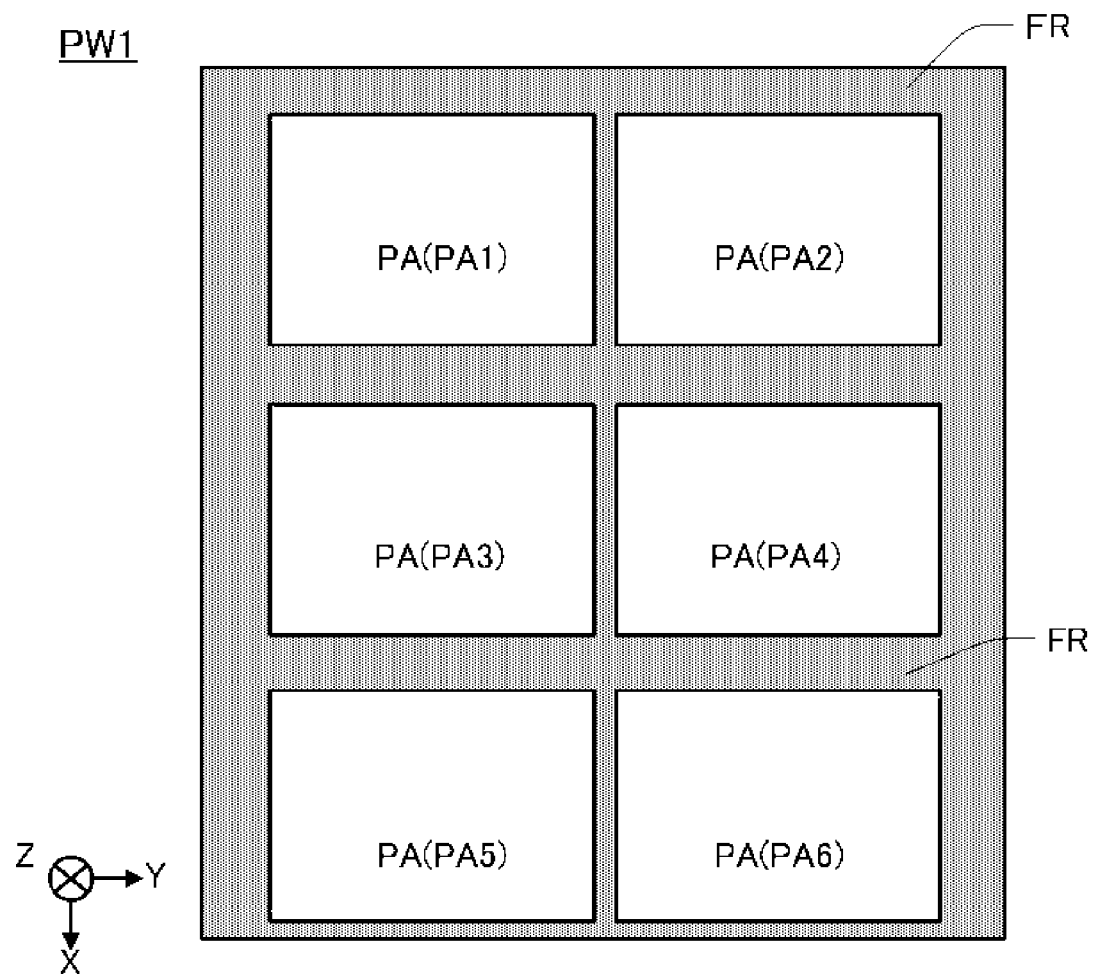
FIG. 28A is a plan view showing an exposed upper surface PW1 of a printed circuit board PW.
Figure 28B:
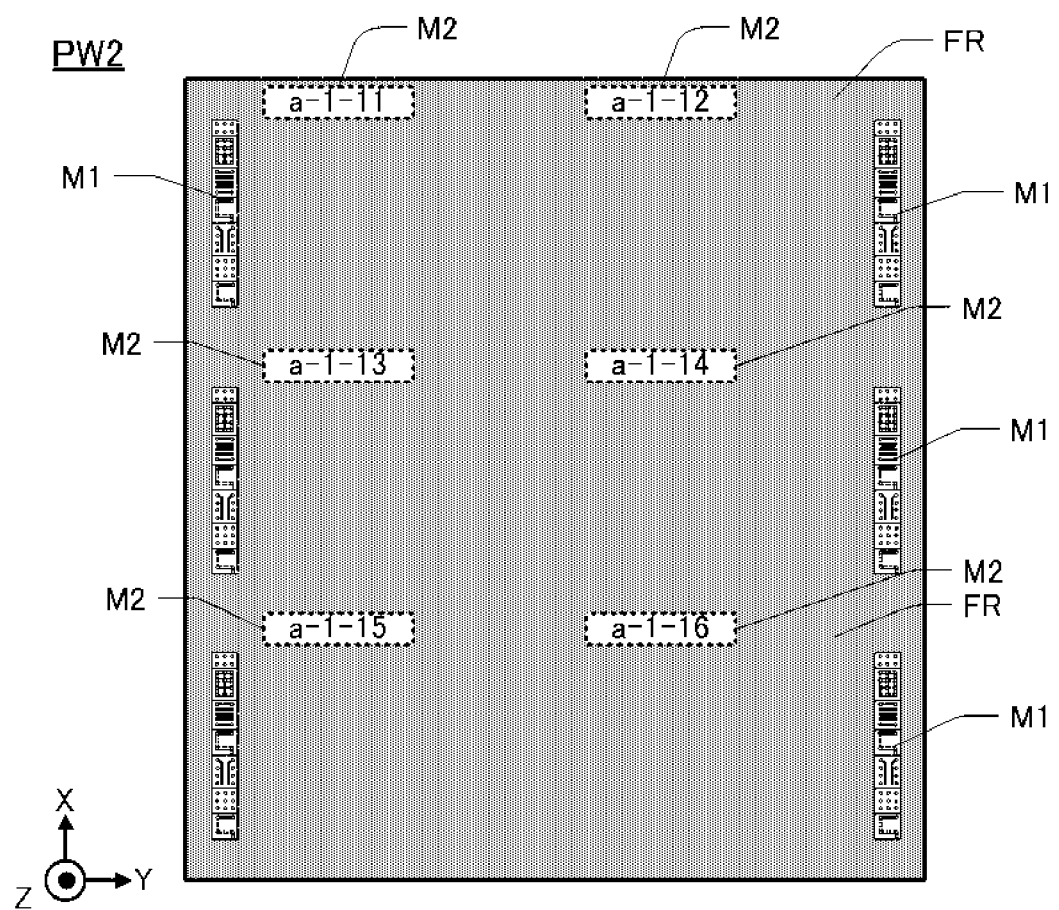
FIG. 28B is a plan view showing an exposed lower surface PW2 of the printed circuit board PW.

The operation of the exposure device 400 will be described. FIG. 27A is a flowchart of exposure of the exposure device 400. FIG. 27B is an exposure timing chart of the circuit pattern PA by the projection exposure unit 470 and an exposure timing chart of information data M (M1, M2) by the spatial light modulation unit 440. FIG. 28A is an example of a circuit pattern PA exposed on the upper surface PW1 of the printed circuit board PW. FIG. 28B is an example of information data M1, M2 exposed on the lower surface PW2 of the printed circuit board PW. It should be noted that the photoresist FR which is a photosensitive material is formed on the upper surface PW1 and the lower surface PW2 of the printed circuit board PW.

First, the printed circuit board PW is conveyed to the substrate stage 460 by the conveying device not shown. The printed circuit board PW is aligned with an alignment camera not shown. Then, the exposure magnification is obtained.

First, exposure by the projection exposure unit 470 will be explained.

In a step S111, the exposure magnification stored in the memory device 498 is set to the circuit pattern exposure control unit 492. The circuit pattern exposure control unit 492 moves the incident-side convex lens 71 and the irradiation-side convex lens 72 to the locations according to the exposure magnification by the magnification control circuit 17

In a step S112, the circuit pattern exposure control unit moves the substrate stage 460 to a predetermined position and then stop it. Thereafter, the shutter control circuit 498 opens the shutter part 25 and closes after the predetermined exposure amount is exposed. The circuit patter exposure control unit 492 moves again the substrate stage 460 at the predetermined position and closes the shutter part. By repeating such operations, as shown in FIG. 28A, the circuit pattern PA (PA1-PA6) whose exposure magnification at the six region is compensated is exposed on the upper surface PW1 of the printed circuit board PW.

Next, exposure by the spatial light modulation unit 440 will be explained.

In a step 121, the exposure magnification stored in the memory device 498 is set to the information data exposure control unit 491. The information data exposure control unit 491 computes which micromirrors are to be tilted according to the exposure magnification.

In a step S122, the spatial light modulation unit drive device 455 moves the spatial light modulation unit 440 parallel to the edge of the printed circuit board PW in the X-axis direction or the Y-axis direction. The DMD 447 of the spatial light modulation unit 440 is driven by the DMD drive circuit 493 while the spatial light modulation unit 440 is moved in the X-axis direction by the X-axis drive device 455X. Accordingly, the information data M1 with the corrected exposure magnification is exposed on the printed circuit board PW while the spatial light modulation unit is moving (scanning). Further, The DMD 447 is driven by the DMD drive circuit 493 while the spatial light modulation unit 440 is moved in the Y-axis direction by the Y-axis drive device 455Y. Accordingly, the information data M2 with the corrected exposure magnification is exposed while the spatial light modulation unit 440 is moving (scanning). By repeating such operations, as shown in FIG. 28B, the information data M1 and the information data M2 are exposed on the plural regions of the lower surface PW2 of the printed circuit board PW.

The information data M1 is test coupon information such as a circuit for quality conformance test. There may be a case where a defect is present in the inside of the printed circuit board PWA which cannot be recognized in external appearance. Accordingly, test coupon information (information data M1) formed adjacent to the circuit pattern PA is sampled, is broken and is subjected to an inspection or the like.

The information data M2 is character information or graphic information for controlling the circuit pattern region. Since the DMD 447 changes the information electronically, the information data M2 is formed like "a-1-11", "a-1-12" for every plural circuit patterns PA of one printed circuit board PW. If necessary, the magnification of the information data M2 that is character information can be changed with respect to the exposure magnification for the circuit pattern PA.

The step S112 and the step S122 are operated simultaneously. Therefore, the throughput is improved. For example, the exposure optical unit 480 exposes the circuit pattern PA while the substrate stage 460 is stopped. The spatial light modulation unit 440 may expose the information data M while the substrate stage 460 is stopped. Further, the projection exposure unit 470 does not expose the circuit pattern PA while the substrate stage 460 is moving but the spatial light modulation unit 440 may expose the information data M while the substrate stage 460 is moving.

FIG. 27B shows in the upper row, timing that the projection exposure unit 470 exposes the circuit pattern PA. The vertical axis shows a moving speed and horizontal axis shows time. Further, the term denoting as "PA-exposure" is the term that the circuit pattern PA is exposed. FIG. 27B shows in the lower row, timing that the spatial light modulation unit 440 exposes the information data M. The vertical axis shows a moving speed of the spatial light modulation unit 440 by the spatial light modulation unit drive device 455 and the horizontal axis shows time. Further, the term denoting as "M-exposure" is the term that the information data M (M1 or M2) is exposed.

For example, in the lower row of FIG. 27B, the terms denoting as M-exposure B, M-exposure D, M-exposure F and M-exposure H show the spatial light modulation unit 440 exposes the information data M while the substrate stage 40 is moving. During the terms of M-exposure A, M-exposure E and M-exposure G, the denoting as M-exposure A, M-exposure E and M-exposure G shows the spatial light modulation unit 440 exposes the information data M while the substrate stage 460 is moving. During the terms of M-exposure A, M-exposure E and M-exposure G, the spatial light modulation unit drive device 455 stops the spatial light modulation unit 440. While the substrate stage 460 is moving at the predetermined speed, the spatial light modulation unit 440 exposes the information data M synchronizing with the movement of the substrate stage 460. The term denoting as M-exposure C is the term the spatial light modulation unit 440 exposes the information data M while the substrate stage 460 is moving and the light optical modulation unit 440 is moving.

In the above-described timing chart of FIG. 27B, while the substrate stage 460 is moving at the predetermined speed or while the substrate stage 460 is stopped, the spatial light modulation unit 440 exposes the information data M. However, the spatial light modulation unit 440 ca exposes the information data M while the substrate stage 460 is accelerating or decelerating even though the control is completed.

<Manufacture of Printed Circuit Board PW by Exposure Device 400>

The exposure device 400 exposes the circuit pattern PA on the upper surface PW1 of the printed circuit board PW and exposes the information data M on the bottom surface PW2. As shown in FIGS. 28A and 28B, at this point, the information data M is not exposed on the upper surface PW1 of the printed circuit board PW and the circuit patter PA is not exposed on the bottom surface PW2 thereof.

Figure 29:
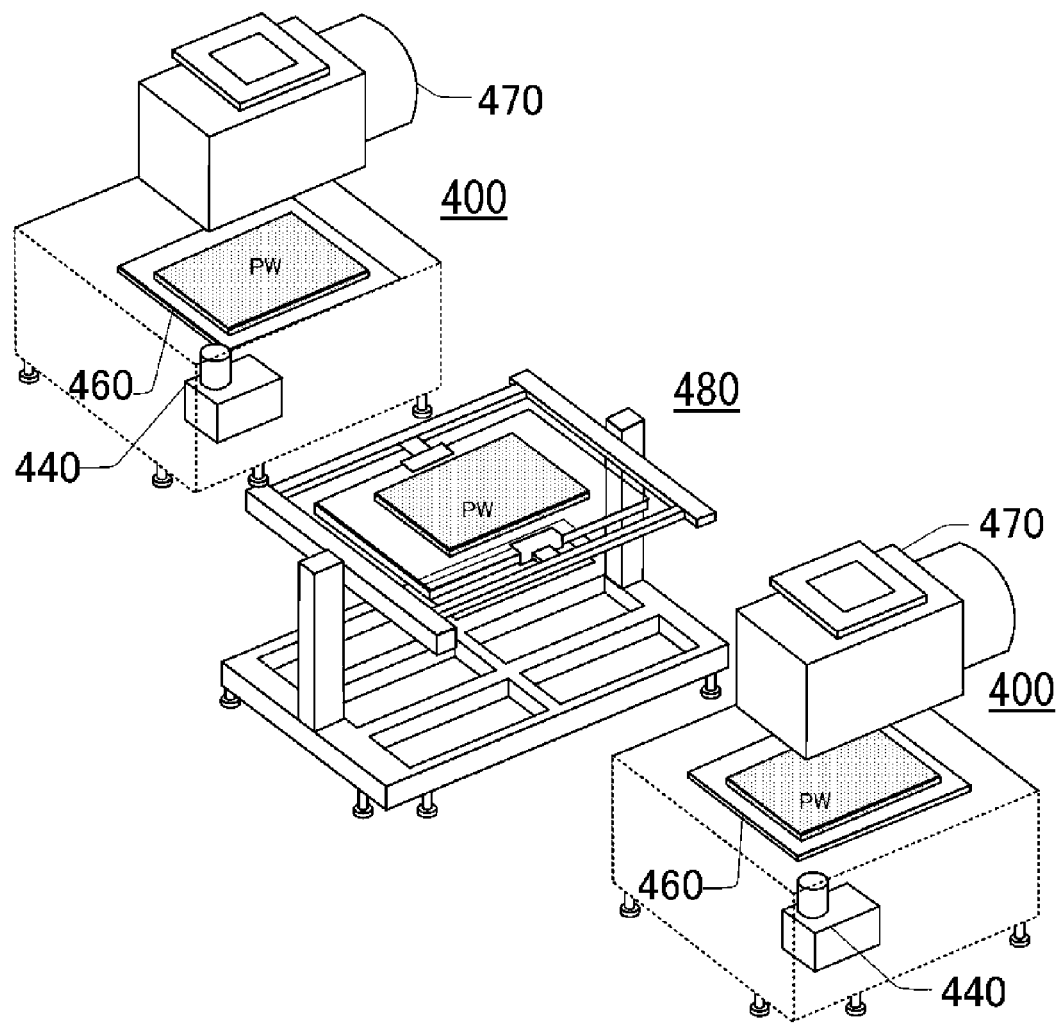
FIG. 29 is a view showing a case that two exposure devices 400 are arranged and the circuit pattern PA and the information data M are exposed on the printed circuit board PW.

FIG. 29 is a view showing a substrate turnover device 480 arranged between two exposure device 400. The first exposure device 400 exposes the circuit pattern PA on the upper surface PW1 of the printed circuit board PW and exposes the information data M on the bottom surface PW2 thereof. Thereafter, the substrate turnover device 480 turnovers the printed circuit board PW. Next, the second exposure device 400 exposes the circuit pattern PA on the upper surface PW1 of the printed circuit board PW and exposes the information data M on the bottom surface PWS thereof. Accordingly, the circuit pattern PA and the information data M are exposes on the both sides of the printed circuit board PW.

It should be noted that one exposure device 400 may be used for exposure on the upper surface PW1 and the bottom surface PW2 of the printed circuit board PW.

The embodiment of the present embodiment has been described above; however, as can be clearly understood by those who are skilled in the art, the invention can be carried out by adding various changes or modifications to the embodiments within the technical scope of the invention. For example, in FIG. 22, the spatial light modulation unit 440 is arranged in the housing 411 and the projection exposure unit 470 is arranged above the substrate stage 460 but the spatial light modulation unit 440 may be arranged above the substrate stage 460 and the projection exposure unit 470 is arranged in the housing 11.

Further, in the above embodiment, the example of the transparent plates 461 having the different thickness or different refractive index for the replacement is explained but in a case that the transparent plate 461 is not replaced or in a case that even the transparent plate 461 is replaced, the thickness and the refractive index is not changed, the moving compensation lens 448M is not necessary.

The invention claimed is:

1. An exposure device comprising:
 a first light source for irradiating first light including ultraviolet rays;
 a projection exposure unit for exposing a predetermined circuit pattern drawn on a photomask on a substrate using said first light;
 a substrate stage for mounting said substrate;
 a housing for mounting and arranging said substrate stage;
 a stage drive part for moving said substrate stage with respect to said projection exposure unit;
 a second light source for irradiating second light including ultraviolet rays, arranged at the position different from said first light source;
 a spatial light modulation unit for exposing electrically formed information data on said substrate using said second light; and
 a spatial light modulation unit driving means provided at either one of said substrate stage and said housing, for moving said spatial light modulation unit in a direction parallel to a moving direction of said substrate stage.

2. An exposure device according to claim 1, wherein while said projection exposure unit is exposing said predetermined circuit pattern, said spatial light modulation unit driving means moves said spatial light modulation unit and said light modulation unit exposes said information data.

3. An exposure device according to claim 1, wherein while said substrate stage is moving, said spatial light modulation unit driving means moves said spatial light modulation unit and said spatial light modulation unit exposes said information data.

4. An exposure device according to claim 1, wherein in a synchronism with the exposure of said projection exposure unit and movement of said substrate stage, said spatial light modulation unit driving means moves said spatial light modulation unit and said spatial optical modulation unit exposes said information data.

5. An exposure device according to claim 2, wherein said spatial light modulation unit driving means moves said spatial light modulation unit at the region not adjacent to the exposure region of said projection exposure unit.

6. An exposure device according to claim 1, wherein said spatial light modulation unit comprises a reaction suppressing means for suppressing a reaction due to acceleration or deceleration generated by the movement with said spatial light modulation unit driving means.

7. An exposure device according to claim 6, wherein said reaction suppressing means comprise a counter mass of a predetermined weight and a memory for pre-storing the moving direction and the acceleration and deceleration speed of said counter mass so as to suppress the reaction with respect to the acceleration and deceleration speed and the moving direction of said spatial light modulation unit.

8. An exposure device according to claim 6, said reaction suppressing means is mounted on said spatial light modulation unit.

9. An exposure device according to claim 1, wherein said spatial light modulation unit driving means moves said spatial light modulation unit in the X-axis direction and in the Y-axis direction by an X-axis drive device and a Y-axis drive device, respectively, for moving said spatial light modulation unit in a direction substantially parallel to a side of said substrate.

10. An exposure device for exposing a predetermined circuit pattern drawn on a photomask on a substrate on which photosensitive material is applied using light including ultraviolet rays; said exposure device comprising:
 a projection exposure unit for exposing said circuit pattern of said photomask with light including ultraviolet rays from a first light source;
 a substrate stage mounting said substrate and movable with respect to said projection exposure unit;
 a stage drive part for moving said substrate stage;
 a spatial light modulation unit for exposing electrically formed information data on said substrate with light including ultraviolet rays from a second light source; and a spatial light modulation unit drive part for moving said spatial light modulation unit in a direction substantially parallel to a side of said substrate;

said first light source and said second light source being mercury discharge lamps;

an amount of a given volume of mercury sealed in a discharge container of said second light source being larger than that of said first light source.

11. An exposure device for exposing a predetermined circuit pattern drawn on a photomask on a substrate on which photosensitive material is applied using light including ultraviolet rays, said exposure device comprising:

a projection exposure unit for exposing said circuit pattern of said photomask with light including ultraviolet rays from a first light source;

a substrate stage mounting said substrate and movable with respect to said projection exposure unit;

a stage drive part for moving said substrate stage;

a spatial light modulation unit for exposing electrically formed information data on said substrate with light including ultraviolet rays from a second light source; and a spatial light modulation unit drive part for moving said spatial light modulation unit in a direction substantially parallel to a side of said substrate;

said projection exposure unit comprising a magnification means for changing magnification of said circuit pattern;

said spatial light modulation unit correcting said information data electrically corresponding to said magnification means.

12. An exposure device according to claim 11, wherein said first light source is served as said second light source.

13. An exposure device according to claim 11, wherein said spatial light modulation unit rewrites said information data every time said circuit pattern is exposed on said substrate.

14. An exposure device according to claim 11, wherein said information data includes at least one of character information, graphic information and test coupon information.

15. An exposure device according to claim 11, wherein a region that said spatial light modulation unit exposes said information data is adjacent to a region that said projection exposure unit exposes the circuit pattern.

16. An exposure device according to claim 11, wherein when said projection exposure unit exposes said circuit pattern, said spatial light modulation unit drive part stops said spatial light modulation unit, and when said spatial light modulation unit exposes said information data, said spatial light modulation unit drive part moves said spatial light modulation unit and said stage drive part stops said substrate stage.

17. An exposure device for exposing a predetermined circuit pattern drawn on a photomask on a substrate on which a photoresist material is applied, with light including ultraviolet rays, said exposure device comprising:

a projection exposure unit for exposing said circuit pattern of said photomask on a first surface of said substrate, with light including ultraviolet rays;

a spatial light modulation unit for exposing electrically formed information data on the first surface and a second surface opposite to said first surface, with light including ultraviolet rays;

a substrate stage for mounting said substrate, movable with respect to said projection exposure unit or said spatial light modulation unit; and a stage drive part for moving said substrate stage;

said substrate stage including a transparent plate made of optical glass, synthetic silica, fluoride magnesium, fluoride calcium, polycarbonate, or acryl;

said transparent plate including an adhesive part for adhering said substrate;

one that is arranged below said substrate stage among said projection exposure unit and said spatial light modulation unit, including a compensation optical system for compensating an optical path length and a spherical aberration;

said exposure device further comprising an optical drive part for moving said compensation optical system in an optical axis depending on the thickness of said transparent plate or a kind of said transparent plate.

18. An exposure device according to claim 17, wherein said information data includes at least one of character information, graphic information and test coupon information.

19. An exposure device according to claim 17, wherein either one of said projection exposure unit and said spatial light modulation unit is arranged above said substrate stage, and the other one is arranged below said substrate stage.

20. An exposure device according to claim 17, further comprising a spatial light modulation unit drive device for moving said spatial light modulation unit in a direction substantially parallel to a side of said substrate; wherein when said projection exposure unit exposes said circuit pattern, said spatial light modulation unit drive device moves said spatial light modulation unit and said stage drive part stops said substrate stage.

21. An exposure device according to claim 17, further comprising a spatial light modulation unit drive device for moving said spatial light modulation unit in a direction substantially parallel to a side of said substrate; wherein when said spatial light modulation unit exposes said information data, said stage drive part moves said substrate stage and said spatial light modulation unit drive device stops said spatial light modulation unit.

22. An exposure device for exposing a predetermined circuit pattern drawn on a photomask on a substrate on which a photoresist material is applied, with light including ultraviolet rays; said exposure device comprising:

a projection exposure unit for exposing said circuit pattern of said photomask on a first surface of said substrate, with light including ultraviolet rays;

a spatial light modulation unit for exposing electrically formed information data on the first surface and a second surface opposite to said first surface, with light including ultraviolet rays;

a substrate stage for mounting said substrate, movable with respect to said projection exposure unit or said spatial light modulation unit; and a stage drive part for moving said substrate stage;

said substrate stage including a transparent plate made of optical glass, synthetic silica, fluoride magnesium, fluoride calcium, polycarbonate, or acryl;

said transparent plate including an adhesive part for adhering said substrate;

one that is arranged below said substrate stage among said projection exposure unit and said spatial light modulation unit, including an optical system for compensating a spherical aberration with respect to said transparent plate, so that a light passes through said transparent plate and focuses on said substrate.

23. An exposure device according to claim 22, wherein said information data includes at least one of character information, graphic information and test coupon information.

* * * * *